(12) United States Patent
Inagaki et al.

(10) Patent No.: US 7,864,542 B2
(45) Date of Patent: Jan. 4, 2011

(54) PRINTED CIRCUIT BOARD

(75) Inventors: Yasushi Inagaki, Ibi-gun (JP); Motoo Asai, Ibi-gun (JP); Dongdong Wang, Ibi-gun (JP); Hideo Yabashi, Ibi-gun (JP); Seiji Shirai, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/777,841

(22) Filed: Jul. 13, 2007

(65) Prior Publication Data

US 2007/0258225 A1    Nov. 8, 2007

Related U.S. Application Data

(62) Division of application No. 10/780,856, filed on Feb. 19, 2004, now Pat. No. 7,342,803, which is a division of application No. 09/830,360, filed as application No. PCT/JP00/05970 on Sep. 1, 2000, now Pat. No. 6,724,638.

(30) Foreign Application Priority Data

| Sep. 2, 1999 | (JP) | 11-248311 |
| Dec. 27, 1999 | (JP) | 11-369003 |
| Jul. 21, 2000 | (JP) | 2000-221350 |
| Jul. 31, 2000 | (JP) | 2000-230868 |
| Jul. 31, 2000 | (JP) | 2000-230869 |
| Jul. 31, 2000 | (JP) | 2000-230870 |

(51) Int. Cl.
   *H05K 1/18* (2006.01)

(52) U.S. Cl. ............ 361/763; 361/765; 361/766; 361/795; 174/260; 174/161

(58) Field of Classification Search ......... 361/365–795; 174/259–262; 257/690–692, 728–730, 777–780
See application file for complete search history.

(56) References Cited

U.S. PATENT DOCUMENTS

| 4,800,459 A | 1/1989 | Takagi et al. |
| 5,018,051 A | 5/1991 | Yamada et al. |

(Continued)

FOREIGN PATENT DOCUMENTS

EP    0 451 541    10/1991

(Continued)

OTHER PUBLICATIONS

Patent Abstracts of Japan, "Multilayered Wiring Board" JP 11-126978, May 11, 1999, Akiya.Fujisaki et al.

(Continued)

*Primary Examiner*—Tuan T Dinh
(74) *Attorney, Agent, or Firm*—Oblon, Spivak, McClelland, Maier & Neustadt, L.L.P.

(57) ABSTRACT

A chip capacitor 20 is provided in a core substrate 30 of a printed circuit board 10. This makes it possible to shorten a distance between an IC chip 90 and the chip capacitor 20 and to reduce loop inductance. Since the core substrate 30 id constituted by provided a first resin substrate 30*a*, a second resin substrate 30*b* and a third resin substrate 30*c* in a multi-layer manner, the core substrate 30 can obtain sufficient strength.

14 Claims, 53 Drawing Sheets

U.S. PATENT DOCUMENTS

| | | |
|---|---|---|
| 5,027,253 A | 6/1991 | Lauffer et al. |
| 5,161,093 A | 11/1992 | Gorczyca et al. |
| 5,306,670 A | 4/1994 | Mowatt et al. |
| 5,353,195 A | 10/1994 | Fillion et al. |
| 5,353,498 A * | 10/1994 | Fillion et al. ................ 29/840 |
| 5,432,677 A | 7/1995 | Mowatt et al. |
| 5,559,363 A | 9/1996 | Immorlica, Jr. |
| 5,565,706 A | 10/1996 | Miura et al. |
| 5,629,578 A | 5/1997 | Winzer et al. |
| 5,661,882 A | 9/1997 | Alexander |
| 5,745,984 A | 5/1998 | Cole et al. |
| 5,837,624 A | 11/1998 | Sakaguchi et al. |
| 5,841,193 A | 11/1998 | Eichelberger |
| 5,875,100 A | 2/1999 | Yamashita |
| 5,877,550 A | 3/1999 | Suzuki |
| 5,998,859 A | 12/1999 | Griswold et al. |
| 6,021,050 A | 2/2000 | Ehman et al. |
| 6,153,290 A | 11/2000 | Sunahara |
| 6,162,652 A | 12/2000 | Dass et al. |
| 6,809,268 B2 | 10/2004 | Hayashi et al. |
| 6,876,554 B1 | 4/2005 | Inagaki et al. |
| 2005/0157478 A1 | 7/2005 | Inagaki et al. |

FOREIGN PATENT DOCUMENTS

| | | |
|---|---|---|
| EP | 0 929 207 | 7/1999 |
| JP | 61-64187 | 4/1986 |
| JP | 63-114299 | 5/1988 |
| JP | 63-169013 A | 7/1988 |
| JP | 63-300507 | 12/1988 |
| JP | 63-300507 A | 12/1988 |
| JP | 11-45955 | 6/1989 |
| JP | 4-283987 A | 10/1992 |
| JP | 4-356998 | 12/1992 |
| JP | 5-218660 | 8/1993 |
| JP | 6-120670 | 4/1994 |
| JP | 6-216532 | 8/1994 |
| JP | 6-283380 A | 10/1994 |
| JP | 06-314631 | 11/1994 |
| JP | 6-314631 A | 11/1994 |
| JP | 6-326472 | 11/1994 |
| JP | 06-350020 | 12/1994 |
| JP | 07-235632 | 9/1995 |
| JP | 7-235632 A | 9/1995 |
| JP | 7-263619 | 10/1995 |
| JP | 07-263619 A | 10/1995 |
| JP | 7-302859 | 11/1995 |
| JP | 08-046085 | 2/1996 |
| JP | 8-046085 A | 2/1996 |
| JP | 8-88471 | 4/1996 |
| JP | 8-88473 | 4/1996 |
| JP | 09-092754 | 4/1997 |
| JP | 09-092754 A | 4/1997 |
| JP | 09-199824 | 7/1997 |
| JP | 9-199824 A | 7/1997 |
| JP | 9-321408 A | 12/1997 |
| JP | 10-229272 | 8/1998 |
| JP | 10-229272 A | 8/1998 |
| JP | 10-256429 | 9/1998 |
| JP | 2852372 B | 11/1998 |
| JP | 10-322024 | 12/1998 |
| JP | 10-322024 A | 12/1998 |
| JP | 11-126976 | 5/1999 |
| JP | 11-126978 | 5/1999 |
| JP | 11-126978 A | 5/1999 |
| JP | 11-144904 | 5/1999 |
| JP | 11-144904 A | 5/1999 |
| JP | 11-163525 | 6/1999 |
| JP | 11-172457 | 6/1999 |
| JP | 11-172457 A | 6/1999 |
| JP | 11-186038 | 7/1999 |
| JP | 11-195873 | 7/1999 |
| JP | 11-233678 | 8/1999 |
| JP | 11-248311 | 9/1999 |
| JP | 11-312868 | 11/1999 |

OTHER PUBLICATIONS

Patent Abstracts of Japan " Method for Manufacturing Multilayer Printed Wiring Board ", JP 10-013024, Jan. 1, 1998, Satoshi Nakamura.

Patent Abstracts of Japan, "Electrode Structure and the Manufacturing Method", JP 54-157296, Dec. 12, 1979.

Patent Abstracts of Japan, "Multilayer Electronic Part and Manufacture Thereof", JP 8-241827, Sep. 17, 1996.

U.S. Appl. No. 11/062,672, filed Jul. 21, 2005, Inagaki et al.

U.S. Appl. No. 11/778,139, filed Jul. 16, 2007, Inagaki et al.

U.S. Appl. No. 11/777,841, filed Jul. 13, 2007, Inagaki et al.

* cited by examiner

Fig. 6
(A)
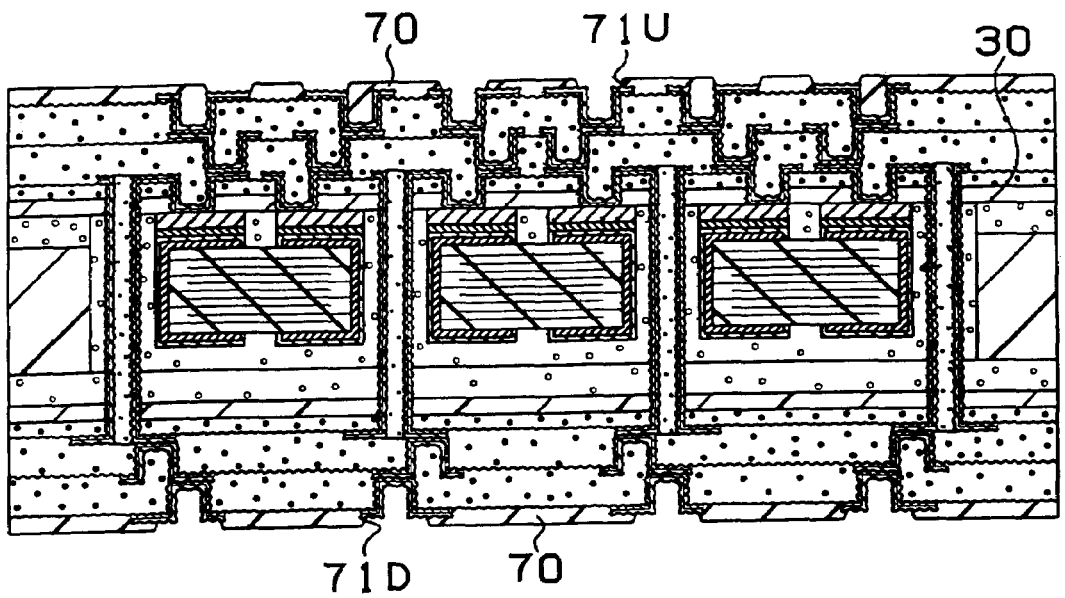
(B)
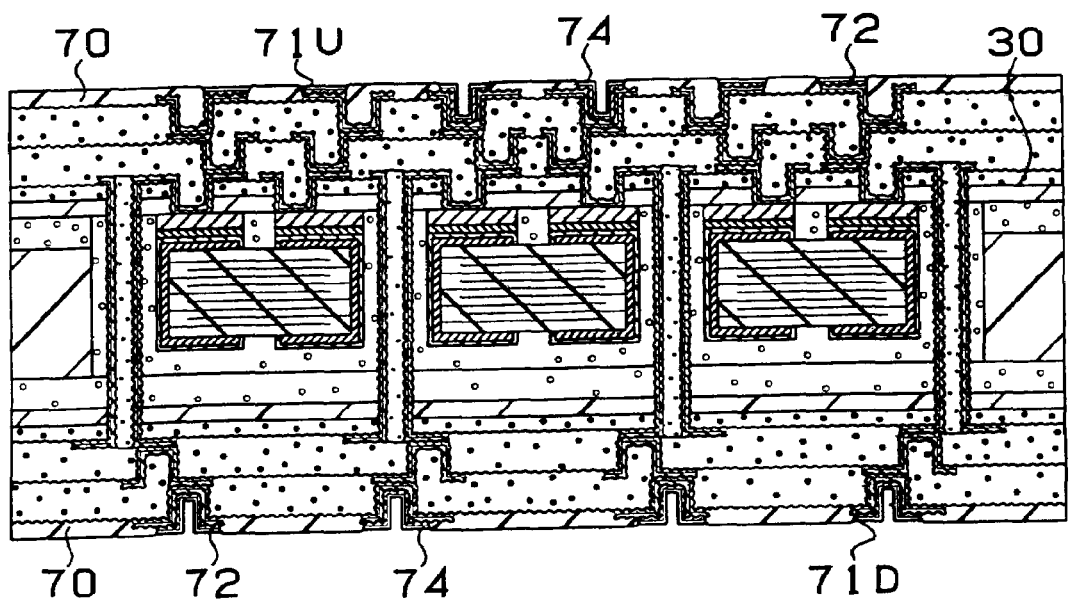

Fig. 13
(A)
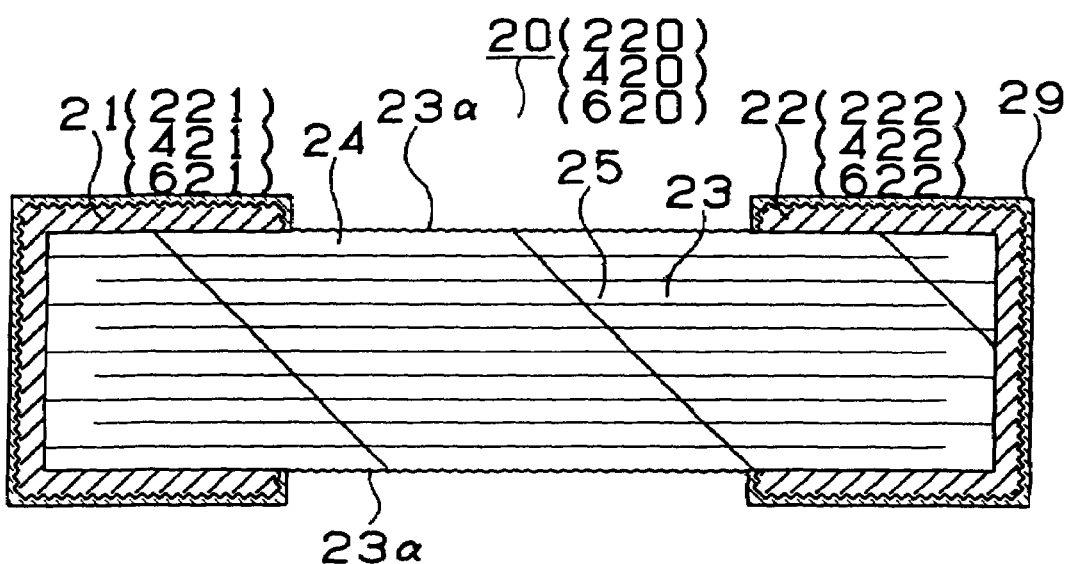
(B)
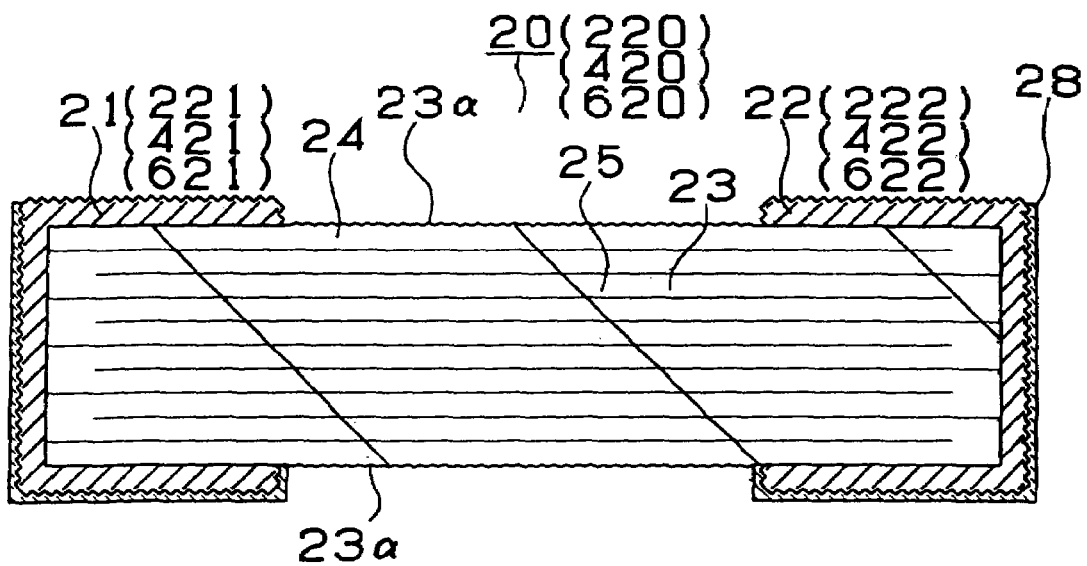

Fig. 14
(A)
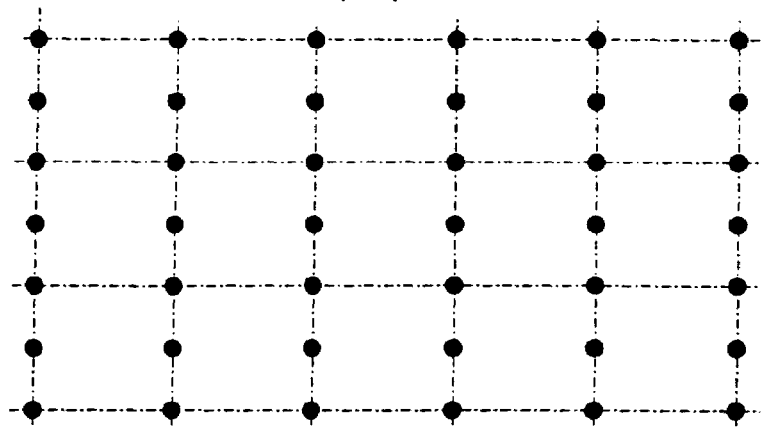
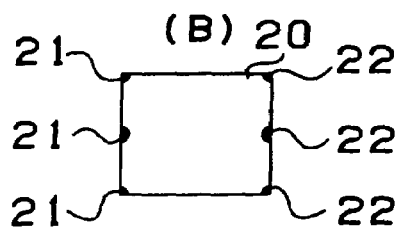
(C)
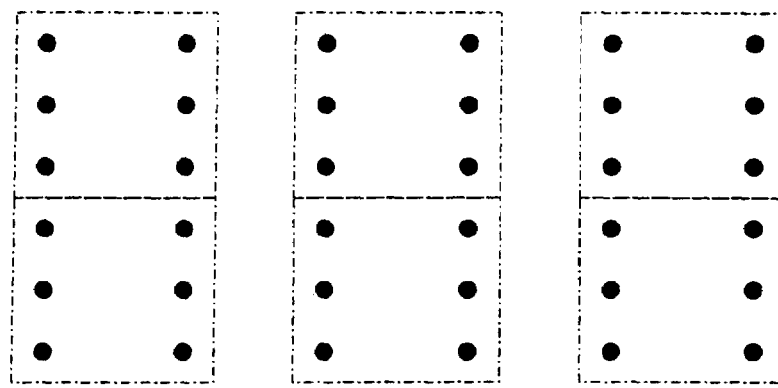
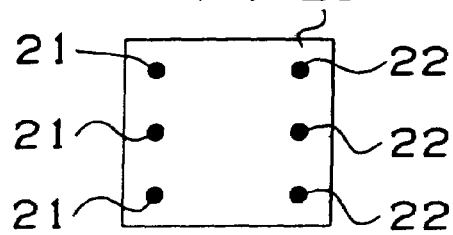

Fig. 16
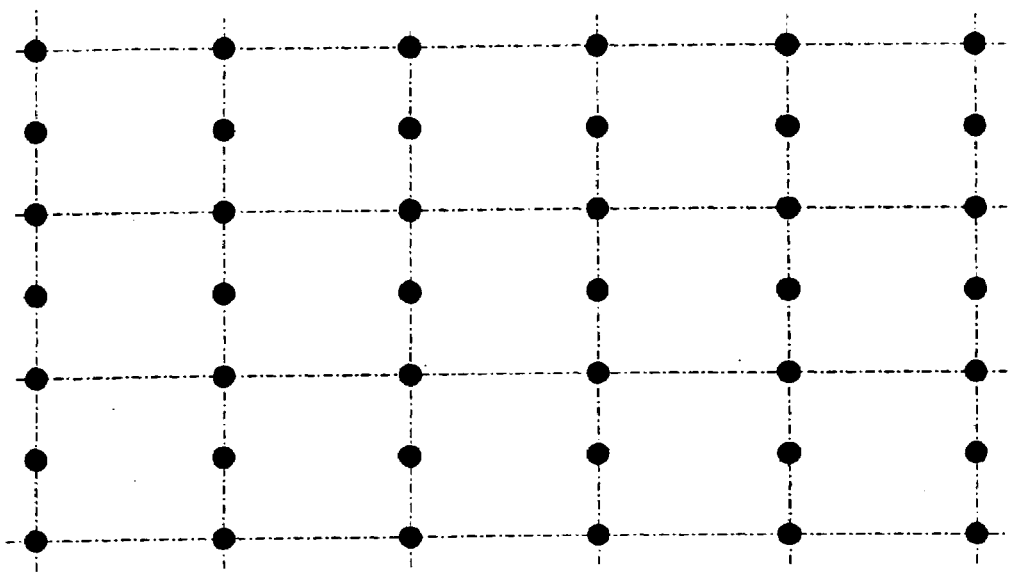
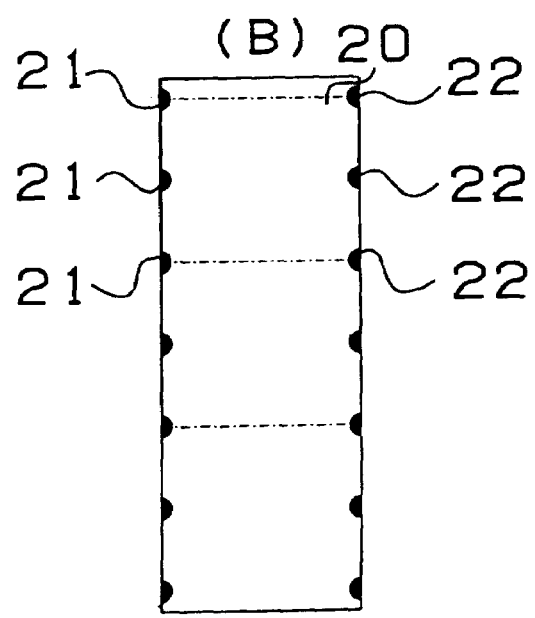

Fig. 41
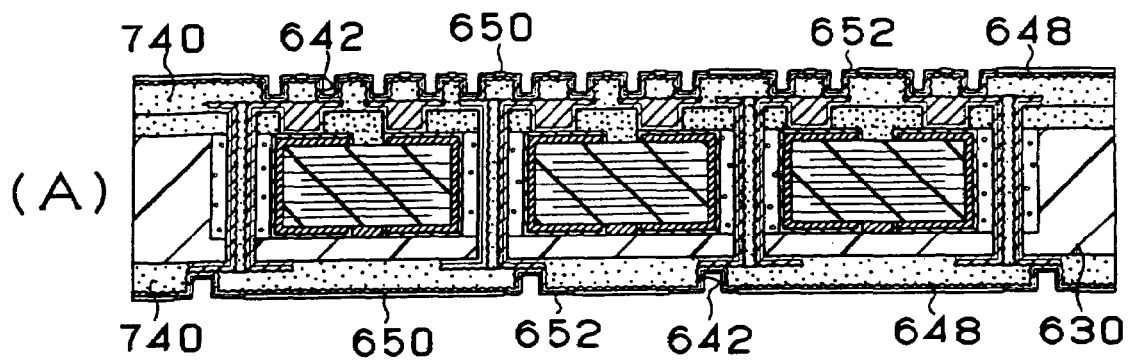
(A)
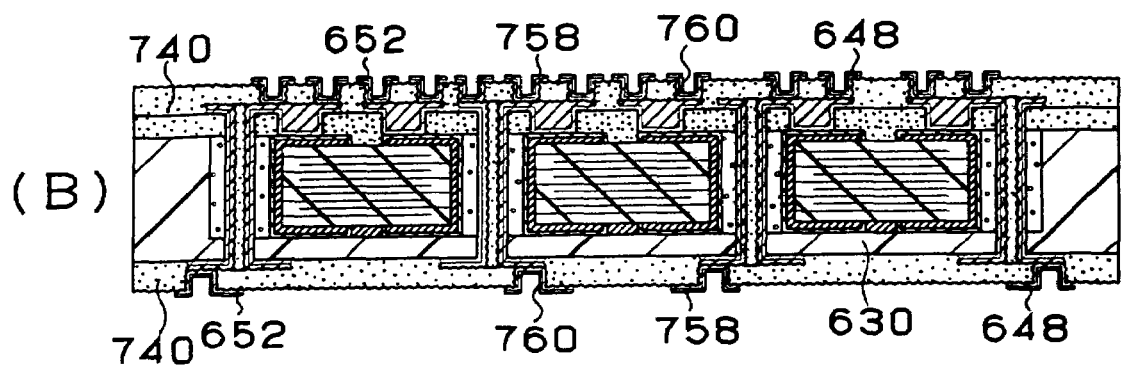
(B)

Fig. 44
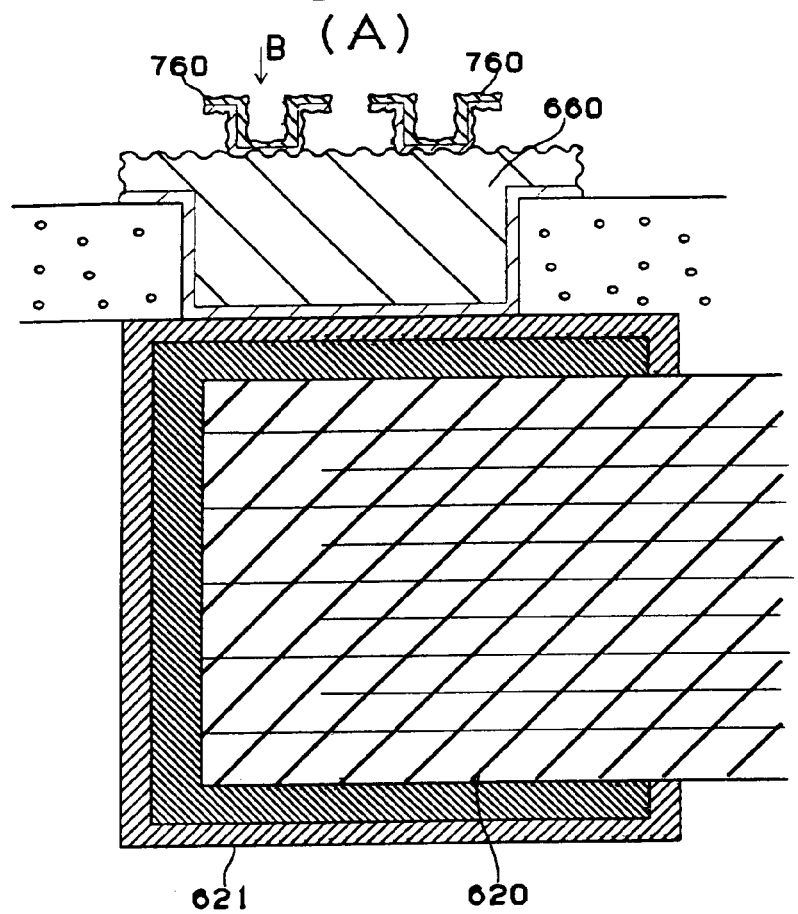
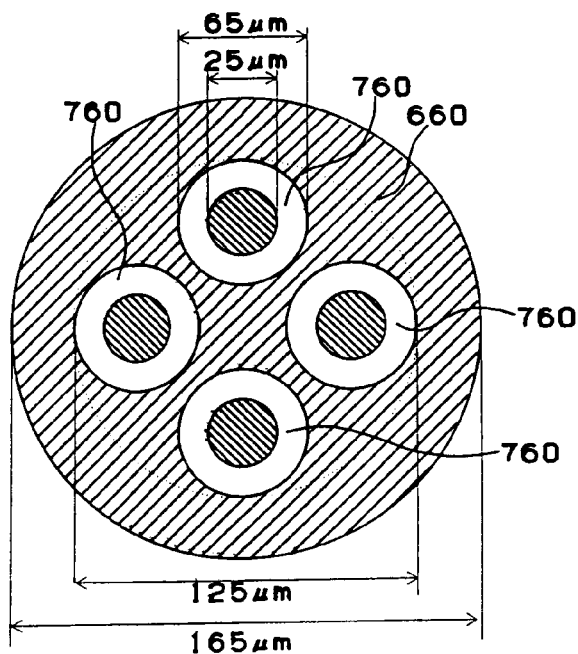

Fig. 50
(A)
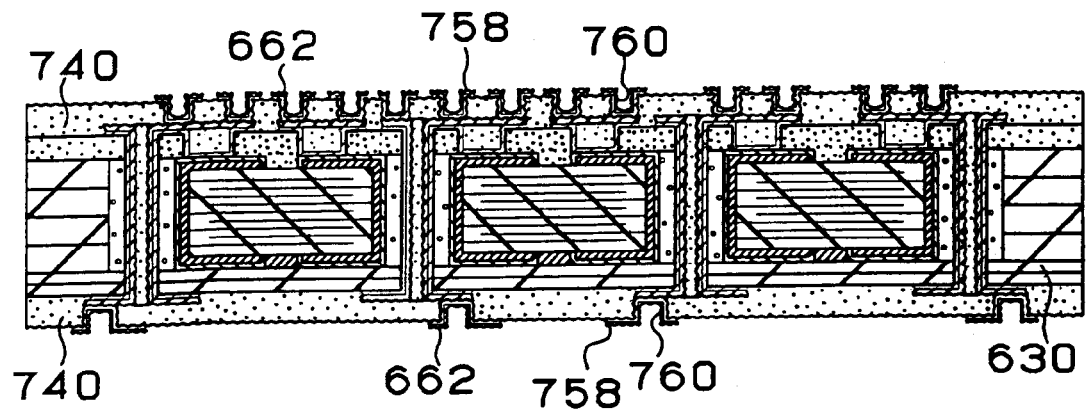
(B)
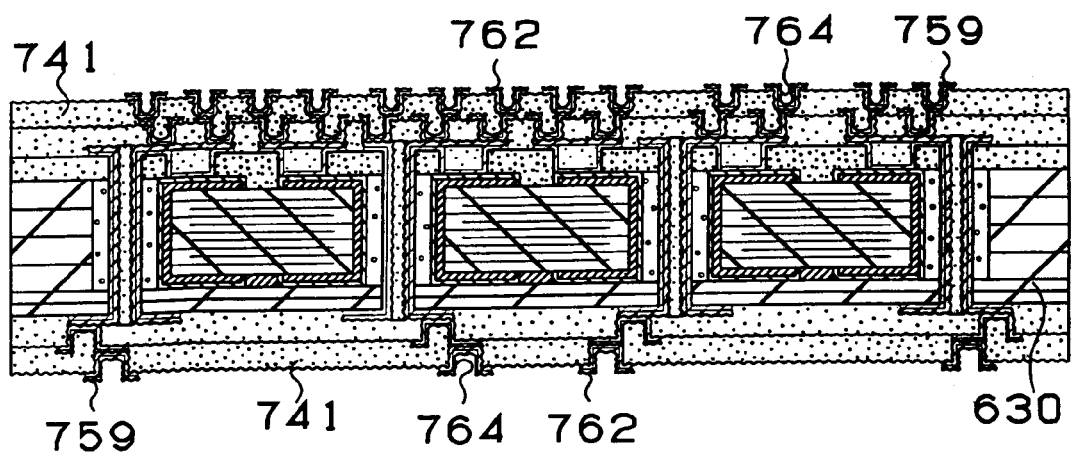

Fig. 51
(A)
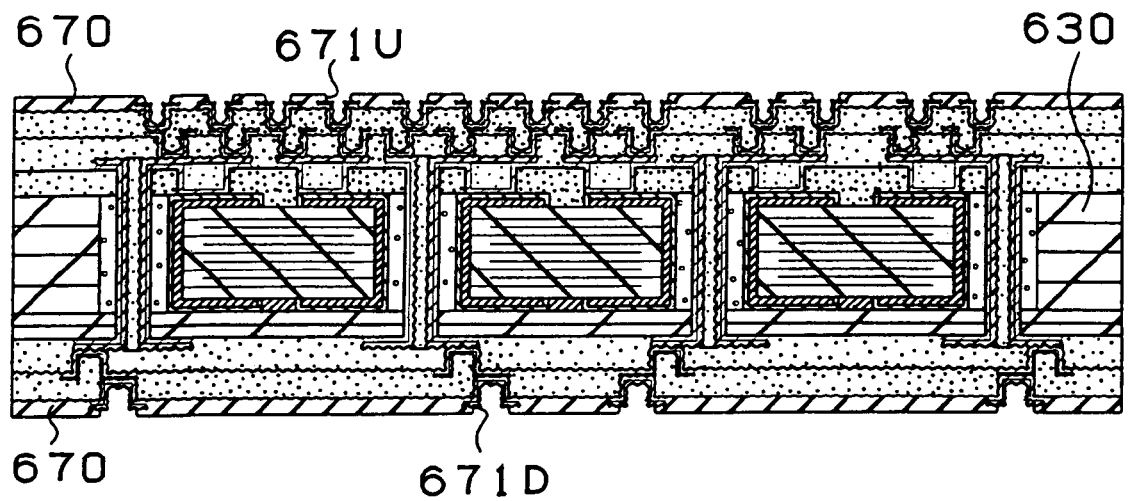
(B)
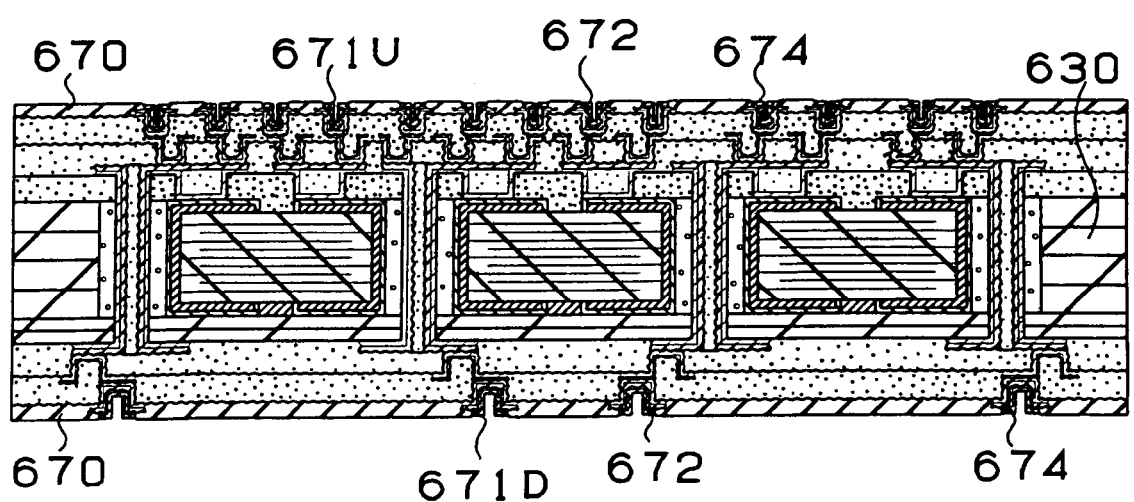

PRINTED CIRCUIT BOARD

CROSS-REFERENCE TO RELATED APPLICATIONS

This application is a Divisional of and claims the benefit of priority under 35 U.S.C. §120 from U.S. Ser. No. 10/780,856, filed Feb. 19, 2004, which is a Divisional of U.S. Ser. No. 09/830,360 filed Apr. 25, 2001, which is the National Phase of International Application Serial No. PCT/JP00/05970 filed Sep. 1, 2000, and under 35 U.S.C. §119 from Japanese Patent Application priority documents 11-248311 filed in Japan on Sep. 2, 1999; 11-369003 filed in Japan on Dec. 27, 1999; 2000-221350 filed in Japan on Jul. 21, 2000; 2000-230868 filed in Japan on Jul. 31, 2000; 2000-230869 filed in Japan on Jul. 31, 2000 and 2000-230870 filed in Japan on Jul. 31, 2000.

TECHNICAL FIELD

The present invention relates to a printed board for mounting thereon electronic components such as an IC chip and a method of manufacturing the printed board. More particularly, the present invention relates to a printed circuit board including therein a capacitor or the like and a method of manufacturing the printed circuit board.

BACKGROUND ART

At present, for the purpose of smoothly supplying electric power to an IC chip, a chip capacitor is often mounted on the surface of a printed circuit board used as a package substrate.

The reactance of a wiring from the chip capacitor to the IC chip depends on frequency. Due to this, as IC chip driving frequency increases, the chip capacitor cannot exhibit sufficient effect even if the chip capacitor is mounted on the surface of the printed circuit board. Considering this, the applicant of the present invention proposed a technique, identified as Japanese Patent Application No. 11-248311, for forming a concave portion on a core substrate so as to contain therein a chip capacitor. Techniques for embedding a capacitor in a substrate are disclosed in Japanese Patent Unexamined Application Publication (to be referred to as "Publication" hereinafter) Nos. 6-326472, 7-263619, 10-256429, 11-45955, 11-126978, 11-312868 and the like.

Publication No. 6-326472 discloses a technique for embedding a capacitor in a resin substrate made of glass epoxy. With this constitution, it is possible to reduce power supply noise and to dispense with a space for mounting the chip capacitor, thereby making an insulating substrate small in size. Publication No. 7-263619 discloses a technique for embedding a capacitor in a substrate made of ceramic, alumina or the like. With this constitution, the capacitor is connected between a power supply layer and a ground layer to thereby shorten wiring length and reduce wiring inductance.

However, according to the Publication Nos. 6-326472 and 7-263619 stated above, the distance from the IC chip to the capacitor cannot be set too short and the wiring inductance cannot be reduced as currently desired in the higher frequency region of the IC chip. In case of a multi-layer buildup wiring board made of resin, in particular, due to the difference in the coefficient of thermal expansion and a capacitor made of ceramic and a core substrate as well as interlayer resin insulating layers made of resin, disconnection occurs between the terminal of the chip capacitor and a via, separation occurs between the chip capacitor and the interlayer resin insulating layers and cracks occur to the interlayer resin insulating layers. Thus, the multi-layer buildup wiring board could not realize high reliability for a long time.

On the other hand, according to the invention of Publication No. 11-248311, if the position at which a capacitor is arranged is deviated, the connection between the terminal of the capacitor and a via cannot be accurately established and power cannot be possibly supplied from the capacitor to the IC chip.

The present invention has been made to solve the above-stated problems. It is, therefore, an object of the present invention to provide a printed circuit board including therein a capacitor and having enhanced connection reliability and to provide a method of manufacturing the printed circuit board.

DISCLOSURE OF THE INVENTION

In order to achieve the above purpose, a printed circuit board constituted by alternately laminating interlayer resin insulating layers and conductive circuits in a multilayer manner on a core substrate containing a capacitor, characterized in that the core substrate containing said capacitor is constituted by providing a first resin substrate, a second resin substrate having an opening for containing the capacitor and a third resin substrate in a multilayer manner while interposing bonding plates.

A printed circuit board manufacturing method characterized by comprising at least the following steps (a) to (d):

(a) forming a conductor pad section on a first resin substrate;
(b) connecting a capacitor to said conductor pad section of said first resin substrate through a conductive bonding agent;
(c) providing a third resin substrate, a second resin substrate having an opening for containing said capacitor and said first resin substrate in a multilayer manner while interposing bonding plates so that said capacitor of said first resin substrate is contained in said opening of said second resin substrate and that said opening of said second resin substrate is closed by the third resin substrate; and
(d) heating and pressurizing said first resin substrate, said second resin substrate and said third resin substrate, to thereby provide a core substrate.

According to the printed circuit board and the printed circuit board manufacturing method, the capacitor can be contained in the core substrate and the distance between the IC chip and the capacitor is shortened. Therefore, it is possible to reduce the loop inductance of the printed circuit board. Further, since the core substrate is constituted by providing resin substrates in a multilayer manner, it can obtain sufficient strength. Besides, since the core substrate is constituted smoothly by providing the first resin substrate and the third resin substrate on the both sides of the core substrate, respectively, it is possible to appropriately form interlayer resin insulating layers and conductor circuits on the core substrate and to thereby decrease the probability of the occurrence of defective printed circuit boards.

Interlayer resin insulating layers are provided on the core substrate, via holes or through holes are provided in the interlayer resin insulating layers, and conductor circuits serving as conductive layers are formed, which means the circuit is formed by a buildup method. As the buildup method, either a semi-additive method, a full additive method can be employed.

It is preferable that a gap is filled with a resin. By removing the gap between the capacitor and the core substrate, the capacitor included in the core substrate behaves less frequently. Even if a stress resulting from the capacitor occurs, the stress can be eased by the filled resin. Also, the resin can advantageously bond the capacitor to the core substrate and prevent migration.

Each of the bonding plates may have a core impregnated with a thermosetting resin. Due to this, the core substrate can obtain high strength.

Each of the first, second and third resin substrates may have a core impregnated with a resin. Due to this, the core substrate can obtain high strength.

A plurality of capacitors may be contained in the core substrate. Due to this, it is possible to highly integrate the capacitors.

The conductor circuits may be formed on the second resin substrate. Due to this, it is possible to increase the wiring density of the substrate and to reduce the number of interlayer resin insulating layers.

The capacitor may be contained in the substrate and, at the same time, a capacitor is provided on the surface of the printed circuit board. Since the capacitor is contained in the printed circuit board, the distance between the IC chip and the capacitor is shortened, loop inductance is reduced and power can be supplied momentarily. Since the capacitor is also provided on the surface of the printed circuit board, a mass storage capacitor can be attached and high power can be easily supplied to the IC chip.

The capacitance of the capacitor on the surface may be equal to or higher than that of a capacitor on an inner layer. Due to this, it is possible to ensure the desired operation of the IC chip without lack of power supply in a high frequency region.

The inductance of the capacitor on the surface may be equal to or higher than that of the capacitor on an inner layer. Due to this, it is possible to ensure the desired operation of the IC chip without lack of power supply in a high frequency region.

The electrode of the chip capacitor on which the metal film is formed may be made electrically connectable using a via hole made of a plated material. Here, the electrode of the chip capacitor is made by metalization and has irregular portions on the surface thereof. However, the surface of the chip capacitor is smoothed by the metal film and disconnection does not occur to the electrode, the bonding plates or the like even if a heat cycle test is conducted.

The metal film of the electrode of the capacitor is preferably made of one selected from copper, nickel and noble metal. This is because a layer made of tin or zinc tends to induce migration to the capacitor included in the substrate. For that reason, the metal film can also prevent the occurrence of migration.

Further, the surface of the chip capacitor may be roughed. By doing so, the adhesiveness between the chip capacitor made of ceramic and the bonding layer, the interlayer resin insulating layers made of a resin is high and the separation of the bonding layers and the interlayer resin insulating layers does not occur to interfaces even if a heat cycle test is conducted.

At least a part of a coating layer of the electrode of the capacitor may be exposed and contained in the printed circuit board to thereby make the electrode exposed from the coating layer electrically connectable. In this case, it is preferable that the metal exposed from the coating layer mainly consists of copper. This is because connection resistance can be reduced.

A chip capacitor having electrodes formed inside of an outer edge thereof may be employed. Due to this, even if continuity is established through the via hole, a large external electrode can be provided and the allowable range of alignment is widened, so that connection defect can be eliminated.

A capacitor having electrodes formed in a matrix may be employed. Due to this, a large chip capacitor can be contained in the core substrate. Accordingly, capacitance can be increased and electrical problems can be, therefore, solved. Besides, even if going through various heat histories, the printed circuit board does not warp so easily.

A plurality of chip capacitors for providing many capacitors may be coupled to be employed as the capacitor. By doing so, it is possible to appropriately adjust capacitance and to appropriately operate the IC chip.

The coefficient of thermal expansion of the insulating bonding agent may be set lower than that of the containing layer, i.e., set closer to that of the capacitor made of ceramic. Due to this, even if an internal stress resulting from the difference in the coefficient of thermal expansion between the core substrate and the capacitor occurs in a heat cycle test, cracks, separation and the like less occur to the core substrate, thereby making it possible to attain high reliability.

To obtain the above-stated object, a printed circuit board is constituted by providing resin insulating layers and conductor circuits on a core substrate in a multilayer manner, technically characterized in that the core substrate is constituted by bonding together a plurality of resin substrates, the conductor circuits formed on the plurality of resin substrates; and a capacitor is contained in the core substrate.

A printed circuit board is constituted by providing resin insulating layers and conductor circuit on a core substrate in a multilayer manner, technically characterized in that the core substrate is constituted by bonding together a plurality of resin substrates, the conductor circuits formed on the plurality of resin substrates; and a capacitor is contained in a concave portion formed in the core substrate.

The capacitor can be contained in the core substrate and the distance between the IC chip and the capacitor is shortened. Due to this, it is possible to reduce the loop inductance of the printed circuit board. In addition, since the core substrate is formed by providing a plurality of resin substrates on which the conductor circuits are formed in a multilayer manner, the wiring density of the core substrate is increased and the number of interlayer resin insulating layers can be reduced.

Interlayer resin insulating layers are provided on the core substrate, via holes or through holes are provided in the interlayer resin insulating layers, and conductor circuits serving as conductive layers are formed, which means a circuit formed by a buildup method. As the buildup method, either a semi-additive method, a full additive method can be employed.

It is preferable that a gap is filled with a resin. By removing the gap between the capacitor and the core substrate, the capacitor included in the core substrate behaves less frequently. Even if a stress resulting from the capacitor occurs, the stress can be eased by the filled resin. Also, the resin can advantageously bond the capacitor to the core substrate and prevent migration.

A plurality of resin substrates may be bonded together with bonding plates interposed therebetween. Due to this, it is possible to strongly bond the resin substrates together.

Each of the bonding plates may have a core impregnated with a thermosetting resin. Due to this, the core substrate can obtain high strength.

Each of the resin substrates may have a core impregnated with a resin. Due to this, the core substrate can obtain high strength.

A plurality of capacitors may be contained in the core substrate. Due to this, it is possible to highly integrate the capacitors.

The capacitor may be contained in the substrate and, at the same time, a capacitor is provided on the surface of the printed circuit board. Since the capacitor is contained in the printed circuit board, the distance between the IC chip and the capacitor is shortened, loop inductance is reduced and power can be supplied momentarily. Since the capacitor is also provided on the surface of the printed circuit board, a mass storage capacitor can be attached and high power can be easily supplied to the IC chip.

The capacitance of the capacitor on the surface may be equal to or higher than that of a capacitor on an inner layer. Due to this, it is possible to ensure the desired operation of the IC chip without lack of power supply in a high frequency region.

The inductance of the capacitor on the surface may be equal to or higher than that of the chip capacitor on an inner layer. Due to this, it is possible to ensure the desired operation of the IC chip without lack of power supply in a high frequency region.

The electrode of the chip capacitor on which the metal film is formed may be made electrically connectable using a via hole made of a plated material. Here, the electrode of the chip capacitor is made by metalization and has irregular portions on the surface thereof. However, since the surface of the chip capacitor is smoothed by the metal film and the via hole is formed, resin residue does not remain when a through hole is formed in the resin coated on the electrode and the reliability of the connection between the via hole and the electrode can be enhanced. Further, since the via hole is formed by plating in the electrode having a plated member formed thereon, the characteristics of the connection between the electrode and the via hole is high and disconnection does not occur between the electrode and the via hole even if a heat cycle test is conducted.

The metal film of the electrode of the capacitor is preferably made of one selected from copper, nickel and noble metal. This is because a layer made of tin or zinc tends to induce migration to the capacitor included in the substrate. For that reason, the metal film can also prevent the occurrence of migration.

Further, the surface of the chip capacitor may be roughed. By doing so, the adhesiveness between the chip capacitor made of ceramic and the bonding layer, the interlayer resin insulating layers made of a resin is high and the separation of the interlayer resin insulating layers does not occur to interfaces even if a heat cycle test is conducted.

At least a part of a coating layer of the electrode of the capacitor may be exposed and contained in the printed circuit board to thereby make the electrode exposed from the coating layer electrically connectable. In this case, it is preferable that the metal exposed from the coating layer mainly consists of copper. This is because high connection characteristics can be ensured and connection resistance can be reduced even if a metal layer is formed by plating on the exposed metal.

A chip capacitor having electrodes formed inside of an outer edge thereof may be employed. Due to this, even if continuity is established through the via hole, a large external electrode can be provided and the allowable range of alignment is widened, so that connection defect can be eliminated.

A capacitor having electrodes formed in a matrix may be employed. Due to this, a large chip capacitor can be contained in the core substrate. Accordingly, capacitance can be increased and electrical problems can be, therefore, solved. Besides, even if going through various heat histories, the printed circuit board does not warp so easily.

A plurality of chip capacitors for providing many capacitors may be coupled to be employed as the capacitor. By doing so, it is possible to appropriately adjust capacitance and to appropriately operate the IC chip.

The coefficient of thermal expansion of the insulating bonding agent may be set lower than that of the core substrate, i.e., set closer to that of the capacitor made of ceramic. Due to this, even if an internal stress resulting from the difference in the coefficient of thermal expansion between the core substrate and the capacitor occurs in a heat cycle test, cracks, separation and the like less occur to the core substrate, thereby making it possible to attain high reliability.

A printed circuit board manufacturing method is characterized by comprising at least the following steps (a) to (e):
(a) forming conductor circuits on a plurality of resin substrates;
(b) providing a plurality of said resin substrates in a multilayer manner through bonding plates;
(c) bonding together said resin substrates through said bonding plates, to thereby provide a core substrate;
(d) forming a concave portion in said core substrate; and
(e) containing a capacitor in said concave portion.

A printed circuit board manufacturing method includes at least the following steps (a) to (e):
(a) forming a resin substrate with a through hole and having a conductor circuit provided on a surface;
(b) forming a resin substrate without a through hole and having a conductor circuit provided on a surface;
(c) providing said resin substrate with the through hole and said resin substrate without the through hole through a bonding plate in a multilayer manner;
(d) bonding together said resin substrates through said bonding plate, to thereby provide a core substrate; and
(e) containing a capacitor in said concave portion.

The capacitor can be contained in the core substrate and the distance between the IC chip and the capacitor is shortened. Therefore, it is possible to reduce the loop inductance of the printed circuit board. Also, since the core substrate is formed by providing a plurality of resin substrates, on which conductor circuits are formed, in a multilayer manner, wiring density within the core substrate is increased and the number of interlayer resin insulating layers can be reduced.

In order to achieve the above purpose, a printed circuit board is constituted by alternately providing interlayer resin insulating layers and conductor circuits in a multilayer manner on a core substrate containing a capacitor, characterized in that
the core substrate containing said capacitor is constituted by providing a first resin substrate, a second resin substrate having an opening for containing the capacitor and a third resin substrate in a multilayer manner while interposing bonding plates; and
via holes connected to a terminal of said capacitor are provided on both sides of said core substrate.

The capacitor can be contained in the core substrate and the distance between the IC chip and the capacitor is shortened. Therefore, it is possible to reduce the loop inductance of the printed circuit board. Further, since the core substrate is constituted by providing resin substrates in a multilayer manner, it can obtain sufficient strength. Besides, since the core substrate is constituted smoothly by providing the first resin substrate and the third resin substrate on the both sides of the core substrate, respectively, it is possible to appropriately form interlayer resin insulating layers and conductor circuits on the core substrate and to thereby decrease the probability of the occurrence of defective printed circuit boards. Further, since the via holes are provided on the both sides of the core substrate, it is possible to connect the IC chip to the capacitor and an external connection substrate to the capacitor with shortest distances and it is possible to momentarily supply high power from the external connection substrate to the IC chip.

Interlayer resin insulating layers are provided on the core substrate, via holes or through holes are provided in the interlayer resin insulating layers, and conductor circuits serving as conductive layers are formed, which means the circuit is formed by a buildup method. As the buildup method, either a semi-additive method, a full additive method can be employed.

Further, by arranging connection wirings, it is possible to provide wirings below the capacitor. As a result, the degree of freedom for wirings increases, thereby making it possible to realize high density and make the printed circuit board small in size.

It is preferable that a resin is filled between the capacitor and the substrate. By removing the gap between the capacitor and the substrate, the capacitor included in the core substrate behaves less frequently. Even if a stress resulting from the capacitor occurs, the stress can be eased by the filled resin. Also, the resin can advantageously bond the capacitor to the core substrate and prevent migration.

Each of the bonding plates may have a core impregnated with a thermosetting resin. Due to this, the core substrate can obtain high strength.

Each of the first, second and third resin substrates may have a core impregnated with a resin. Due to this, the core substrate can obtain high strength. For example, a core impregnated with a reinforcing material such as glass epoxy or glass phenol can be employed.

Since a plurality of capacitors may be contained in the core substrate, it is possible to highly integrate the capacitors. It is, therefore, possible to ensure more capacitance.

The conductor circuits may be formed on the second resin substrate. Due to this, it is possible to increase the wiring density of the substrate and to reduce the number of interlayer resin insulating layers.

The capacitor may be contained in the substrate and, at the same time, a capacitor is provided on the surface of the printed circuit board. Since the capacitor is contained in the printed circuit board, the distance between the IC chip and the capacitor is shortened, loop inductance is reduced and power can be supplied momentarily. Since the capacitor is also provided on the surface of the printed circuit board, a mass storage capacitor can be attached and high power can be easily supplied to the IC chip.

The capacitance of the capacitor on the surface may be equal to or higher than that of a capacitor on an inner layer. Due to this, it is possible to ensure the desired operation of the IC chip without lack of power supply in a high frequency region.

The inductance of the capacitor on the surface may be equal to or higher than that of the capacitor on an inner layer. Due to this, it is possible to ensure the desired operation of the IC chip without lack of power supply in a high frequency region.

The electrode of the chip capacitor on which the metal film is formed may be made electrically connectable using a via hole made of a plated material. Here, the electrode of the chip capacitor is made by metalization and has irregular portions on the surface thereof. However, since the surface of the chip capacitor is smoothed by the metal film and the via hole is formed, resin residue does not remain when a through hole is formed in the resin coated on the electrode and the reliability of the connection between the via hole and the electrode can be enhanced. Further, since the via hole is formed by plating in the electrode having a plated member formed thereon, the characteristics of the connection between the electrode and the via hole is high and disconnection does not occur between the electrode and the via hole even if a heat cycle test is conducted.

The metal film of the electrode of the capacitor is preferably made of one selected from copper, nickel and noble metal. This is because a layer made of tin or zinc tends to induce migration to the capacitor included in the substrate. For that reason, the metal film can also prevent the occurrence of migration.

Further, the surface of the chip capacitor may be roughed. By doing so, the adhesiveness between the chip capacitor made of ceramic and the bonding layer, the interlayer resin insulating layers made of a resin is high and the separation of the bonding layers and the interlayer resin insulating layers does not occur to interfaces even if a heat cycle test is conducted.

At least a part of a coating layer of the electrode of the capacitor may be exposed and contained in the printed circuit board to thereby make the electrode exposed from the coating layer electrically connectable. In this case, it is preferable that the metal exposed from the coating layer mainly consists of copper. This is because high connection characteristics can be ensured and connection resistance can be reduced even if a metal layer is formed by plating on the exposed metal.

A chip capacitor having electrodes formed inside of an outer edge thereof may be employed. Due to this, even if continuity is established through the via hole, a large external electrode can be provided and the allowable range of alignment is widened, so that connection defect can be eliminated.

A chip capacitor having electrodes formed in a matrix may be employed. Due to this, a large chip capacitor can be contained in the core substrate. Accordingly, capacitance can be increased and electrical problems can be, therefore, solved. Besides, even if going through various heat histories, the printed circuit board does not warp so easily.

A plurality of chip capacitors for providing many capacitors may be coupled to be employed as the capacitor. By doing so, it is possible to appropriately adjust capacitance and to appropriately operate the IC chip.

The coefficient of thermal expansion of the insulating bonding agent may be set lower than that of the containing layer, i.e., set closer to that of the capacitor made of ceramic. Due to this, even if an internal stress resulting from the difference in the coefficient of thermal expansion between the core substrate and the capacitor occurs in a heat cycle test, cracks, separation and the like less occur to the core substrate, thereby making it possible to attain high reliability.

A printed circuit board manufacturing method is characterized by comprising at least the following steps (a) to (d):

(a) attaching a capacitor to a first resin substrate through a bonding material;

(b) providing a third resin substrate, a second resin substrate having an opening for containing said capacitor and a first resin substrate in a multilayer manner so that said capacitor of said first resin substrate is contained in said opening of said second substrate and that said opening of said second resin substrate is closed by said third resin substrate, thereby providing a core substrate;

(c) applying laser and forming a via hole opening reaching said capacitor in said core substrate; and (d) forming a via hole in said via hole opening.

The capacitor can be contained in the core substrate and the distance between the IC chip and the capacitor is shortened. Therefore, it is possible to reduce the loop inductance of the printed circuit board.

A printed circuit board manufacturing method is characterized by comprising at least the following steps (a) to (f):
(a) forming a via hole formation opening in a metal film on one side of a first resin substrate;
(b) attaching a capacitor to a metal film unformed surface of said first resin substrate through a bonding material;
(c) providing a third resin substrate, a second resin substrate having an opening for containing said capacitor and said first resin substrate in a multilayer manner by interposing bonding plates so that said capacitor of said first resin substrate is contained in said opening of said second resin substrate and that said opening of said second resin substrate is closed by said third resin substrate;
(d) heating and pressurizing said first resin substrate, said second resin substrate and said third resin substrate, to thereby provide a core substrate;
(e) applying laser to said via hole formation opening formed in said metal film of said first resin substrate, and forming a via hole opening reaching said capacitor; and
(f) forming a via hole in said via hole opening.

The capacitor can be contained in the core substrate and the distance between the IC chip and the capacitor is shortened. Therefore, it is possible to reduce the loop inductance of the printed circuit board. In addition, an opening is provided in the metal film of the first resin substrate having the metal film formed on one side thereof by etching or the like. By applying laser to the position of the opening, the resin insulating layer exposed from the opening is removed and an opening for a via hole is provided. As a result, the opening diameter of the via hole depends on the opening diameter of the metal film, so that it is possible to form the via hole to have an appropriate opening diameter. Likewise, the positional accuracy of the via hole opening depends on the opening position of the metal film. Due to this, even if the positional accuracy of the laser application is low, it is possible to form the via hole at an appropriate position.

A printed circuit board manufacturing method is characterized by comprising at least the following steps (a) to (f):
(a) forming via hole formation openings in metal films of a first resin substrate and a third resin substrate, the metal films bonded on one sides of said first resin substrate and said third resin substrate, respectively;
(b) attaching a capacitor to a metal film unformed surface of said first resin substrate through a bonding material;
(c) providing said third resin substrate, a second resin substrate having an opening for containing said capacitor and said first resin substrate in a multilayer manner by providing a bonding plate on said metal film unformed surface so that said capacitor of said first resin substrate is contained in said opening of said second resin substrate and that said opening of said second resin substrate is closed by said third resin substrate;
(d) heating and pressurizing said first resin substrate, said second resin substrate and said third resin substrate, to thereby provide a core substrate;
(e) applying laser to said via hole formation openings formed in said first resin substrate and said third resin substrate, and forming a via hole opening reaching said capacitor; and
(f) forming a via hole in said via hole opening.

The capacitor can be contained in the core substrate and the distance between the IC chip and the capacitor is shortened. Therefore, it is possible to reduce the loop inductance of the printed circuit board. In addition, openings are provided in the metal films of the first and third resin substrates each having the metal film formed on one side thereof, respectively, by etching or the like. By applying laser to the position of the opening, the resin insulating layer exposed from the opening is removed and an opening for a via hole is provided. As a result, the opening diameter of the via hole depends on the opening diameter of the metal film, so that it is possible to form the via hole to have an appropriate opening diameter. Likewise, the positional accuracy of the via hole opening depends on the opening position of the metal film. Due to this, even if the positional accuracy of the laser application is low, it is possible to form the via hole at an appropriate position.

Further, since the core substrate is constituted by providing resin substrates in a multilayer manner, it can obtain sufficient strength. Besides, since the core substrate is constituted smoothly by providing the first resin substrate and the third resin substrate on the both sides of the core substrate, respectively, it is possible to appropriately form interlayer resin insulating layers and conductor circuits on the core substrate and to thereby decrease the probability of the occurrence of defective printed circuit boards. Further, since the via holes are provided on the both sides of the core substrate, it is possible to connect the IC chip to the capacitor and an external connection substrate to the capacitor with shortest distances and it is possible to momentarily supply high power from the external connection substrate to the IC chip.

A printed circuit board manufacturing method is characterized by comprising at least the following steps (a) to (g):
(a) forming a through hole formation openings in metal films of a first resin substrate and a third resin substrate, the metal films bonded on one sides of said first resin substrate and said third resin substrate, respectively;
(b) attaching a capacitor to a metal film unformed surface of said first resin substrate through a bonding material;
(c) providing said third resin substrate, a second resin substrate having an opening for containing said capacitor and said first resin substrate in a multilayer manner by providing a bonding plate on said metal film unformed surface so that said capacitor of said first resin substrate is contained in said opening of said second resin substrate and that said opening of said second resin substrate is closed by said third resin substrate;
(d) heating and pressurizing said first resin substrate, said second resin substrate and said third resin substrate, to thereby provide a core substrate;
(e) applying laser to said through hole formation openings formed in said first resin substrate and said third resin substrate, and forming a via hole opening reaching said capacitor;
(f) removing or thinning said metal films; and
(g) forming a conductor circuit and a via hole on said core substrate.

The capacitor can be contained in the core substrate and the distance between the IC chip and the capacitor is shortened. Therefore, it is possible to reduce the loop inductance of the printed circuit board. In addition, an opening is provided in the metal film of the first resin substrate having the metal film formed on one side thereof by etching or the like. By applying laser to the position of the opening, the resin insulating layer exposed from the opening is removed and an opening for a via hole is provided. Thereafter, the metal film is removed by etching or the like. As a result, the opening diameter of the via hole depends on the opening diameter of the metal film, so that it is possible to form the via hole to have an appropriate opening diameter. Likewise, the positional accuracy of the via hole opening depends on the opening position of the metal film. Due to this, even if the positional accuracy of the laser application is low, it is possible to form the via hole at an appropriate position. In addition, by removing the metal film by etching or the like, wirings can be formed thin and, therefore, formed at fine pitch.

Further, since the core substrate is constituted by providing resin substrates in a multilayer manner, it can obtain sufficient strength. Besides, since the core substrate is constituted smoothly by providing the first resin substrate and the third resin substrate on the both sides of the core substrate, respectively, it is possible to appropriately form interlayer resin insulating layers and conductor circuits on the core substrate and to thereby decrease the probability of the occurrence of defective printed circuit boards.

In order to achieve the above purpose, a printed circuit board is constituted by providing resin insulating layers and conductor circuits on a core substrate in a multilayer manner, characterized in that a capacitor is included in said core substrate, and a relatively large lower-layer via hole connected to an electrode of said capacitor is formed; and a plurality of relatively small upper-layer via holes connected to one said lower-layer via hole are provided in an interlayer resin insulating layer on an upper surface of said core substrate.

A capacitor is included in the core substrate, a relatively large lower-layer via hole connected to a terminal of the capacitor is formed, and a plurality of relatively small upper-layer via holes connected to one the lower-layer via hole are provided in an interlayer resin insulating layer on an upper surface of the core substrate. By doing so, it is possible to connect the terminal of the capacitor to the lower-layer via holes even if the position at which the capacitor is provided is shifted, and it is possible to ensure the supply of power from the capacitor to the IC chip. Further, by providing a plurality of relatively small upper-layer via holes, it is possible to obtain the same effect as that of connecting inductances in parallel. Thus, the high frequency characteristics of power supply lines and ground lines are enhanced, thereby making it possible to prevent the malfunction of the IC chip due to lack of supply of power or the variation of earth level. Moreover, since the wiring length can be shortened, it is possible to reduce loop inductance.

It is preferable that a concave portion is filled with a resin. By removing the gap between the capacitor and the core substrate, the capacitor included in the core substrate behaves less frequently. Even if a stress resulting from the capacitor occurs, the stress can be eased by the filled resin. Also, the resin can advantageously bond the capacitor to the core substrate and prevent migration.

A filled via hole having a flat surface may be employed as the lower-layer via hole. Due to this, it is possible to directly connect a plurality of upper-layer via holes to one lower-layer via hole. Thus, it is possible to enhance the characteristics of the connection between the lower-layer via hole and the upper-layer via hole and to thereby ensure the supply of power from the capacitor to the IC chip.

One capacitor may be contained in a concave portion formed in the core substrate. Thus, the capacitor is arranged in the core substrate, so that the distance between the IC chip and the capacitor is shortened and it is possible to reduce the loop inductance of the printed circuit board.

A plurality of capacitors may be contained in the concave portion. Due to this, it is possible to realize the high integration of capacitors.

The electrode of the chip capacitor on which the metal film is formed may be made electrically connectable using a via hole made of a plated material. Here, the electrode of the chip capacitor is made by metalization and has irregular portions on the surface thereof. However, since the surface of the chip capacitor is smoothed by the metal film and the via hole is formed, resin residue does not remain when a through hole is formed in the resin coated on the electrode and the reliability of the connection between the via hole and the electrode can be enhanced. Further, since the via hole is formed by plating in the electrode having a plated member formed thereon, the characteristics of the connection between the electrode and the via hole is high and disconnection does not occur between the electrode and the via hole even if a heat cycle test is conducted.

The surface of the chip capacitor may be roughed. By doing so, the adhesiveness between the chip capacitor made of ceramic and the bonding layer, the interlayer resin insulating layers made of a resin is high and the separation of the bonding layers and the interlayer resin insulating layers does not occur to interfaces even if a heat cycle test is conducted.

At least a part of a coating layer of the electrode of the capacitor may be exposed and contained in the printed circuit board to thereby make the electrode exposed from the coating layer electrically connectable. In this case, it is preferable that the metal exposed from the coating layer mainly consists of copper. This is because high connection characteristics can be ensured and connection resistance can be reduced even if a metal layer is formed by plating on the exposed metal.

A chip capacitor having electrodes formed inside of an outer edge thereof may be employed. Due to this, even if continuity is established through the via hole, a large external electrode can be provided and the allowable range of alignment is widened, so that connection defect can be eliminated.

A capacitor having electrodes formed in a matrix may be employed. Due to this, a large chip capacitor can be contained in the core substrate. Accordingly, capacitance can be increased and electrical problems can be, therefore, solved. Besides, even if going through various heat histories, the printed circuit board does not warp so easily.

A plurality of chip capacitors for providing many capacitors may be coupled to be employed as the capacitor. By doing so, it is possible to appropriately adjust capacitance and to appropriately operate the IC chip.

A resin may be filled between the core substrate and the capacitor, and the coefficient of thermal expansion of the resin is set lower than that of the core substrate, i.e., set closer to that of the capacitor made of ceramic. Due to this, even if an internal stress resulting from the difference in the coefficient of thermal expansion between the core substrate and the capacitor occurs in a heat cycle test, cracks, separation and the like less occur to the core substrate, thereby making it possible to attain high reliability.

A printed circuit board manufacturing method is characterized by comprising at least the following steps (a) to (e):
(a) embedding a capacitor in a core substrate;
(b) forming a resin insulating layer on an upper surface of said capacitor;
(c) forming a relatively large lower-layer via hole connected to an electrode of said capacitor, in said resin insulating layer;
(d) forming an interlayer resin insulating layer on an upper surface of said core substrate; and
(e) providing a plurality of relatively small upper-layer via holes connected to one said lower-layer via hole, in said interlayer resin insulating layer.

A capacitor is included in the core substrate, a relatively large lower-layer via hole connected to a terminal of the capacitor is formed, and a plurality of relatively small upper-layer via holes connected to one the lower-layer via hole are provided in an interlayer resin insulating layer on an upper surface of the core substrate. By doing so, it is possible to connect the terminal of the capacitor to the lower-layer via even if the position at which the capacitor is provided is shifted, and it is possible to ensure the supply of power from the capacitor to the IC chip. Further, by providing a plurality of relatively small upper-layer via holes, it is possible to obtain the same effect as that of connecting inductances in parallel. Thus, the high frequency characteristics of power supply lines and ground lines are enhanced, thereby making it possible to prevent the malfunction of the IC chip due to lack of supply of power or the variation of earth level. Moreover, since the wiring length can be shortened, it is possible to reduce loop inductance.

One capacitor may be contained in a concave portion formed in the core substrate. Thus, the capacitor is arranged in the core substrate, so that the distance between the IC chip and the capacitor is shortened and it is possible to reduce the loop inductance of the printed circuit board.

A plurality of capacitors may be contained in the concave portion. Due to this, it is possible to realize the high integration of capacitors.

A through hole may be formed in a resin material containing a resin serving as a core material, and a resin material is bonded to the resin material in which the through hole is formed, thereby forming a core substrate having a concave portion. Due to this, it is possible to form a core substrate having a concave portion which has a flat base.

A filled via hole having a flat surface may be employed as the lower-layer via hole. Due to this, it is possible to directly connect a plurality of upper-layer via holes to one lower-layer via hole. Thus, it is possible to enhance the characteristics of the connection between the lower-layer via hole and the upper-layer via hole and to thereby ensure the supply of power from the capacitor to the IC chip.

Upper surfaces of the plurality of capacitors within the concave portion may be pressed or struck from above, thereby making heights of the upper surfaces of the capacitors uniform. Accordingly, in providing a plurality of capacitors within the concave portion, the heights of the capacitors can be made uniform and the core substrate can be made smooth even if the sizes of the plural capacitors are uneven. Thus, it is possible to appropriately form upper interlayer resin insulating layers and conductor circuits without hampering the smoothness of the core substrate, and, therefore, to decrease the probability of the occurrence of defective printed circuit boards.

BRIEF DESCRIPTION OF DRAWINGS

FIG. 6 is a diagram showing a process for manufacturing the printed circuit board according to the first embodiment of the present invention;

FIG. 13 is a cross-sectional view of a chip capacitor contained in the printed circuit board according to the first modification of the first embodiment;

FIG. 14 is a plan view of chip capacitors contained in a printed circuit board according to the second modification of the first embodiment;

FIG. 16 is a plan view of chip capacitors contained in the printed circuit board according to the second modification of the first embodiment;

FIG. 41 is a view showing a process for manufacturing the printed circuit board according to the fourth embodiment of the present invention;

FIG. 44(A) is an enlarged view of a via hole 660 shown in FIG. 42 and FIG. 44(B) is a view seen from an arrow B of FIG. 44(A);

FIG. 50 is a view showing a process for manufacturing the printed circuit board according to the first modification of the fourth embodiment of the present invention;

FIG. 51 is a view showing a process for manufacturing the printed circuit board according to the first modification of the fourth embodiment of the present invention;

BEST MODE FOR CARRYING OUT THE INVENTION

First Embodiment

The embodiments of the present invention will be described hereinafter with reference to the accompanying drawings.

Figure 7:
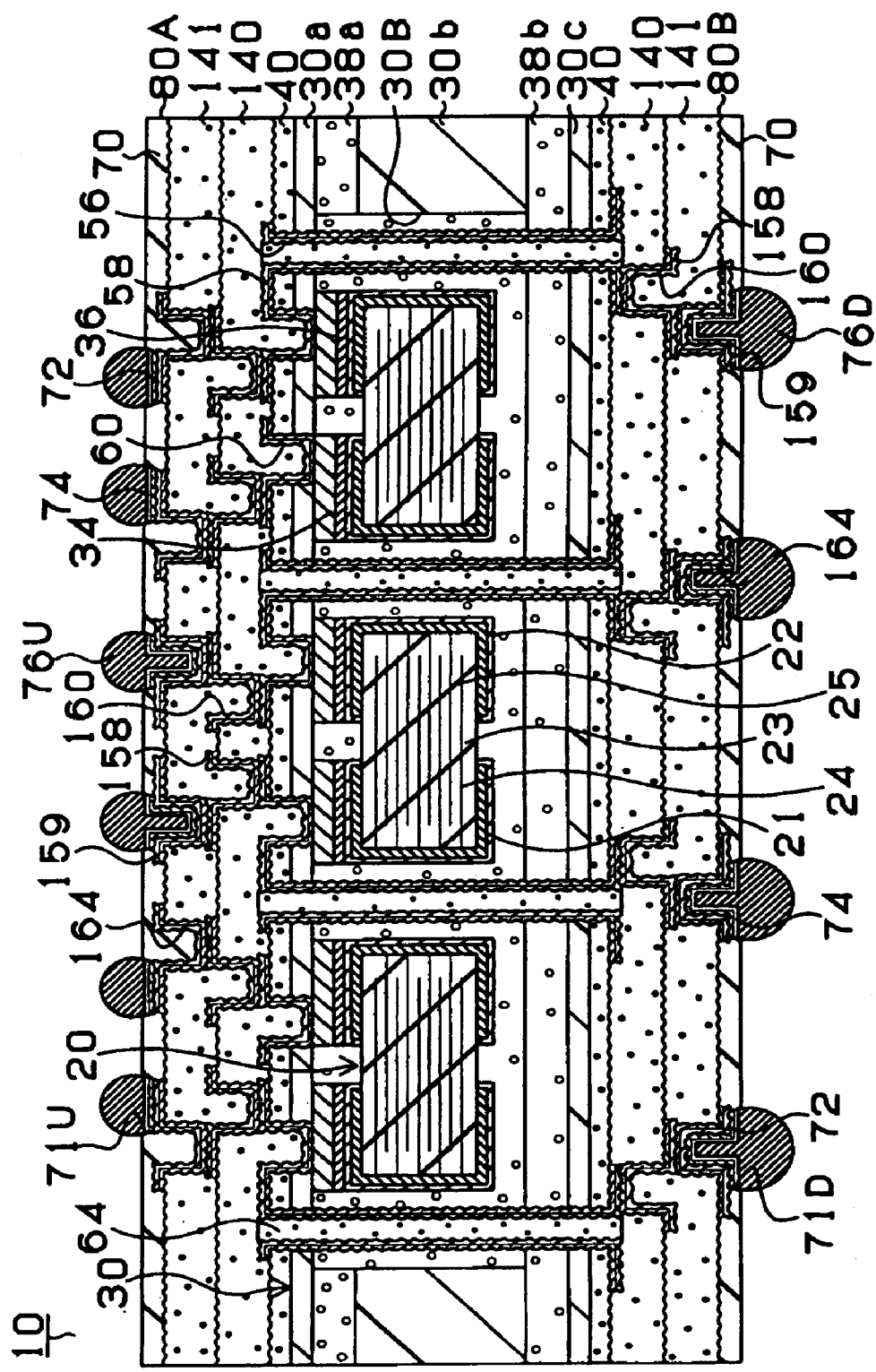
FIG. 7 is a cross-sectional view of the printed circuit board according to the first embodiment of the present invention.

First, the constitution of a printed circuit board according to the first embodiment of the present invention will be described with reference to FIGS. 7 and 8. FIG. 7 is a cross-sectional view of a printed circuit board 10 and FIG. 8 shows a state in which an IC chip 90 is mounted on the printed circuit board 10 shown in FIG. 7 and that the printed circuit board 10 is attached to a daughter board 95.

As shown in FIG. 7, the printed circuit board 10 consists of a core substrate 30 containing a plurality of chip capacitors 20 and buildup wiring layers 80A and 80B. Each of the buildup wiring layers 80A and 80B consists of a resin layer 40 and interlayer resin insulating layers 140 and 141. Conductor circuits 58 and via holes 60 are formed on the upper resin layer 40. Conductor circuits 158 and via holes 160 are formed on each of the upper and lower interlayer resin insulating layers 140. Conductor circuit 159 and via holes 164 are formed on each of the upper and lower interlayer resin insulating layers 141. Solder resist layers 70 are formed on the interlayer resin insulating layers 141, respectively. The buildup wiring layers 80A and 80B are connected to each other by way of through holes 56 formed in the core substrate 30.

Each of the chip capacitors 20 consists of the first electrode 21, the second electrode 22 and a dielectric 23 put between the first and second electrodes as shown in FIG. 7. A plurality of pairs of first conductive films 24 connected to the first electrode 21 side and second conductive films 25 connected to the second electrode 22 side are arranged on the dielectric 23 to face one another.

Figure 8:
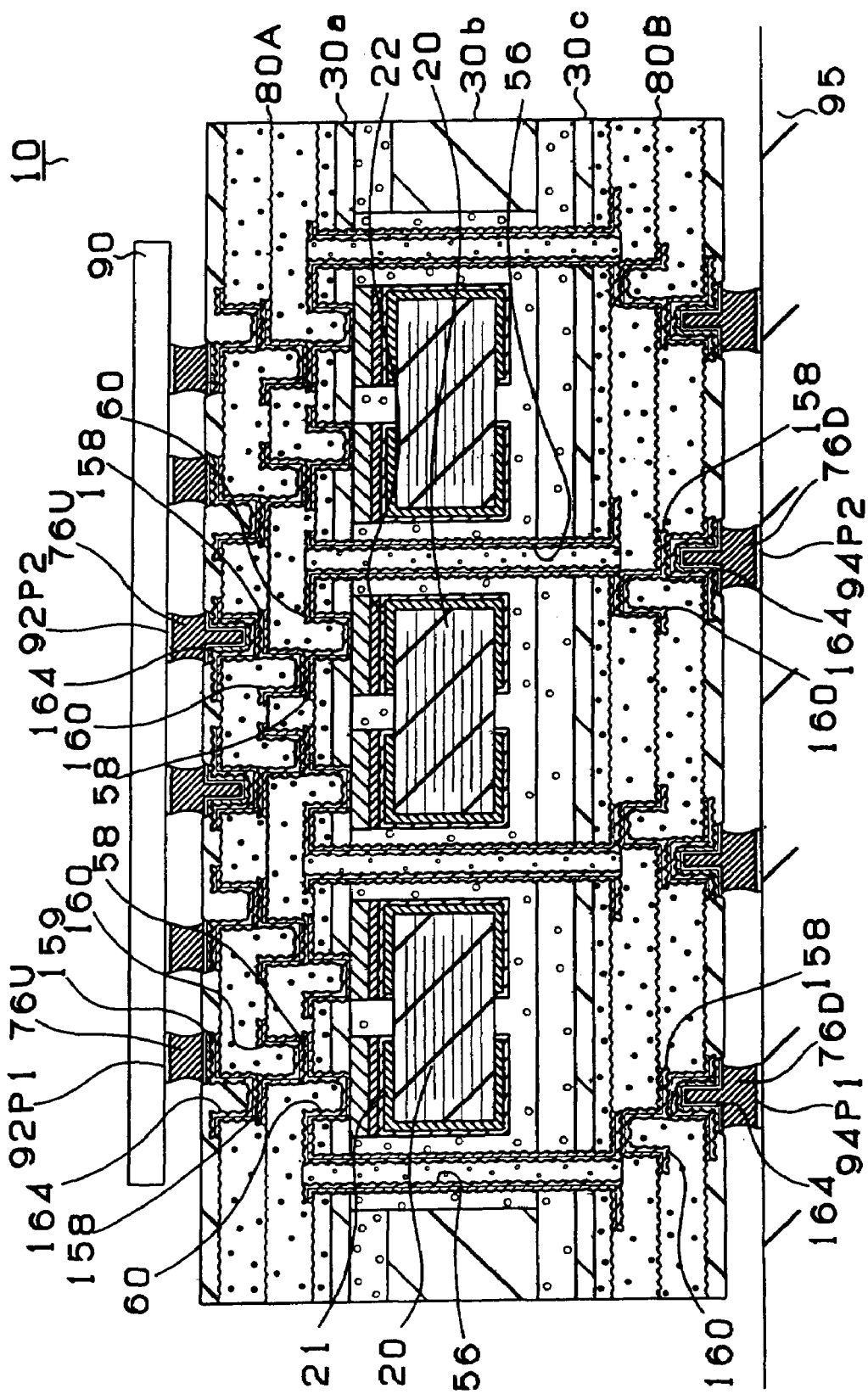
FIG. 8 is a cross-sectional view showing a state in which an IC chip is mounted on the printed circuit board shown in FIG. 7 and that the printed circuit board is attached to a daughter board.

As shown in FIG. 8, solder bumps 76U to be connected to the pads 92P1 and 92P2 of the IC chip 90 are formed on the upper buildup wiring layer 80A. Solder bumps 76D to be connected to the pads 94P1 and 94P2 of the daughter board 95 are formed on the lower buildup wiring layer 80B.

The grounding pad 92P1 of the IC chip 90 is connected to the first electrode 21 of the corresponding chip capacitor 20 through the bump 76U—the conductor circuit 159—the via hole 164—the conductor circuit 158—the via hole 160—the conductor circuit 58—the via hole 60. The grounding pad 94P1 of the daughter board 95 is connected to the first electrode 21 of the corresponding chip capacitor 20 through the bump 76D—the via hole 164—the conductor circuit 158—the via hole 160—the through hole 56—the conductor circuit 58—the via hole 60.

The power supply pad 92P2 of the IC chip 90 is connected to the second electrode 22 of the corresponding chip capacitor 20 through the bump 76U—the via hole 164—the conductor circuit 158—the via hole 160—the conductor circuit 158—the via hole 60. The power supply pad 94P2 of the daughter board 95 is connected to the second electrode 22 of the corresponding chip capacitor 20 through the bump 76D—the via hole 164—the conductor circuit 158—the via hole 160—the through hole 56—the via hole 60. Signal pads of the IC chip are, though not shown, connected to signal pads of the daughter board through the conductor circuits of the printed circuit board, the via holes and the through holes, respectively.

As shown in FIG. 7, the core substrate 30 in this embodiment consists of the first resin substrate 30a having conductive pad sections 34 for connecting the chip capacitors 20 formed on one side, the second resin substrate 30b connected to the first resin substrate 30a through a bonding resin layer (bonding plate) 38a and the third resin substrate 30c connected to the second resin substrate 30b through a bonding resin layer (bonding plate) 38b. An opening 30B capable of containing the chip capacitors 20 is formed in the second resin substrate 30b.

By forming the opening, the chip capacitors 20 can be contained in the core substrate 30. Due to this, the distance between the IC chip 90 and the chip capacitors 20 is shortened to thereby reduce the loop inductance of the printed circuit board 10. Besides, since the first resin substrate 30a, the second resin substrate 30b and the third resin substrate 30c are provided in a laminated manner, the core substrate 30 can obtain sufficient strength. Further, since the core substrate 30 is constituted smoothly by providing the first substrate 30a and the third substrate 30c on the both sides of the core substrate 30, respectively, the resin layers 40, 140 and 141 and the conductor circuits 58, 158 and 159 can be formed on the core substrate 30 appropriately and the probability of the occurrence of defective printed circuit boards can be thereby decreased.

Figure 1:
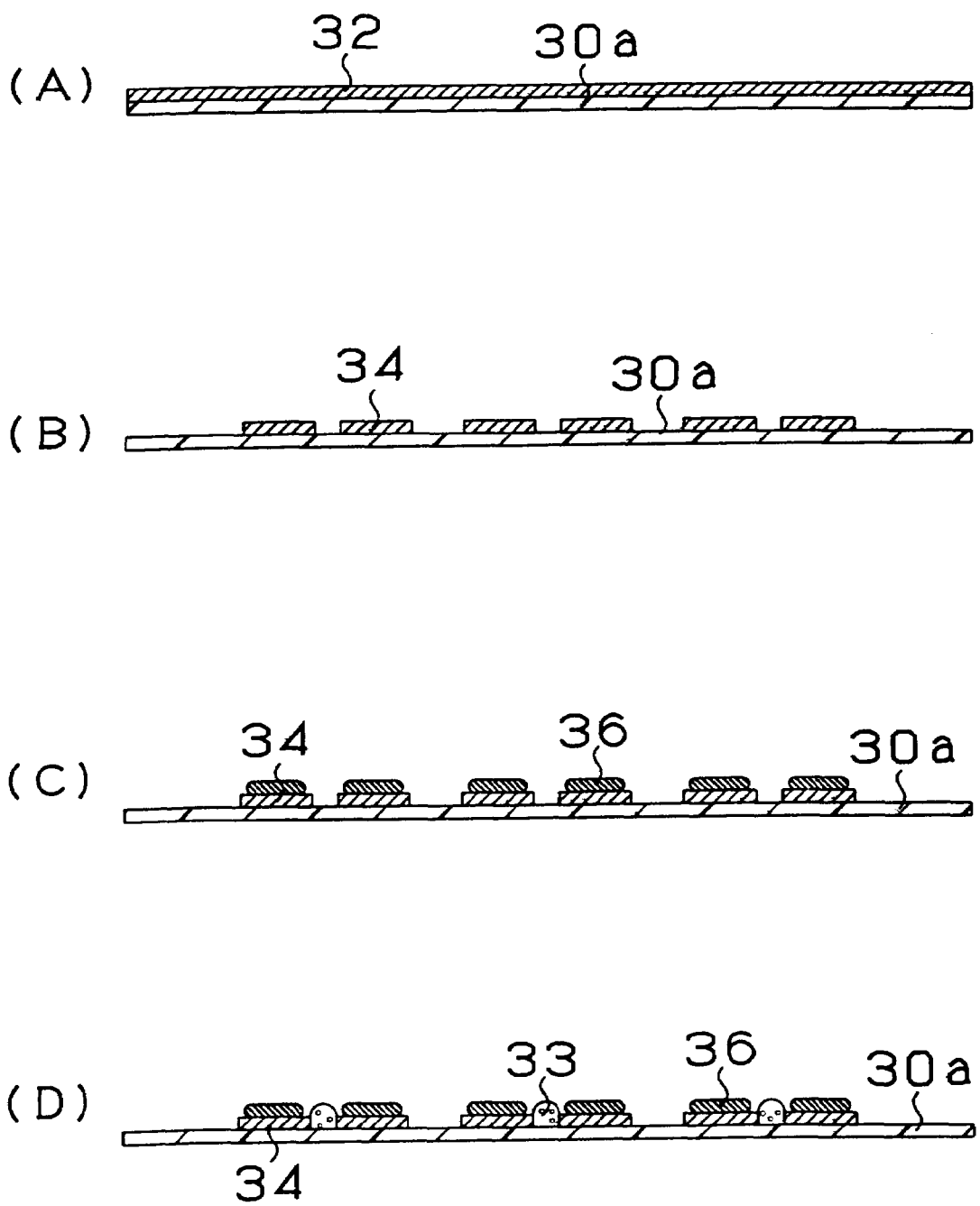
FIG. 1 is a diagram showing a process for manufacturing a printed circuit board according to the first embodiment of the present invention.
Figure 2:
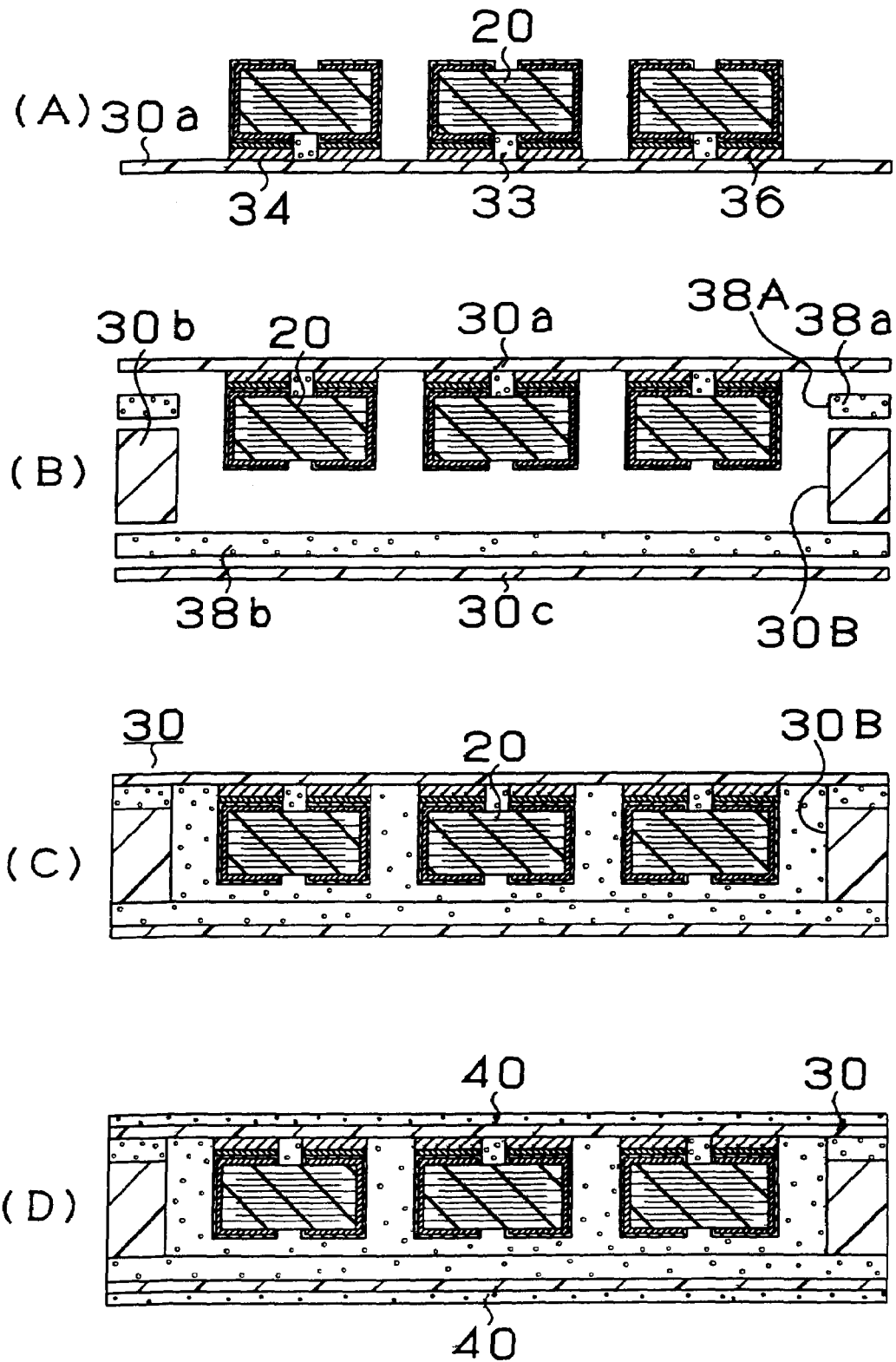
FIG. 2 is a diagram showing a process for manufacturing the printed circuit board according to the first embodiment of the present invention.
Figure 3:
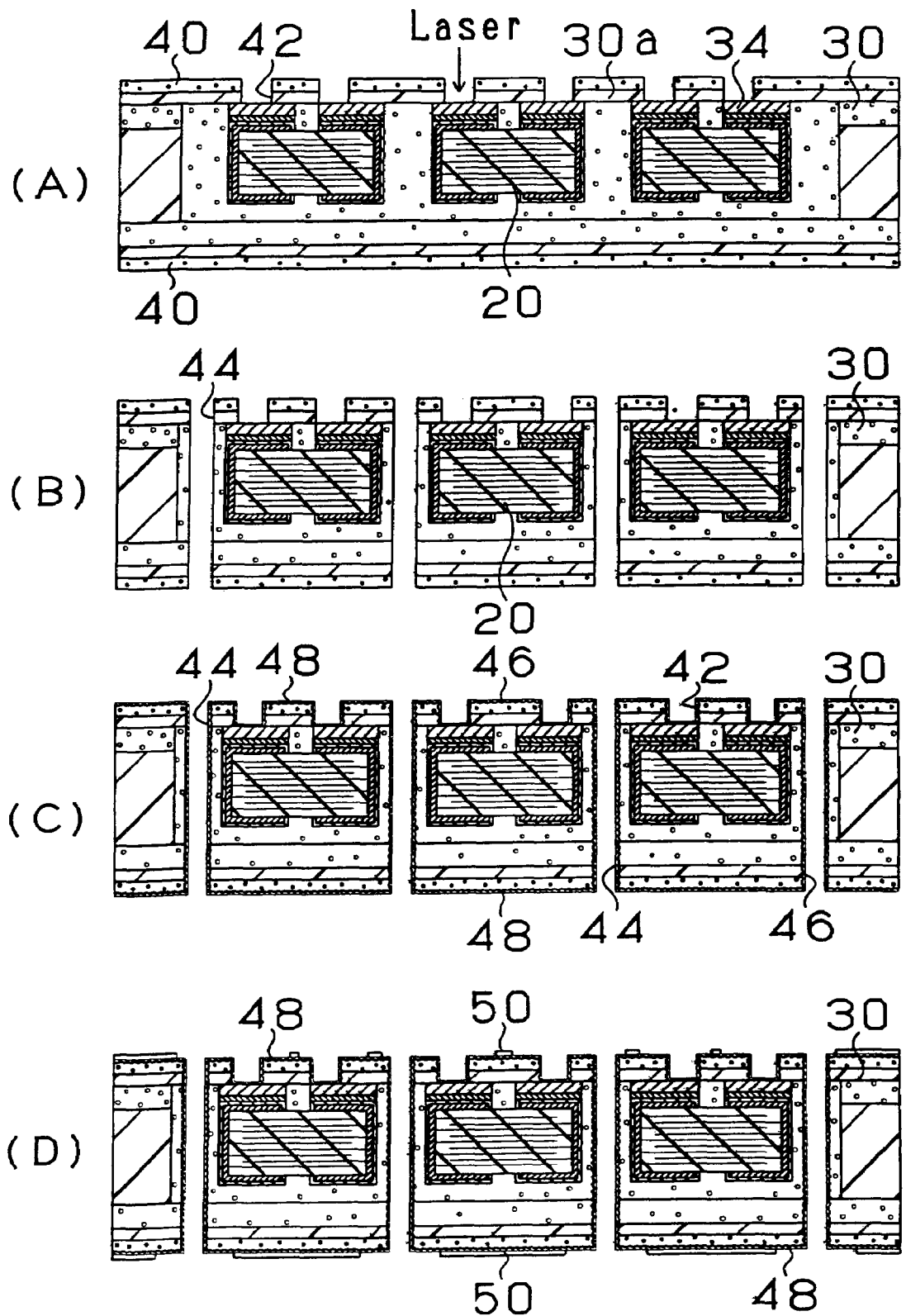
FIG. 3 is a diagram showing a process for manufacturing the printed circuit board according to the first embodiment of the present invention.
Figure 4:
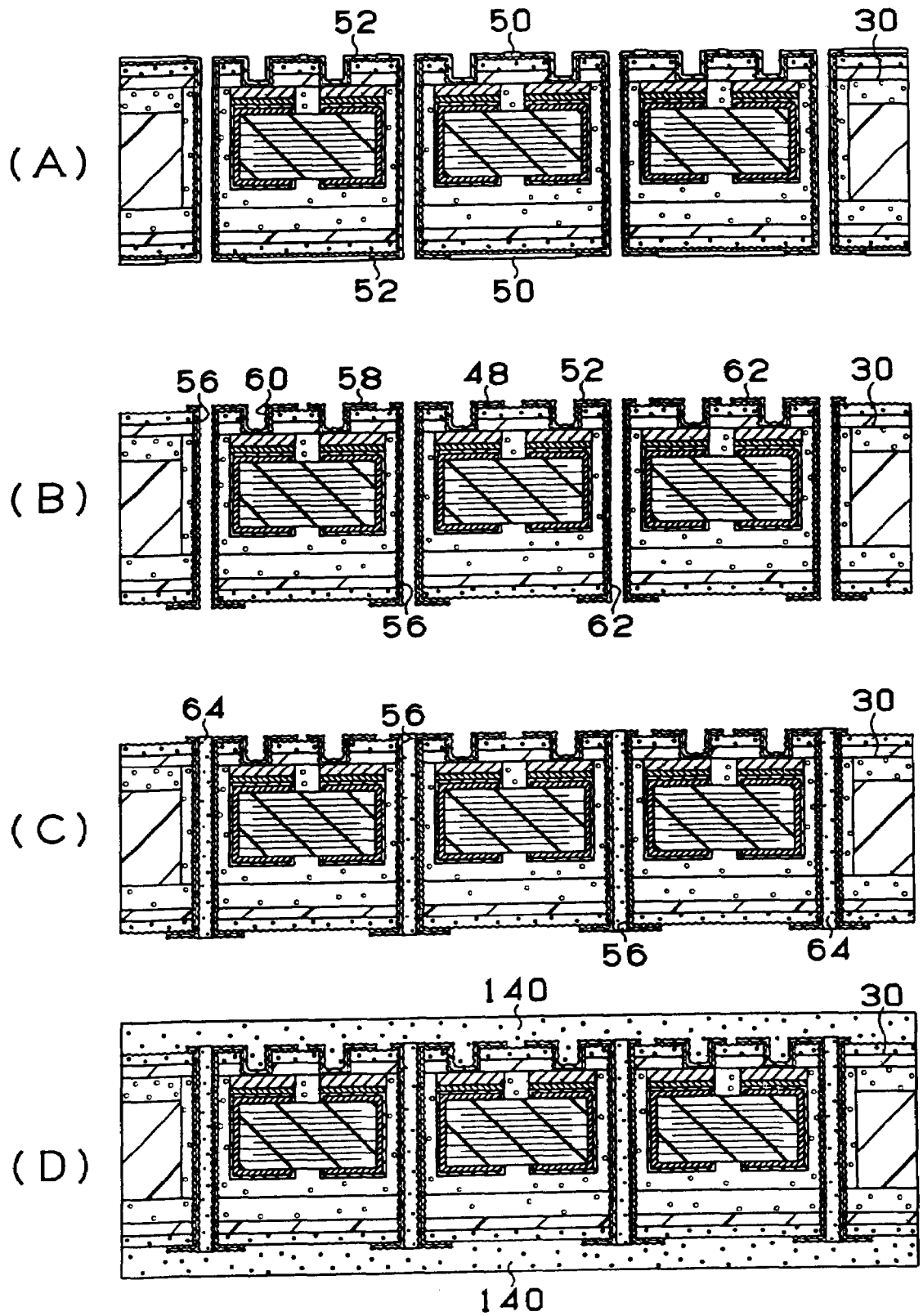
FIG. 4 is a diagram showing a process for manufacturing the printed circuit board according to the first embodiment of the present invention.
Figure 5:
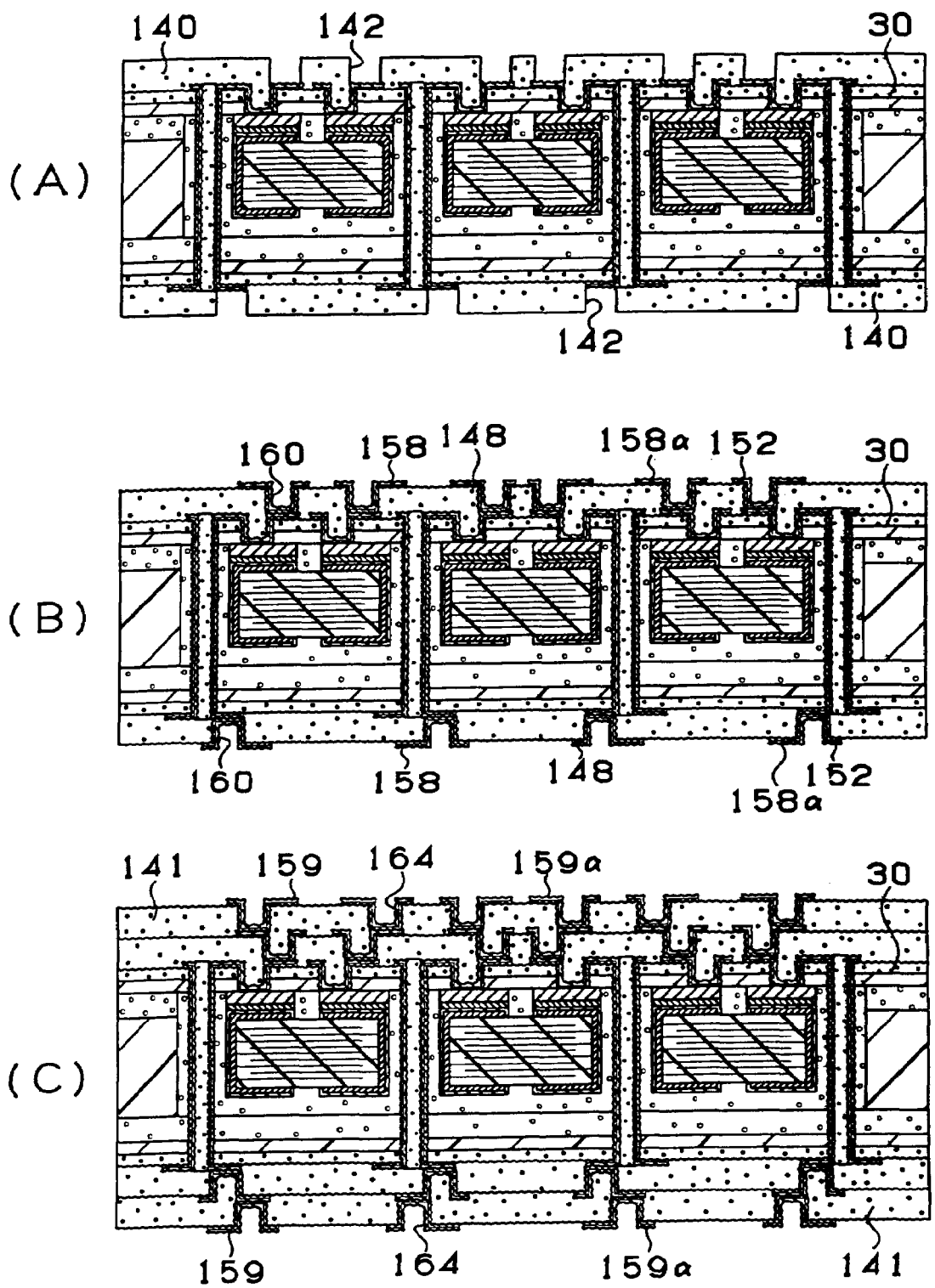
FIG. 5 is a diagram showing a process for manufacturing the printed circuit board according to the first embodiment of the present invention.

Moreover, in this embodiment, as shown in FIG. 1(D), an insulating bonding agent 33 is interposed between the first resin substrate 30a and each chip capacitor 20. Here, the coefficient of the thermal expansion of the bonding agent 33 is set lower than that of the core substrate 30, i.e., set close to that of the chip capacitors 20 made of ceramic. Due to this, even if an internal stress resulting from the difference in the coefficient of thermal expansion among the core substrate, the bonding layers 40 and the chip capacitors 20, occurs in a heat cycle test, cracks, separation and the like less occur to the core substrate, making it possible to attain high reliability. It is also possible to prevent the occurrence of migration.

A method of manufacturing the printed circuit board described above with reference to FIG. 7 will be described with reference to FIGS. 1 to 7.

(1) A copper-clad laminated plate having a copper foil 32 laminated on one side of the first resin substrate 30a having a core having a thickness of 0.1 mm and made of glass cloth or the like which a BT (Bismaleimide-Triazine) resin is impregnated into and hardened in, is employed as a starting material (FIG. 1(A)).

Next, the copper foil 32 side of the copper-clad laminated plate is etched into a pattern, thereby forming conductive pad sections 34 on one side of the first resin substrate 30a (FIG. 1(B)).

It is noted that a substrate made of ceramic or AlN cannot be used as the core substrate. This is because such a substrate has poor workability for the outside shape thereof, sometimes cannot contain capacitors and has gaps even if filled with a resin.

(2) Then, using a printer, an bonding material 36 such as a solder paste or a conductive paste is applied onto the conductive pad sections 34 (FIG. 1(C)). The pad sections 34 may be subjected to potting in addition to the application of the bonding material. As the solder paste, one of Sn/Pb, Sn/Sb, So/Ag and Sn/Ag/Cu can be employed. Then, resin filler 33 is provided between the conductive pads 34 (FIG. 1(D)). By doing so, it is possible to fill the gaps between chip capacitors 20 and the first resin substrate 30a to be described later. Next, a plurality of chip capacitors 20 made of ceramic are disposed on the conductive pad sections 34 and connected to the conductive pad sections 34 through the bonding material 36 (FIG. 2(A)). Either one or a plurality of chip capacitors 20 may be employed; however, if a plurality of chip capacitors 20 are employed, the high integration of capacitors can be realized.

(3) Next, resin layers for bonding (bonding resin layers) 38a and 38b each having a core made of glass cloth or the like and impregnated with an epoxy resin as well as the second resin substrate 30b (having a thickness of 0.4 mm) and the third resin substrate 30c (having a thickness of 0.1 mm) each having a core made of glass cloth or the like which a BT resin is impregnated into and hardened in, are prepared. Through holes 38A and 30B capable of containing the chip capacitors 20 are formed in the bonding resin layer 38a and the second resin substrate 30b, respectively. First, the second resin substrate 30b is mounted on the third resin substrate 30c through the bonding resin layer 38b. Next, the first resin substrate 30a is inverted and mounted on the second resin substrate 30b through the bonding resin layer 38a. Namely, the first resin substrate 30a is superposed on the second resin substrate 30b so that the chip capacitors 20 connected to the first resin substrate 30a can be directed toward the bonding resin layer 38a side and can be contained in the through holes formed in the second resin substrate 30b (FIG. 2(B)). By doing so, the chip capacitors 20 can be contained in the core substrate 30 and the printed circuit board having reduced loop inductance can be provided.

(4) The superposed substrates are pressurized using a thermal press, thereby integrating the first, second and third resin substrates 30a, 30b and 30c in a multilayer manner and forming the core substrate 30 having a plurality of chip capacitors 20 (FIG. 2(C)). First, by pressurizing the substrates, the epoxy resin (insulating resin) is pushed outside of the bonding resin layers 38a and 38b and the gaps between the opening 30B and the chip capacitors 20 are filled with the resin. Further, since the substrates are pressurized and, at the same time, heated, the epoxy resin is hardened and the first resin substrate 30a, the second resin substrate 30b and the third resin substrate 30c are fixedly bonded to one another by interposing the bonding resin layers 38a and 38b as bonding resin. In this embodiment, the gaps within the opening 30B are filled with the epoxy resin flowing out of the bonding resin layers. Alternatively, filler can be provided in the opening 30B.

Since the both sides of the core substrate 30 are the first resin substrate 30a and the third resin substrate 30c which are smooth, respectively, the resin layer 40 and the conductor circuits 58 can be appropriately formed in steps to be described later without damaging the smoothness of the core substrate 30 and the probability of the occurrence of defective printed circuit boards can be decreased. Further, the core substrate 30 can obtain sufficient strength.

(5) Thermosetting epoxy resin sheets to be described later are laminated by vacuum pressing onto the substrate 30 which has been subjected to the above-stated steps, at a pressure of 5 kg/cm² while raising temperature to 50 to 150° C. to thereby provide interlayer resin insulating layers 40 (FIG. 2(D)). The degree of vacuum during vacuum pressing is 10 mmHg.

(6) Next, openings 42 for via holes reaching the conductive pad sections 34 are formed in the interlayer resin insulating layer 40 at the first resin substrate 30a side and the first resin substrate 30a by applying laser (FIG. 3(A)).

(7) Then, penetrating holes 44 for through holes are formed in the core substrate 30 by drilling or applying laser (FIG. 3(B)). Thereafter, a de-smear process is performed using oxygen plasma. Alternatively, a de-smear process using chemicals such as permanganate may be performed.

(8) Using SV-4540 manufactured by ULVAC JAPAN, Ltd., a plasma process is performed to form rough surfaces 46 on the entire surfaces of the core substrate 30. The plasma process is performed for two minutes while using, as inert gas, argon gas on conditions of power of 200 W, a gas pressure of 0.6 Pa and a temperature of 70° C. Then, sputtering is performed with Ni and Cu as targets and Ni—Cu metal layers 48 are formed on the surfaces of the interlayer resin insulating layers 40, respectively (FIG. 3(C)). While sputtering is employed herein, metal layers of copper, nickel or the like may be formed by electroless plating. In some cases, after performing sputtering, electroless plated films may be formed. A roughing process may be performed using an acid or an oxidizer. The rough layers are preferably 0.1 to 5 μm thick.

(9) Next, photosensitive dry films are bonded to the surfaces of the Ni—Cu metal layers 48 and exposure and development processes are performed while mounting masks, thereby forming resists 50 each having a predetermined pattern (FIG. 3(D)). The core substrate 30 is immersed in an electroplating solution, current is applied to the core substrate 30 through the Ni—Cu metal layers 48 and electroplating is conducted to portions in which the resists 50 are not formed on the following conditions, thereby forming electroplated films 52 (FIG. 4(A)).

| [Electroplating Solution] | |
|---|---|
| Sulfuric acid | 2.24 mol/l |
| Copper sulfate | 0.26 mol/l |
| Additive | 19.5 mol/l |
| (Kaparacid HL manufactured by Atotech Japan | |
| [Electroplating Conditions] | |
| Current density | 1 A/dm² |
| Duration | 120 minutes |
| temperature | 22 ± 2° C. |

(10) After separating and removing the resists 50 with 5% NaOH, the Ni—Cu metal layers 48 under the resists 50 are dissolved and removed by etching with a solution mixture of a nitric acid, a sulfuric acid and hydrogen peroxide, thereby forming through holes 56 and conductor circuits 58 (including via holes 60) each consisting of the Ni—Cu metal layer 48 and the electroplated film 52 and having a thickness of 16 μm. After washing and drying the resultant substrate, an etching solution is sprayed on the both sides of the substrate and the surfaces of the through holes 56 and the conductor circuits 58 (including the via holes 60) are etched, thereby forming rough layers 62 on the entire surfaces of the through holes 56 and the conductor circuits 58 (including the via holes 60) (FIG. 4(B)). As the etching solution, a mixture of 10 parts by weight of an imidazole copper (II) complex, 7 parts by weight of a glycolic acid, 5 parts by weight of potassium chloride and 78 parts by weight of ion-exchange water is employed.

(11) Resin filler 64 mainly consisting of an epoxy resin is filled in the through holes 56, and heated and dried (FIG. 4(C)).

(12) Then, the thermosetting epoxy resin sheets used in the step of (5) are laminated on the substrate by vacuum pressing at a pressure of 5 kg/cm² while raising temperature to 50 to 150° C., thereby providing interlayer resin insulating layers 140 (FIG. 4(D)). The degree of vacuum during vacuum pressing is 10 mmHg.

(13) openings 142 for via holes are then formed in the interlayer resin insulating layers 140 by applying laser (FIG. 5(A)).

(14) Thereafter, by repeating the steps of (8) to (10), conductor circuits 158 (including via holes 160) each consisting of the Ni—Cu metal layer 148 and the electroplated film 152 and having a thickness of 16 μm, and rough surfaces 158α are formed on each of the interlayer resin insulating layers 140 (FIG. 5(B)).

(15) By further repeating the steps of (12) to (14), interlayer resin insulating layers 141, conductor circuits 159 (including via holes 164) and rough surfaces 159α are formed further above (FIG. 5(C)).

(16) Next, 46.67 parts by weight of oligomer (having a molecular weight of 4000) which is obtained by forming 50% of epoxy groups of 60 wt % cresol novolac epoxy resin (manufactured by Nippon Kayaku Co., Ltd.) dissolved in diethylene glycol dimethyl ether (DMDG) into an acrylic structure and which imparts photosensitive characteristic, 15 parts by weight of 80 wt % bisphenol A epoxy resin (Epicoat 1001 manufactured by Yuka Shell) dissolved in methyl ethyl ketone, 1.6 parts by weight of an imidazole hardening agent (2E4MZ-CN manufactured by Shikoku Chemicals Corp.), 3 parts by weight of polyhydric acrylic monomer which is photosensitive monomer (R604 manufactured by Kyoei Chemical), 1.5 parts by weight of polyhydricacrylic monomer (DPE6A manufactured by Kyoei Chemical) and 0.71 parts by weight of a dispersing deforming agent (S-65 manufactured by SANNOPCO) are put in a container, stirred and mixed with one another to prepare a mixture composition. Then, 2.0 parts by weight of benzophenone (manufactured by KANTO KAGAKU) serving as a photoinitiator and 0.2 parts by weight of Michler's ketone (manufactured by KANTO KAGAKU) serving as a photosensitizer are added to the resultant mixture, thereby obtaining a solder resist composition (organic resin insulating material) having a viscosity adjusted to 2.0 Pa·s at 25° C.

The viscosity is measured by a B-type viscometer (DVL-B type manufactured by Tokyo Keiki Co., Ltd.) with a rotor No. 4 for 60 rpm and a rotor No. 3 for 4.6 rpm.

(17) Next, the said solder resist composition is applied to each side of the substrate 30 to have a thickness of 20 μm and dried at 70° C. for 20 minutes and 70° C. for 30 minutes. Thereafter, while photomasks each of which has a thickness of 5 mm and on which the pattern of solder resist opening portions are drawn, are made hermetic contact with the solder resist layers 70, respectively, exposed to ultraviolet rays of 1000 mJ/cm², developed with a DMTG solution, thereby forming openings 71U and 71D (FIG. 6(A)).

(18) Then, the substrate on which the solder resist layers (organic resin insulating layers) 70 have been formed are immersed in an electroless nickel plating solution containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) and having a pH of 4.5 for 20 minutes to form nickel plated layers 72 each having a thickness of 5 μm, on the opening portions 71U and 71D, respectively. Further, the substrate is immersed in an electroless plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) on conditions of 80° C. for 7.5 minutes to form gold plated layers 74 each having a thickness of 0.03 μm, on the nickel plated layers 72, respectively (FIG. 6(B)).

(19) Thereafter, a solder paste is printed on each of the openings 71U and 71D of the solder resist layers 70 and a reflow process is conducted at 200° C., thereby forming solder bumps (solder bodies) 76U and 76D. Consequently, it is possible to obtain the printed circuit board 10 having the solder bumps 76U and 76D (FIG. 7).

Next, description will be given to the mounting of the IC chip 90 on the printed circuit board 10 completed through the above-stated steps and to the attachment of the printed circuit board 10 to the daughter board 95, with reference to FIG. 8. The IC chip 90 is mounted on the printed circuit board 10 thus completed so that the solder pads 92P1 and 92P2 of the IC chip 90 correspond to the solder bumps 76U of the printed circuit board 10 and a reflow process is performed, thereby attaching the IC chip 90 to the printed circuit board 10. Likewise, a reflow process is performed so that the pads 94P1 and 94P2 of the daughter board 95 correspond to the solder bumps 76D of the printed circuit board 10, thereby attaching the printed circuit board 10 to the daughter board 95.

The above-stated resin films contain a refractory resin, soluble particles, a hardening agent and other components, each of which will be described hereinafter.

The resin films employed in the manufacturing method of the present invention has particles soluble in an acid or an oxidizer (to be referred to as "soluble particles" hereinafter) which particles are dispersed in a resin refractory to the acid or the oxidizer (to be referred to as "refractory resin" hereinafter).

The expressions "refractory" and "soluble" will now be described. When materials are immersed in solution composed of the same acid or the same oxidizers for the same time, a material of a type which is dissolved at a relatively high dissolving rate is called a "soluble" material for convenience. A material of a type which is dissolved at a relatively slow dissolving rate is called a "refractory material" for convenience.

The soluble particles are exemplified by resin particles which are soluble in acid or an oxidizer (hereinafter called "soluble resin particles"), inorganic particles which are soluble in acid or an oxidizer (hereinafter called "inorganic soluble particles") and metal particles which are soluble in acid or an oxidizer (hereinafter called "soluble metal particles"). The foregoing soluble particles may be employed solely or two or more particles may be employed.

The shape of each of the soluble particles is not limited. The shape may be a spherical shape or a pulverized shape. It is preferable that the particles have a uniform shape. The reason for this lies in that a rough surface having uniformly rough pits and projections can be formed.

It is preferable that the mean particle size of the soluble particles is 0.1 μm to 10 μm. When the particles have the diameters satisfying the foregoing range, particles having two or more particle sizes may be employed. That is, soluble particles having a mean particle size of 0.1 μm to 0.5 μm and soluble particles having a mean particle size of 1 μm to 3 μmm may be mixed. Thus, a more complicated rough surface can be formed. Moreover, the adhesiveness with the conductor circuit can be improved. In the present invention, the particle size of the soluble particles is the length of a longest portion of each of the soluble particles.

The soluble resin particles may be particles constituted by thermosetting resin or thermoplastic resin. When the particles are immersed in solution composed of acid or an oxidizer, the particles must exhibit dissolving rate higher than that of the foregoing refractory resin.

Specifically, the soluble resin particles are exemplified by particles constituted by epoxy resin, phenol resin, phenoxy resin, polyimide resin, polyphenylene resin, polyolefin resin or fluorine resin. The foregoing material may be employed solely or two or more materials may be mixed.

The soluble resin particles may be resin particles constituted by rubber. Rubber above is exemplified by polybutadiene rubber, a variety of denatured polybutadiene rubber, such as denatured epoxy rubber, denatured urethane rubber or denatured (metha) acrylonitrile rubber, and (metha) acrylonitrile butadiene rubber containing a carboxylic group. When the foregoing rubber material is employed, the soluble resin particles can easily be dissolved in acid or an oxidizer. That is, when the soluble resin particles are dissolved with acid, dissolution is permitted with acid except for strong acid. When the soluble resin particles are dissolved, dissolution is permitted with permanganate which has a relatively weak oxidizing power. When chromic acid is employed, dissolution is permitted even at a low concentration. Therefore, retention of the acid or the oxidizer on the surface of the resin can be prevented. When a catalyst, such as palladium chloride, is supplied after the rough surface has been formed as described later, inhibition of supply of the catalyst and oxidation of the catalyst can be prevented.

The inorganic soluble particles are exemplified by particles made of at least a material selected from a group consisting of an aluminum compound, a calcium compound, a potassium compound, a magnesium compound and a silicon compound.

The aluminum compound is exemplified by alumina and aluminum hydroxide. The calcium compound is exemplified by calcium carbonate and calcium hydroxide. The potassium compound is exemplified by potassium carbonate. The magnesium compound is exemplified by magnesia, dolomite and basic magnesium carbonate. The silicon compound is exemplified by silica and zeolite. The foregoing material may be employed solely or two or more materials may be mixed.

The soluble metal particles are exemplified by particles constituted by at least one material selected from a group consisting of copper, nickel, iron, zinc, lead, gold, silver, aluminum, magnesium, potassium and silicon. The soluble metal particles may have surfaces coated with resin or the like in order to maintain an insulating characteristic.

When two or more types of the soluble particles are mixed, it is preferable that the combination of the two types of soluble particles is combination of resin particles and inorganic particles. Since each of the particles has low conductivity, an insulating characteristic with the resin film can be maintained. Moreover, the thermal expansion can easily be adjusted with the refractory resin. Thus, occurrence of a crack of the interlayer resin insulating layer constituted by the resin film can be prevented. Thus, separation between the interlayer resin insulating layer and the conductor circuit can be prevented.

The refractory resin is not limited when the resin is able to maintain the shape of the rough surface when the rough surface is formed on the interlayer resin insulating layer by using acid or oxidizer. The refractory resin is exemplified by thermosetting resin, thermoplastic resin and their composite material. As an alternative to this, the foregoing photosensitive resin of a type having photosensitive characteristic imparted thereto may be employed. When the photosensitive resin is employed, exposure and development processes of the interlayer resin insulating layers can be performed to form the openings for the via.

In particular, it is preferable that the resin containing thermosetting resin is employed. In the foregoing case, the shape of the rough surface can be maintained against plating solution and when a variety of heating processes are performed.

The refractory resin is exemplified by epoxy resin, phenol resin, phenoxy resin, polyimide resin, polyphenylene resin, polyolefin resin and fluorine resin. The foregoing material may be employed solely or two or more types of the materials may be mixed.

It is preferable that epoxy resin having two or more epoxy groups in one molecule thereof is employed. The reason for this lies in that the foregoing rough surface can be formed. Moreover, excellent heat resistance and the like can be obtained. Thus, concentration of stress onto the metal layer can be prevented even under a heat cycle condition. Thus, occurrence of separation of the metal layer can be prevented.

The epoxy resin is exemplified by cresol novolac epoxy resin, bisphenol-A epoxy resin, bisphenol-F epoxy resin, phenol novolac epoxy resin, alkylphenol novolac epoxy resin, biphenol-F epoxy resin, naphthalene epoxy resin, dicyclopentadiene epoxy resin, an epoxy material constituted by a condensation material of phenol and an aromatic aldehyde having a phenol hydroxyl group, triglycidyl isocyanurate and alicyclic epoxy resin. The foregoing material may be employed solely or two or more material may be mixed. Thus, excellent heat resistance can be realized.

It is preferable that the soluble particles in the resin film according to the present invention are substantially uniformly dispersed in the refractory resin. The reason for this lies in that a rough surface having uniform pits and projections can be formed. When via and through holes are formed in the resin film, adhesiveness with the metal layer of the conductor circuit can be maintained. As an alternative to this, a resin film containing soluble particles in only the surface on which the rough surface is formed may be employed. Thus, the portions of the resin film except for the surface is not exposed to acid or the oxidizer. Therefore, the insulating characteristic between conductor circuits through the interlayer resin insulating layer can reliably be maintained.

It is preferable that the amount of the soluble particles which are dispersed in the refractory resin is 3 wt % to 40 wt % with respect to the resin film. When the amount of mixture of the soluble particles is lower than 3 wt %, the rough surface having required pits and projections cannot be formed. When the amount is higher than 40 wt %, deep portions of the resin film are undesirably dissolved when the soluble particles are dissolved by using acid or the oxidizer. Thus, the insulating characteristic between the conductor circuits through the interlayer resin insulating layer constituted by the resin film cannot be maintained. Thus, short circuit is sometimes is caused to occur.

It is preferable that the resin film contains a hardening agent and other components as well as the refractory resin.

The hardening agent is exemplified by an imidazole hardening agent, an amine hardening agent, a guanidine hardening agent, an epoxy adduct of each of the foregoing hardening agents, a microcapsule of each of the foregoing hardening agents and an organic phosphine compound, such as triphenylphosphine or tetraphenyl phosphonium tetraphenyl borate.

It is preferable that the content of the hardening agent is 0.05 wt % to 10 wt % with respect to the resin film. When the content is lower than 0.05 wt %, the resin film cannot sufficiently be hardened. Thus, introduction of acid and the oxidizer into the resin film occurs greatly. In the foregoing case, the insulating characteristic of the resin film sometimes deteriorates. When the content is higher than 10 wt %, an excessively large quantity of the hardening agent component sometimes denatures the composition of the resin. In the foregoing case, the reliability sometimes deteriorates.

The other components are exemplified by an inorganic compound which does not exert an influence on the formation of the rough surface and a filler constituted by resin. The inorganic compound is exemplified by silica, alumina and dolomite. The resin is exemplified by polyimide resin, polyacrylic resin, polyamideimide resin, polyphenylene resin, melanine resin and olefin resin. When any one of the foregoing fillers is contained, conformity of the thermal expansion coefficients can be established. Moreover, heat resistance and chemical resistance can be improved. As a result, the performance of the printed circuit board can be improved.

The resin film may contain solvent. The solvent is exemplified by ketone, such as acetone, methylethylketone or cyclohexane; aromatic hydrocarbon, such as ethyl acetate, butyl acetate, cellosolve acetate, toluene or xylene. The foregoing material may be employed solely or two or more materials may be mixed.

First Other Example of First Embodiment

Figure 9:
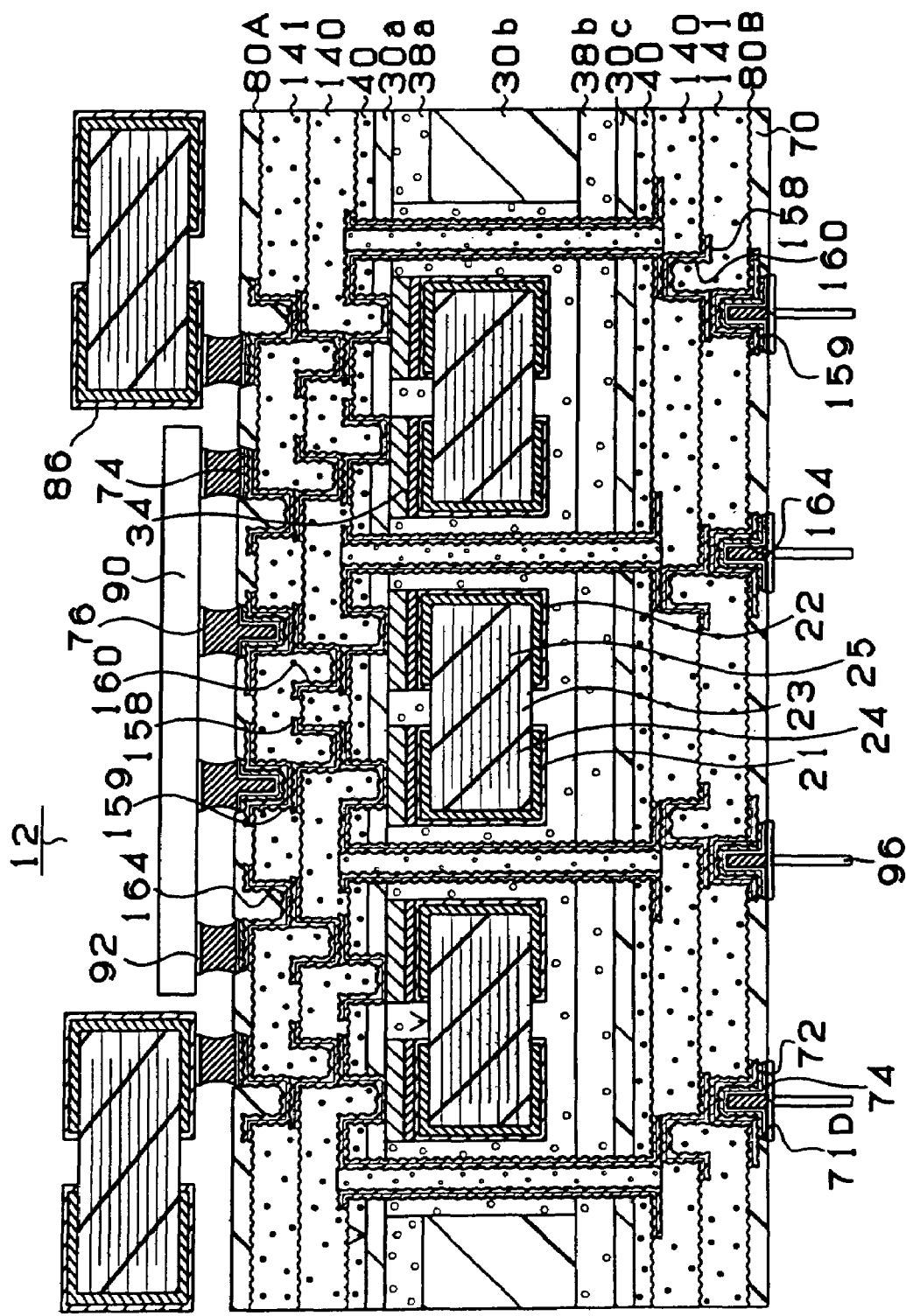
FIG. 9 is a cross-sectional view showing a state in which an IC chip is mounted on a printed circuit board according to the first other example of the first embodiment according to the present invention.

A printed circuit board according to the first other example of the first embodiment of the present invention will be described hereinafter with reference to FIG. 9. The printed circuit board in the first other example of the first embodiment is almost the same as the printed circuit board in the first embodiment stated above. However, in the printed circuit board in the first other example, conductive connection pins 96 are provided at the printed circuit board and the printed circuit is connected to a daughter board through the conductive connection pins 96.

Further, in the first embodiment stated above, only the chip capacitors 20 contained in the core substrate 30 are provided. In this example, mass storage chip capacitors 86 are mounted on the front and reverse sides of the substrate.

The IC chip momentarily consumes high power and performs complex arithmetic operation. In the first other example, to supply high power to the IC chip, chip capacitors 20 and chip capacitors 86 for power supply are provided. The advantage derived from these chip capacitors will be described with reference to FIG. 12.

Figure 12:
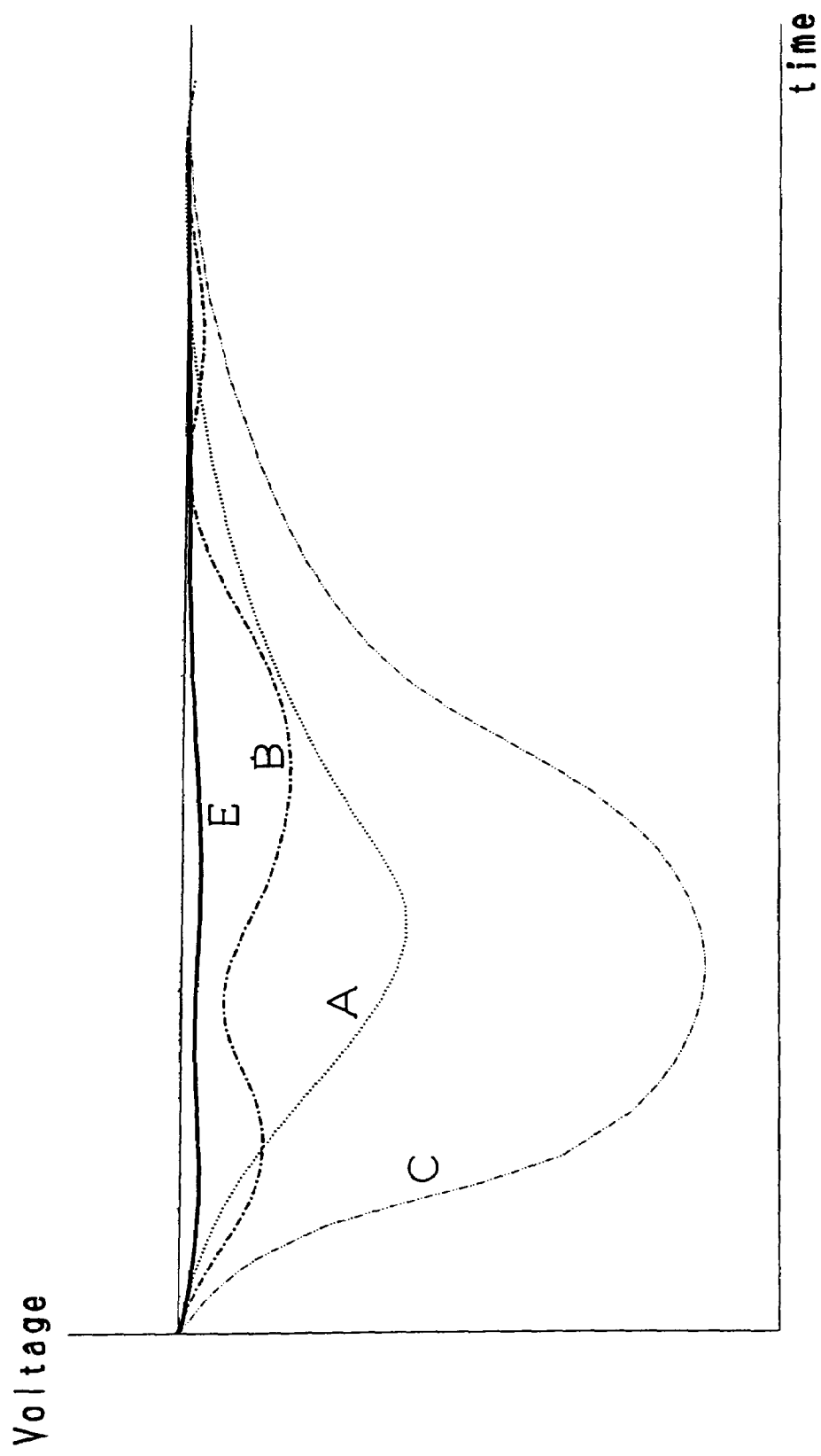
FIG. 12 is a graph showing the change of the voltage supplied to the IC chip relative to time.

FIG. 12 is a graph with a vertical axis indicating voltage supplied to the IC chip and a horizontal axis indicating time. In FIG. 12, two-dot chain line C denotes the voltage variation of a printed circuit board which is not provided with power supply capacitors. If power supply capacitors are not provided, voltage attenuates greatly. A broken line A denotes the voltage variation of a printed circuit board having chip capacitors mounted on the surfaces thereof. Compared with the two-dot chain line C, voltage does not drop greatly. However, since loop length is larger, rate-controlled power supply cannot be conducted sufficiently. Namely, at the start of the supply of power, voltage falls. Further, a two-dot chain line B denotes the voltage drop of a printed circuit board including the chip capacitors described above with reference to FIG. 8. In this case, loop length can be shortened; however, mass storage chip capacitors cannot be contained in a core substrate 30 and voltage, therefore, varies. Here, a solid line E denotes the voltage variation of the printed circuit board in the first other example which printed circuit board has the chip capacitors 20 mounted in the core substrate and the mass storage chip capacitors 86 mounted on the surfaces thereof. Voltage variation is minimized by providing the chip capacitors 20 and the mass storage chip capacitors 86 (having relatively high inductance) in the vicinity of the IC chip.

First Modification of First Embodiment

Figure 11:
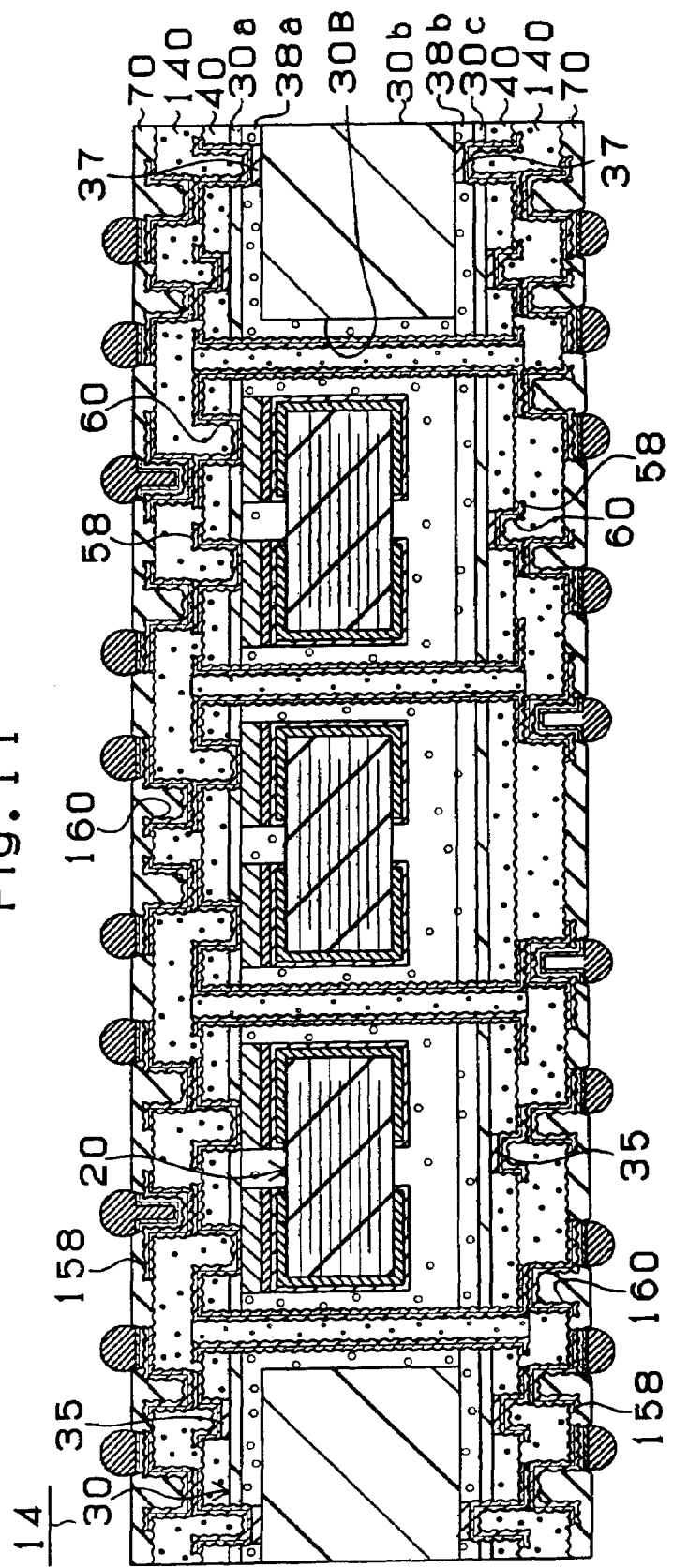
FIG. 11 is a cross-sectional view of the printed circuit board according to the first modification of the first embodiment of the present invention.

Next, a printed circuit board according to the first modification of the first embodiment of the present invention will be described with reference to FIG. 11.

The printed circuit board in the first modification is almost the same in constitution as the printed circuit board in the above-stated first embodiment. However, in the printed circuit board 14 in the first modification, conductor circuits 35 are formed on one sides of the first resin substrate 30a and the third resin substrate 30c, and conductor circuits 37 are formed on the both sides of the second resin substrate 30b provided with an opening 30B for containing chip capacitors 20. In the first embodiment, the conductor circuits 35 are formed on one sides of the first resin substrate 30a and the third resin substrate 30c and the conductor circuits 37 are formed on the both sides of the second resin substrate 30b. Due to this, it is possible to advantageously increase wiring density and advantageously reduce the number of interlayer resin insulating layers to be built up.

Furthermore, as shown in FIG. 13(A), in the chip capacitor 20 of the printed circuit board in the first modification, after the coating layer (not shown) of the first and second electrodes 21 and 22 are completely separated, the first and second electrodes 21 and 22 are coated with copper plated films 29. The first and second electrodes 21 and 22 each coated with the copper plated film 29 are electrically connected to each other by a via hole 50 made of a copper plated material. Here, the electrodes 21 and 22 of the chip capacitor are made by metalization and have irregularities on the surfaces thereof. In the first modification, since the surfaces of the first and second electrodes 21 and 22 are smoothed by the copper plated films 29, no migration occurs to thereby cause no disadvantage to the electrodes of the capacitor.

The copper plated films 29 are provided after the nickel/tin layer (coating layer) coated on the surface of each metal layer 26 in a phase of manufacturing chip capacitors 20 is separated in a phase of mounting the chip capacitors on the printed circuit board. Alternatively, the copper plated films 29 can be directly coated on the metal layers 26 in the phase of manufacturing the chip capacitors 20. Namely, in the first modification, as in the case of the first embodiment, after openings reaching the copper plated films 29 of the electrodes are provided by applying laser, a de-smear process is performed to thereby form via holes by copper plating. Accordingly, even if an oxide film is formed on the surface of the copper plated film 29, the oxide film can be removed by the laser and de-smear processes, thereby making it possible to establish connection appropriately.

As shown in FIG. 13(B), it is also possible to employ the first and second electrodes 21 and 22 of the capacitor 20 while removing part of the coats 28 of the electrodes 21 and 22. This is because connection characteristics can be enhanced by exposing the first and second electrodes 21 and 22.

Further, rough layers 23α are provided on the surfaces of a dielectric 23 of the chip capacitor 20 which dielectric is made of ceramic. Due to this, the adhesiveness between the chip capacitor 20 made of ceramic and the first resin substrate 30a made of a resin is high and the first resin substrate 30a is not separated on the interface therebetween even if a heat cycle test is conducted. The rough layers 23α can be formed by polishing the surfaces of the chip capacitor 20 after sintering them or by roughing the surfaces before sintering them. In the first modification, the surfaces of the capacitor are roughed and the adhesiveness between the capacitor and the resin is thereby enhanced. Alternatively, a silane coupling process can be conducted to the surfaces of the capacitor.

Figure 10:
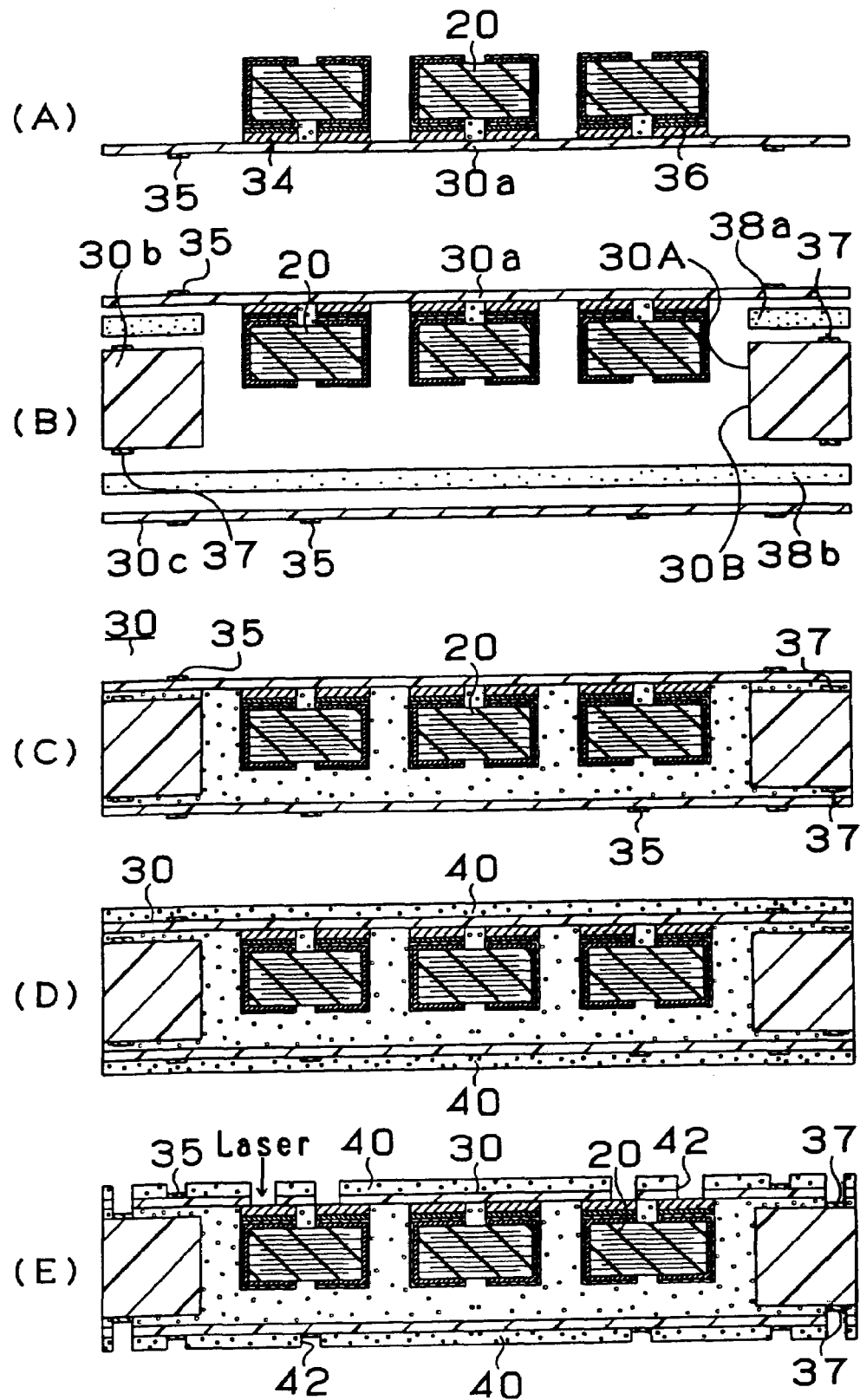
FIG. 10 is a diagram showing a process for manufacturing a printed circuit board according to the first modification of the first embodiment of the present invention.

A process of manufacturing the printed circuit board according to the first modification of the present invention will be described hereinafter with reference to FIGS. 10 and 11.

(1) The first resin substrate 30a having a core having a thickness of 0.1 mm and made of glass cloth or the like which a BT (Bismaleimide-Triazine) resin is impregnated into and hardened in, is prepared. Conductive pad sections 34 are formed on one side of the first resin substrate 30a and conductor circuits 35 are formed on the other side of the substrate 30a. Next, a plurality of chip capacitors 20 are mounted on the conductive pad sections 34 through an bonding agent such as a solder or a conductive paste and connected to the conductive pad sections 34 (FIG. 10(A)).

(2) Next, resin layers for bonding (bonding resin layers) 38a, 38b each having a core made of glass cloth or the like and impregnated with an epoxy resin as well as the second resin substrate 30b (having a thickness of 0.4 mm) and the third resin substrate 30c (having a thickness of 0.1 mm) each having a core made of glass cloth or the like which a BT resin is impregnated into and hardened in, are prepared. Through holes 38A and 38B capable of containing the chip capacitors 20 are formed in the bonding resin layer 38a and the second resin substrate 30b, respectively. Conductor circuits 37 are formed on the both sides of the second resin substrate 30b and conductor circuits 35 are formed on one side of the third resin substrate 30c. First, the second resin substrate 30b is mounted on a surface on which the conductor circuits 35 of the third resin substrate 30c are not formed, through the bonding resin layer 38b. The first resin substrate 30a is inverted and mounted on the second resin substrate 30b through the bonding resin layer 38a. Namely, the first resin substrate 30a is superposed on the second resin substrate 30b so that the chip capacitors 20 connected to the first resin substrate 30a can be contained in the opening 30B formed in the second resin substrate 30b (FIG. 10(B)).

(3) The superposed substrates are pressurized using a thermal press, thereby integrating the first, second and third resin substrates 30a, 30b and 30c in a multilayer manner and forming the core substrate 30 having a plurality of chip capacitors 20 (FIG. 10(C)). First, by pressurizing the substrates, the epoxy resin (insulating resin) is pushed outside of the bonding resin layers 38a and 38b and the gaps between the opening 30B and the chip capacitors 20 are filled with the resin. Further, since the substrates are pressurized and, at the same time, heated, the epoxy resin is hardened and the first resin substrate 30a, the second resin substrate 30b and the third resin substrate 30c are fixedly bonded to one another by interposing the bonding resin layers 38a and 38b as bonding resin.

(4) Thermosetting epoxy resin sheets are laminated by vacuum pressing onto the substrate 30 which has been subjected to the above-stated steps, at a pressure of 5 kg/cm² while raising temperature to 50 to 150° C. to thereby provide interlayer resin insulating layers 40 (FIG. 10(D)). The degree of vacuum during vacuum pressing is 10 mmHg.

(5) Next, openings 42 for via holes to be connected to the conductive pad sections 34 and the conductor circuits 35 and 37 are formed on the upper and lower surfaces of the substrate 30 by applying laser (FIG. 10(E)).

Later steps are the same as those of (7) to (19) in the first embodiment stated above, which description will not be, therefore, given herein.

Second Modification of First Embodiment

Next, the constitution of a printed circuit board according to the second modification of the first embodiment will be described with reference to FIG. 14.

The printed circuit board in the second modification is almost the same in constitution as the printed circuit board in the first embodiment stated above. They, however, differ in chip capacitors 20 contained in the core substrate 30. FIG. 14 is a plan view of chip capacitors. FIG. 14(A) shows a chip capacitor before being cut for providing a plurality of chip capacitors. In FIG. 14(A), a dashed line denotes a cut line. As shown in FIG. 14(B), in the printed circuit board in the first embodiment stated above, the first electrodes 21 and the second electrodes 22 are provided on the edges of the chip capacitor. FIG. 14(C) shows a chip capacitor before being cut for providing a plurality of chip capacitors in the second modification. In FIG. 14(C), a dashed line denotes a cut line. In the printed circuit board in the second modification, as shown in the plan view of FIG. 14(D), first electrodes 21 and second electrodes 22 are provided inside of the edges of the chip capacitor.

In the printed circuit board in the second modification, the chip capacitors 20 each having electrodes formed inside of the outer edges thereof are employed, so that mass storage chip capacitors can be employed.

Next, a printed circuit board according to the first other example of the second modification will be described with reference to FIG. 15.

Figure 15:
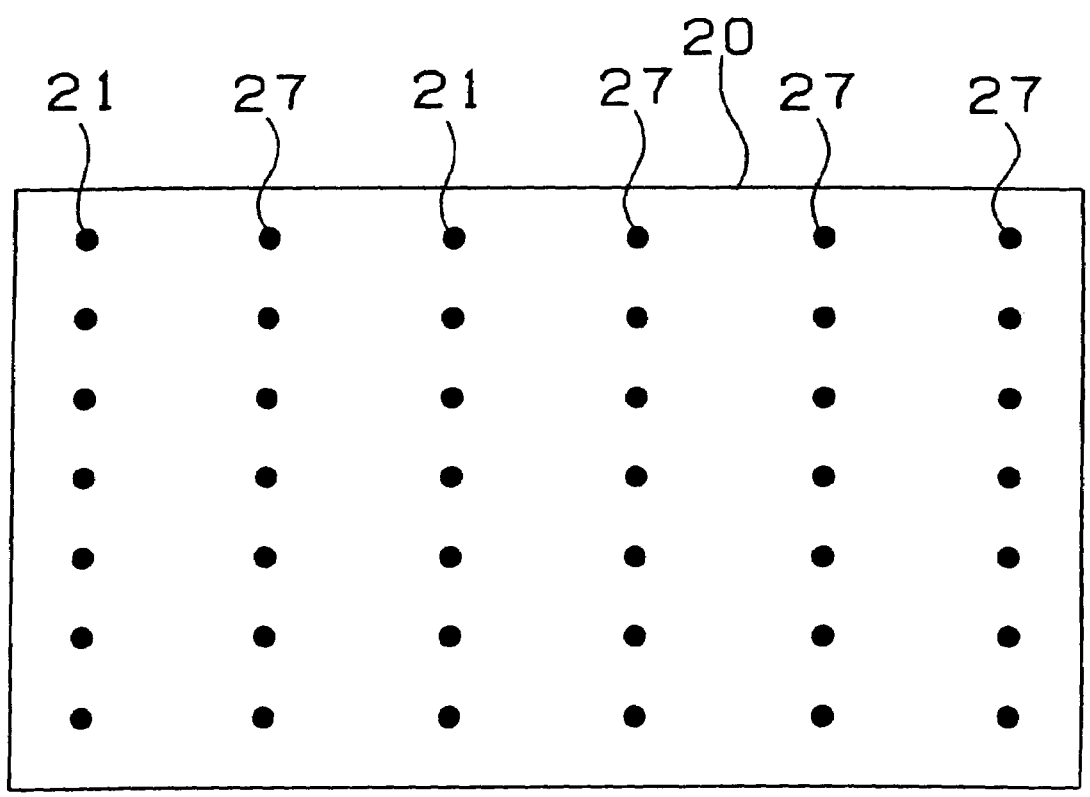
FIG. 15 is a plan view of a chip capacitor contained in the printed circuit board according to the second modification of the first embodiment.

FIG. 15 is a plan view of a chip capacitor 20 contained in the core substrate of the printed circuit board according to the first other example. In the first embodiment stated above, a plurality of small storage chip capacitors are contained in the core substrate. In the first other example, by contrast, a large, mass storage chip capacitor 20 is contained in the core substrate. The chip capacitor 20 consists of the first electrodes 21, the second electrodes 22, a dielectric 23, first conductive films 24 connected to the first electrodes 21, second conductive films 25 connected to the second electrodes 22, electrodes 27 which are not connected to the first and second conductive films 24 and 25, for the connection of the upper and lower surfaces of the chip capacitor. The IC chip and the daughter board are connected to each other through the electrodes 27.

Since the large chip capacitor 20 is employed in the printed circuit board in the first modification, it is possible to employ a mass storage chip capacitor. Further, since the large chip capacitor 20 is employed, the printed circuit board does not warp even if a heat cycle is performed repeatedly.

Next, a printed circuit board according to the second other example of the second modification will be described with reference to FIG. 16. FIG. 16(A) shows a chip capacitor before being cut for providing a plurality of chip capacitors. In FIG. 16(A), a dashed line denotes an ordinary cut line. FIG. 16(B) is a plan view of the chip capacitors. As shown in FIG. 16(B), a plurality of (or in FIG. 16(B), three) chip capacitors for providing multiple capacitors are coupled to one another and employed as a large capacitor as a whole.

In the second other example, since the large chip capacitor 20 is employed, it is possible to employ a mass storage chip capacitor. Further, since the large chip capacitor 20 is employed, the printed circuit board does not warp even if a heat cycle is performed repeatedly.

In the embodiment stated above, the chip capacitors are built in the printed circuit board. Alternatively, plate-like capacitors each constituted by providing a conductive film on a ceramic plate may be employed instead of the chip capacitors.

The manufacturing method in the first embodiment makes it possible to contain the capacitors in the core substrate and to shorten the distance between the IC chip and the capacitors, thereby reducing the loop inductance of the printed circuit board. Further, since the printed circuit board is constituted by providing a plurality of resin layers, the core substrate can obtain sufficient strength. Besides, the first resin substrate and the third resin substrate are provided on the both sides of the core substrate, respectively, thereby constituting the core substrate smoothly. Thus, it is possible to appropriately form interlayer resin insulating layers and conductor circuits on the core substrate and to thereby decrease the probability of the occurrence of defective printed circuit boards.

Moreover, since the resin is filled between the core substrate and the capacitors, a stress resulting from the capacitors or the like can be reduced even if it occurs and no migration occurs. Due to this, there is no fear that the electrodes of the capacitors are separated from the connection sections of the via holes and dissolved. Thus, it is possible to maintain desired performance even if a reliability test is executed.

In addition, even if the capacitors are coated with copper, it is possible to prevent the occurrence of migration.

Second Embodiment

Figure 19:
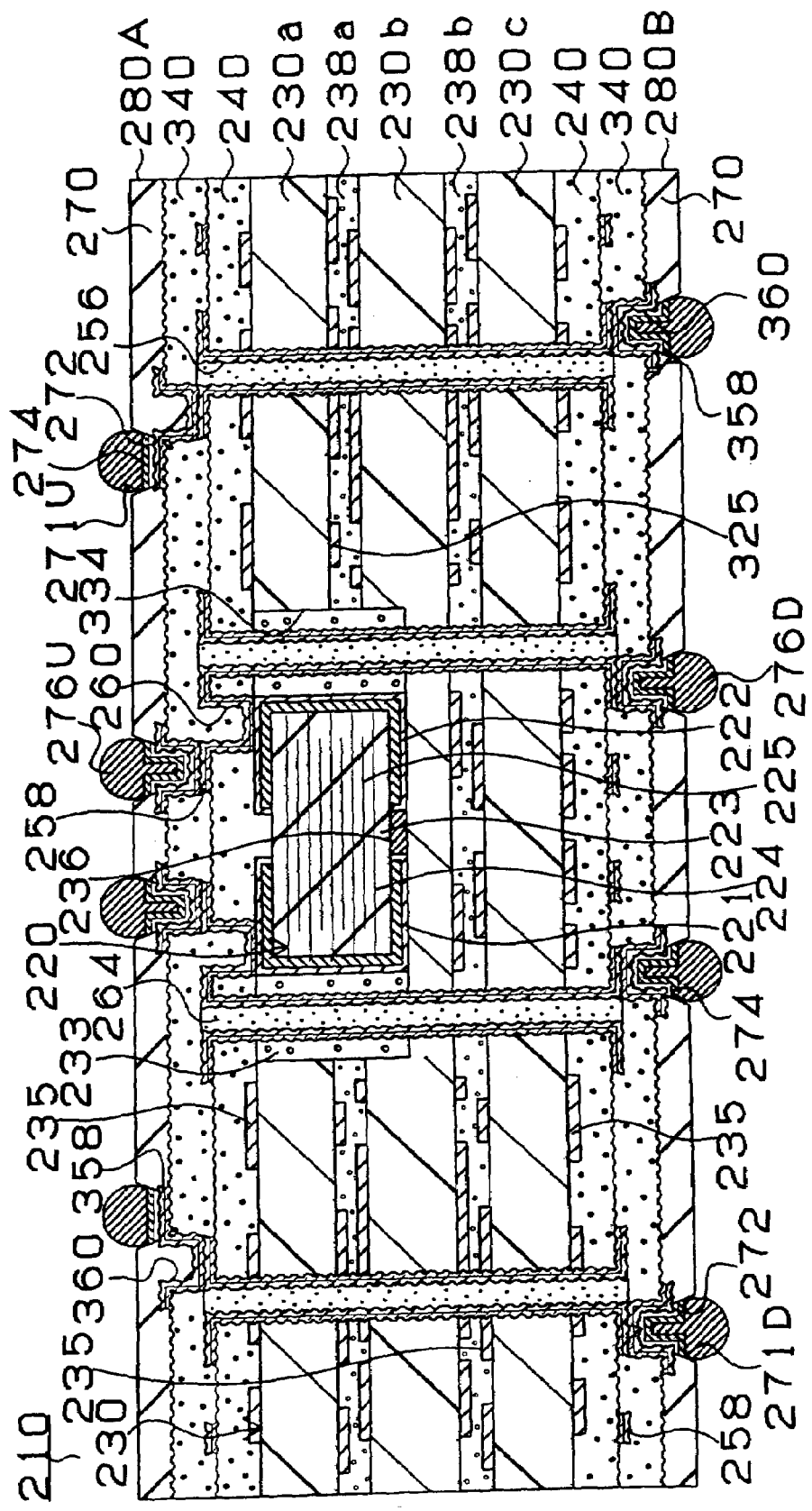
FIG. 19 is a cross-sectional view of the printed circuit board according to the second embodiment of the present invention.
Figure 20:
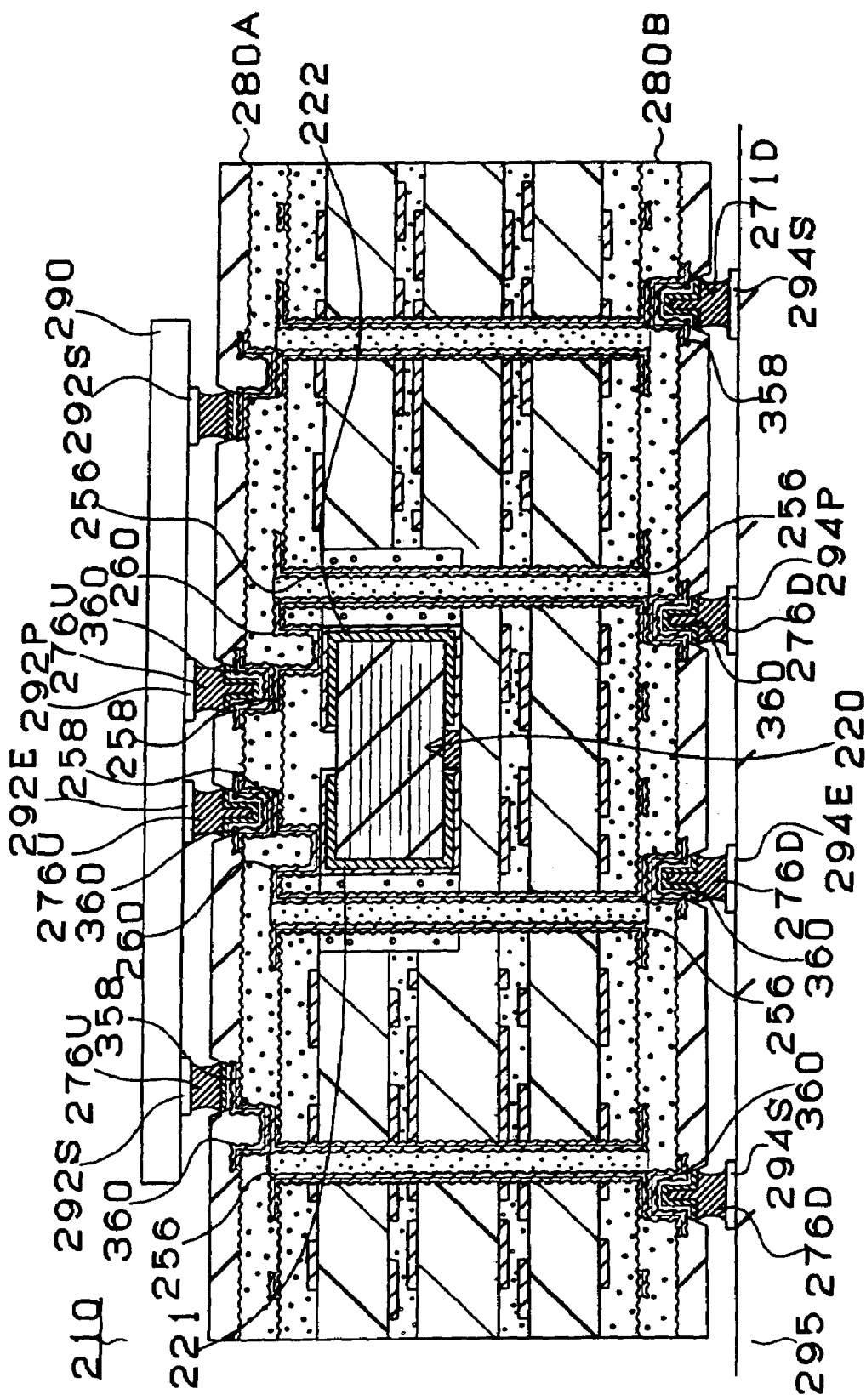
FIG. 20 is a cross-sectional view showing a state in which an IC chip is mounted on the printed circuit board shown in FIG. 19 and that the printed circuit board is attached to a daughter board.

The constitution of a printed circuit board according to the second embodiment of the present invention will be described hereinafter with reference to FIGS. 19 and 20. FIG. 19 is a cross-sectional view of a printed circuit board 210. FIG. 20 shows a state in which an IC chip 290 is mounted on the printed circuit board 210 shown in FIG. 19 and that the printed circuit board 210 is attached to a daughter board 295.

As shown in FIG. 19, the printed circuit board 210 consists of a core substrate 230 containing a chip capacitor 220, and buildup wiring layers 280A and 280B. The buildup wiring layers 280A and 280B are connected to each other by through holes 256. Each of the wiring layers 280A and 280B consists of interlayer resin insulating layers 240 and 340. At the upper buildup wiring layer 280A side, conductor circuits 358 and via holes 260 connected to the first electrode 221 and the second electrode 222 of the chip capacitor 220, respectively, are formed on the interlayer resin insulating layer 240, and conductor circuits 358 and via holes 360 are formed on the interlayer resin insulating layers 340. At the lower buildup wiring layer 280B side, conductor circuits 258 are formed on the interlayer resin insulating layer 240, and conductor circuits 358 and via holes 360 are formed on the interlayer resin insulating layer 340. Solder resist layers 270 are formed on the interlayer resin insulating layers 340 of the buildup wiring layers 280A and 280B, respectively.

As shown in FIG. 19, the chip capacitor 220 consists of the first electrode 221, the second electrode 222 and a dielectric 23 put between the first and second electrodes. A plurality of pairs of first conductive films 224 connected to the first electrode 221 side and second conductive film 225 connected to the second electrode 222 side are arranged to face one another.

As shown in FIG. 20, solder bumps 276U to be connected to the pads 292E, 292P and 292S of the IC chip 290 are provided on the upper buildup wiring layer 280A. Solder bumps 276D to be connected to the pads 294E, 294P and 294S of the daughter board 295 are provided on the lower buildup wiring layer 280B.

The signal pads 292S of the IC chip 290 shown in FIG. 20 are connected to the signal pads 294S of the daughter board 295 through the bumps 276U—the conductor circuits 358—the via holes 360—the through holes 256—the via holes 360—the bumps 276D, respectively.

The grounding pad 292E of the IC chip 290 is connected to the first electrode 221 of the chip capacitor 220 through the bump 276U—the via hole 360—the conductor circuit 258—the via hole 260. The grounding pad 294E of the daughter board 295 is connected to the first electrode 221 of the chip capacitor 220 through the bump 276D—the via hole 360—the through hole 256—the via hole 260.

The power supply pad 292P of the IC chip is connected to the second electrode 222 of the chip capacitor 220 through the bump 276U—the via hole 360—the conductor circuit 258—the via hole 260. The power supply pad 294P of the daughter board 295 is connected to the second electrode 222 of the chip capacitor 220 through the bump 276D—the via hole 360—the through hole 256—the via hole 260.

As shown in FIG. 19, the core substrate 230 in this embodiment consists of the first resin substrate 230a, the second resin substrate 230b connected to the first resin substrate 230a through a bonding resin layer (bonding plate) 238a and the third resin substrate 230c connected to the second resin substrate 230b through a bonding resin layer (bonding plate) 238b. Conductor circuits 235 are formed on the both sides of the first resin substrate 230a, the second resin substrate 230b and the third resin substrate 230c. A concave portion 334 capable of containing the chip capacitor 220 is formed in the core substrate 230 by spot facing and the chip capacitor 220 is contained in the concave portion 334.

In this way, the chip capacitor 220 can be contained in the core substrate 230, so that the distance between the IC chip 290 and the chip capacitor 220 becomes short and the loop inductance of the printed circuit board 210 can be reduced. Further, since the core substrate 230 is formed by providing the first, second and third resin substrates 230a, 230b and 230c each having the conductor circuits 235 arranged on the both sides thereof, wiring density within the core substrate 230 increases and the number of interlayer resin insulating layers can be thereby reduced.

Furthermore, as shown in FIG. 18(A), in the second embodiment, an bonding agent 236 is interposed between the lower surface of the through hole 34 of the core substrate 230 and the chip capacitor 220, and resin filler 233 is filled between the side surface of the through hole 237 and the chip capacitor 220. Here, the coefficients of thermal expansion of the bonding agent 236 and the resin filler 233 are set lower than that of the core substrate 230, i.e., set close to that of the chip capacitor 220 made of ceramic. Due to this, even if an internal stress resulting from the difference in the coefficient of thermal expansion occurs between the core substrate 230 and the chip capacitor 220, cracks, separation and the like less occur to the core substrate 230 and high reliability can be, therefore, attained. It is also possible to prevent the occurrence of migration.

Figure 17:
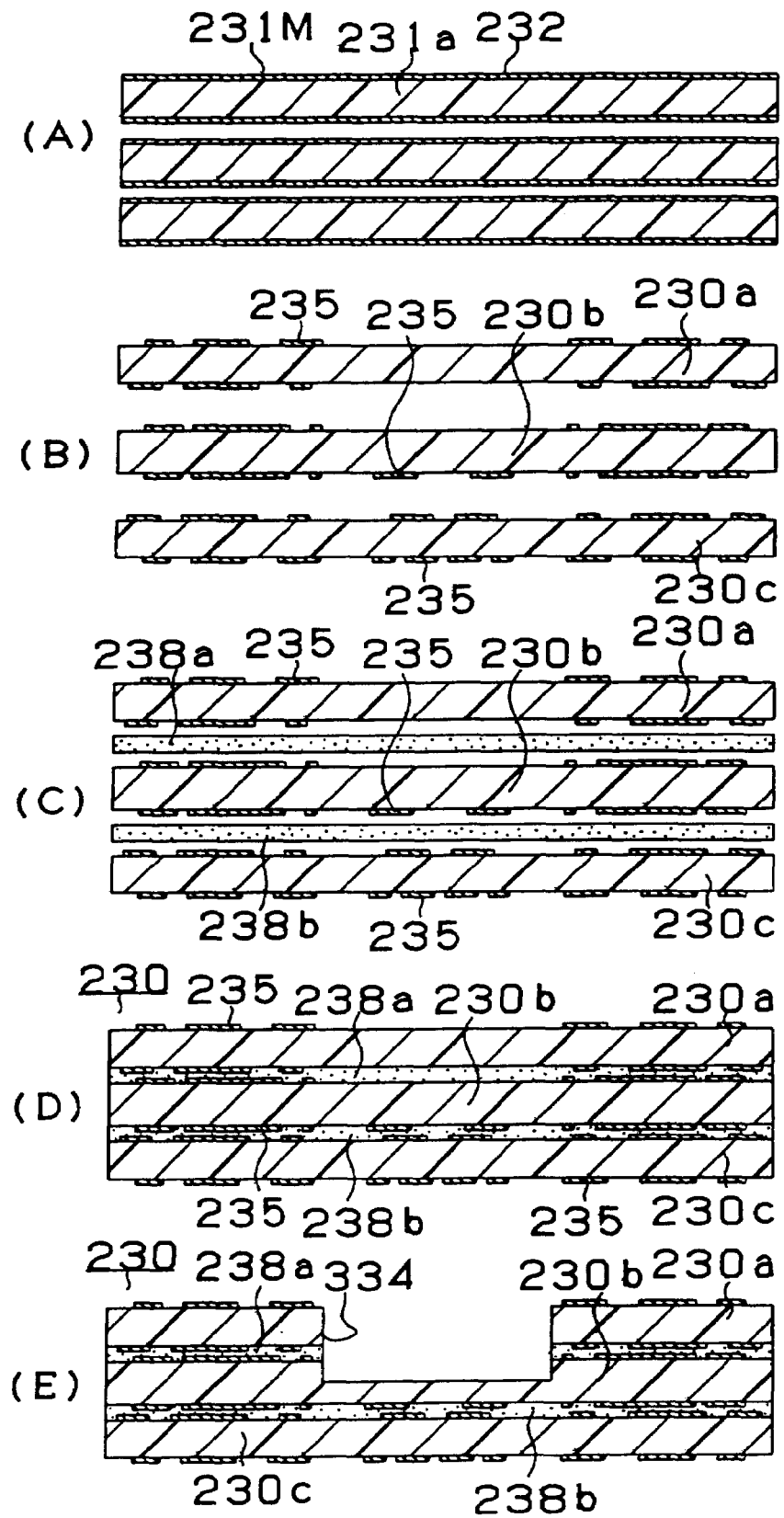
FIG. 17 is a view showing a process for manufacturing a printed circuit board according to the second embodiment of the present invention.
Figure 18:
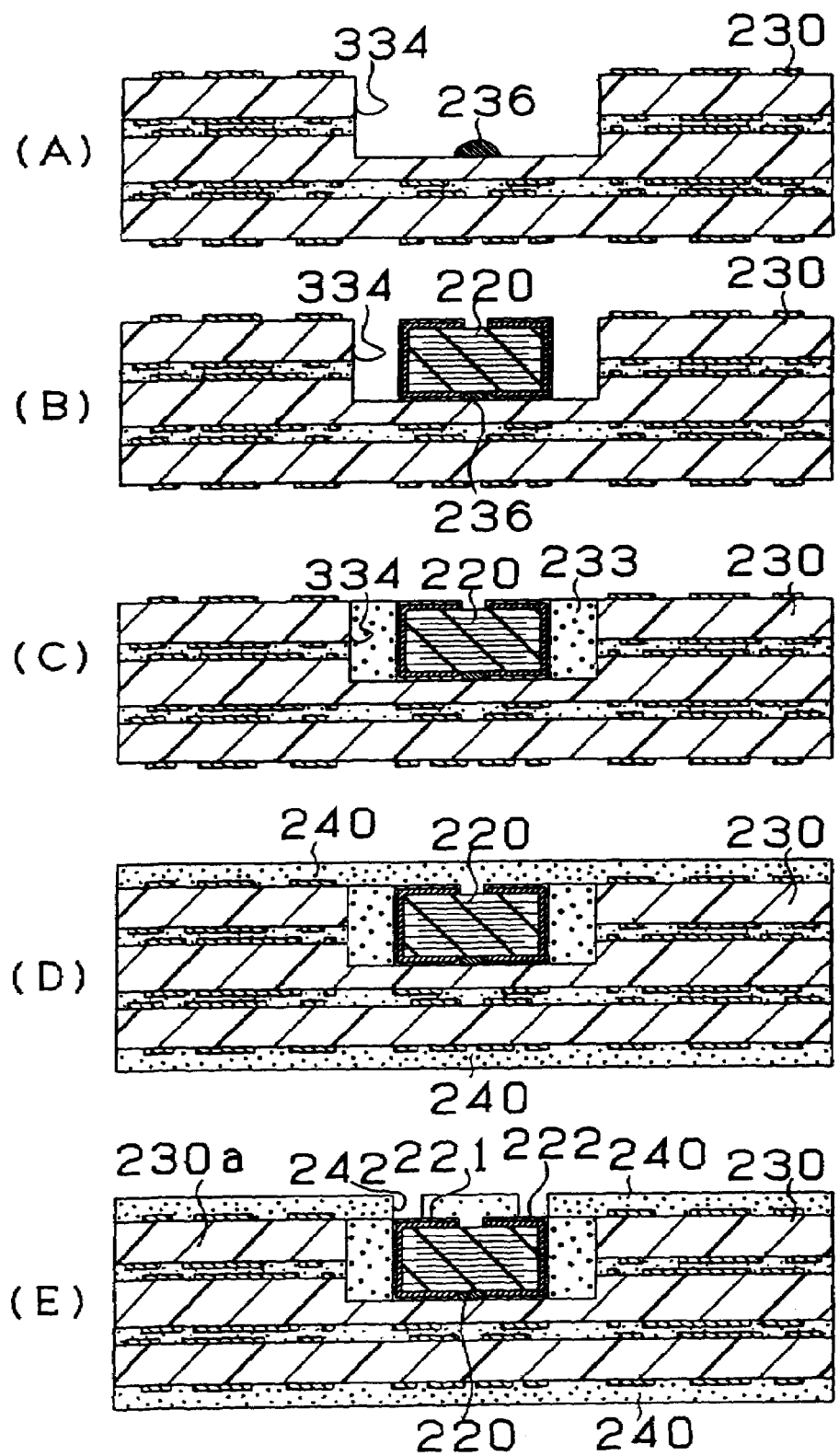
FIG. 18 is a view showing a process for manufacturing the printed circuit board according to the second embodiment of the present invention.

Next, a method of manufacturing the printed circuit board described above with reference to FIG. 19 will be described with reference to FIGS. 17 to 19.

(1) A copper-clad laminated plate 231M having copper foils 232 laminated on the both sides of resin substrates 231a each having a core having a thickness of 0.3 mm and made of glass cloth or the like which a BT (Bismaleimide-Triazine) resin is impregnated into and hardened in, is employed as a starting material (FIG. 17(A)). The copper foils 232 of the copper-clad laminated plate 231M are etched into a pattern fashion, thereby forming the first, second and third resin substrates 230a, 230b and 230c each having the conductor circuits 235 provided on the both sides thereof (FIG. 17(B)). The second resin substrate 230b is superposed on the third resin substrate 230c through the bonding resin layer 238b having a core made of glass cloth or the like and impregnated with an epoxy resin. Likewise, the first resin substrate 230a is superposed on the second resin substrate 230b through the bonding resin layer 238a (FIG. 17(C)).

It is noted that a substrate made of ceramic or AlN cannot be used as the core substrate. This is because such a substrate has poor workability for the outside shape thereof, sometimes cannot contain a capacitor and has gaps even if filled with a resin.

(2) The superposed substrates are pressurized using a thermal press, thereby integrating the first, second and third resin insulating substrates 230a, 230b and 230c in a multi-layer manner and forming the core substrate 230 (FIG. 17(D)). First, by pressuring the substrates, the epoxy resin (insulating resin) of the bonding resin layers 238a and 238b is pushed outside and the epoxy resin is made hermetic contact with the first, second and third resin substrates 230a, 230b and 230c. Further, since the substrates are pressurized and, at the same time, heated, the epoxy resin is hardened and the first resin substrate 230a, the second resin substrate 230b and the third resin substrate 230c are fixedly bonded to one another by interposing the bonding resin layers 238a and 238b as bonding plates.

(3) Next, a concave portion 334 for containing the chip capacitor 220 is formed in the core substrate 230 by spot facing (FIG. 17(E)). While the concave portion for containing the capacitor is provided by spot facing in this embodiment, a core substrate provided with a container section can be formed by overlaying an insulating resin substrate provided with an opening on an insulating resin substrate without an opening.

(4) Then, using a printer, a thermosetting or UV hardening bonding material 236 is applied onto the base of the concave portion 334 (FIG. 18(A)). Alternatively, potting may be conducted instead of the application of the bonding material.

Next, the chip capacitor 220 is mounted on the bonding material 236 (FIG. 18(B)). Either one or a plurality of chip capacitors 220 may be employed; however, if a plurality of chip capacitors 220 are employed, the high integration of capacitors can be realized.

(5) Thereafter, a thermosetting resin is filled in the concave portion 334, heated and hardened to thereby form a resin layer 233 (FIG. 18(C)). As the thermosetting resin, an epoxy resin, a phenol resin, a polyimide resin and a triazine resin are preferable. Consequently, the chip capacitor 220 within the concave portion 334 is fixed and the gap between the chip capacitor 220 and the wall surface of the concave portion 334 is filled with the resin.

(6) Thermosetting epoxy resin sheets to be described later are laminated by vacuum pressing onto the substrate 230 which has been subjected to the above-stated steps, at a pressure of 5 kg/cm$^2$ while raising temperature to 50 to 150° C. to thereby provide interlayer resin insulating layers 240 (FIG. 18(D). The degree of vacuum during vacuum pressing is 10 mmHg.

Later steps are the same as those of (7) to (9) in the first embodiment stated above, which description will not be, therefore, given herein.

Next, description will be given to the mounting of the IC chip 290 on the printed circuit board 210 completed through the above-stated steps and to the attachment of the printed circuit board 210 to the daughter board 295 with reference to FIG. 20. The IC chip 290 is mounted on the printed circuit board 210 thus completed so that the solder pads 292E, 292P and 292S of the IC chip 290 correspond to the solder bumps 276U of the printed circuit board 210 and a reflow process is performed, thereby attaching the IC chip 290 to the printed circuit board 210. Likewise, a reflow process is performed so that the pads 294E, 294P and 294S of the daughter board 295 correspond to the solder bumps 276D of the printed circuit board 210, thereby attaching the printed circuit board 210 to the daughter board 295.

The thermosetting epoxy resin sheets forming the above-stated interlayer resin insulating layers 240 and 340 each contain a refractory resin, soluble particles, a hardening agent and other components, each of which is the same as that in the first embodiment already described above and will not be described herein.

First Modification of Second Embodiment

Figure 23:
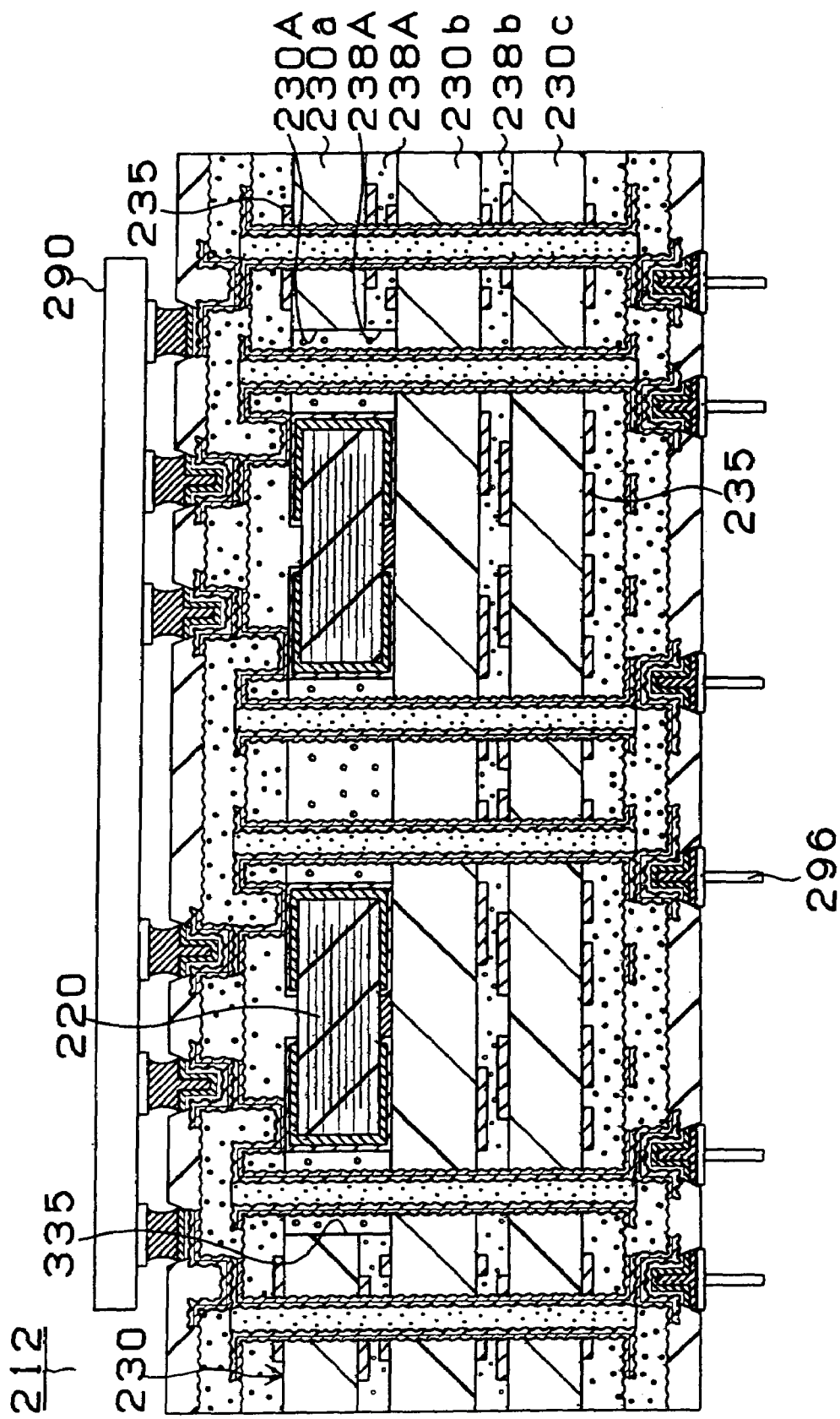
FIG. 23 is a cross-sectional view showing a state in which an IC chip is mounted on the printed circuit board according to the second embodiment of the present invention.

Next, a printed circuit board 212 according to the first modification of the second embodiment of the present invention will be described with reference to FIG. 23. In the second embodiment stated above, a BGA (ball grid array) is provided. The printed circuit board in the first modification of the second embodiment is constituted into a PGA system for establishing connection through conductive connection pins 296 as shown in FIG. 23.

Further, in the second embodiment stated above, the concave portion 334 for containing the chip capacitor 220 is provided in the core substrate 230 by spot facing to allow the chip capacitor 220 to be contained in the concave portion 334. In the first modification of the second embodiment, the first resin substrate 230a provided with through holes 230A, the second and third resin substrates 230b and 230c which are not provided with through holes are bonded to one another through bonding resin layers (bonding plates) 238a and 238b, thereby forming a core substrate 230 provided with a concave portion 335 containing chip capacitors 220 to allow a plurality of chip capacitors 220 to be contained in the concave portion 335.

Figure 21:
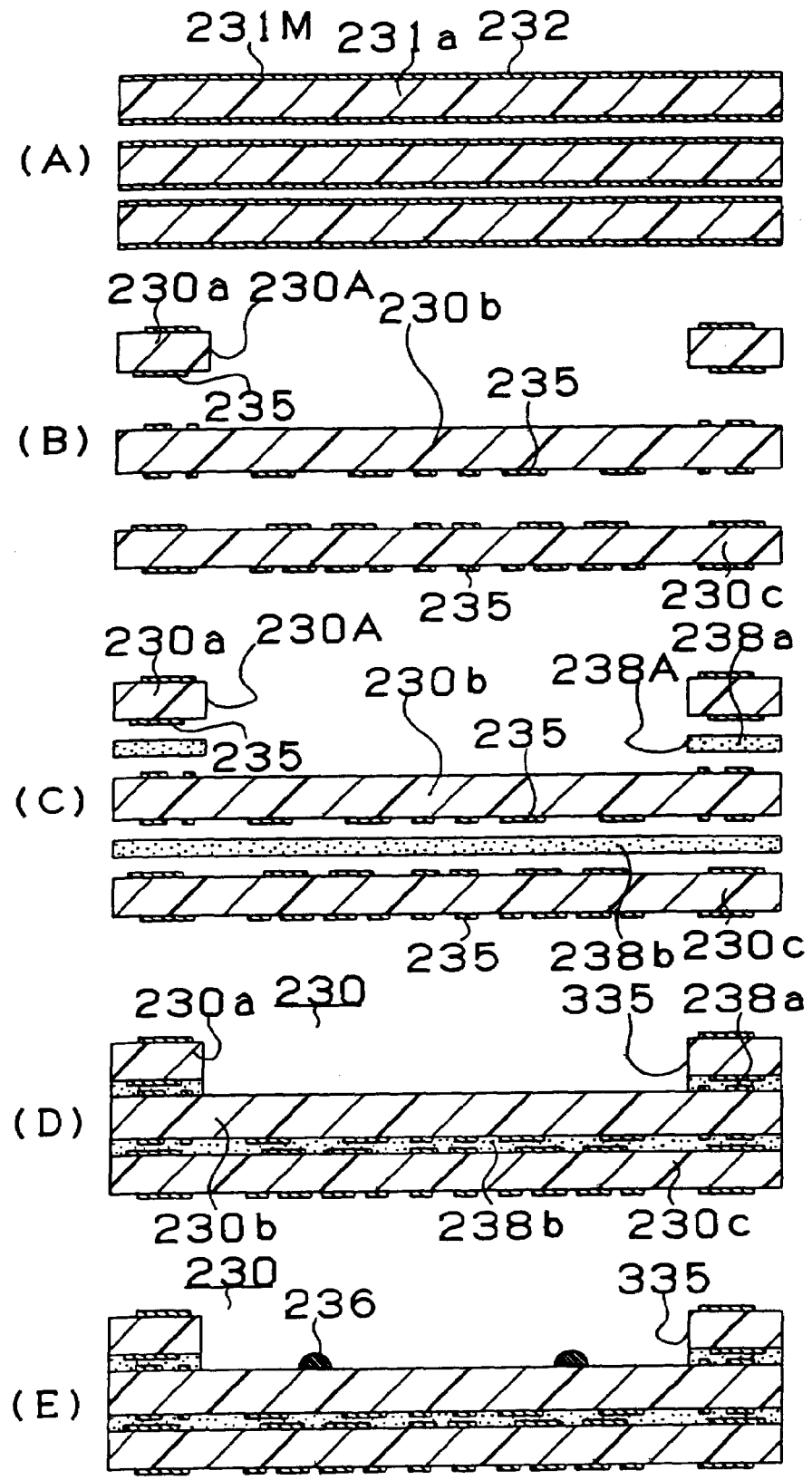
FIG. 21 is a view showing a process for manufacturing the printed circuit board according to the second embodiment of the present invention.

A process of manufacturing the printed circuit board according to the first modification of the second embodiment of the present invention will be described hereinafter with reference to FIGS. 21 and 22.

(1) A copper-clad laminated plate 231M having copper foils 232 laminated on the both sides of resin substrates 231a each having a core having a thickness of 0.3 mm and made of glass cloth or the like which a BT (Bismaleimide-Triazine) resin is impregnated into and hardened in, is employed as a starting material (FIG. 21(A)). The copper foils 232 of the copper-clad laminated plate 231M are etched into a pattern fashion, thereby forming the second and third resin substrates 230b and 230c each having the conductor circuits 235 provided on the both sides thereof. Also, the copper foils 232 are etched into a pattern fashion and a through hole 230A is formed, thereby forming the first resin substrate 230a having conductor circuits 235 (FIG. 21(B)). The second resin substrate 230b is superposed on the third resin substrate 230c through the bonding resin layer (bonding plate) 238b having a core made of glass cloth or the like and impregnated with an epoxy resin. Likewise, the first resin substrate 230a having the through hole 230A formed therein is superposed on the second resin substrate 230b through the bonding resin layer (bonding plate) 238a having the through hole 238A formed therein (FIG. 21(C)).

(2) The superposed substrates are pressurized using a thermal press, thereby integrating the first, second and third resin insulating substrates 230a, 230b and 230c in a multi-layer manner and forming the core substrate 230 provided with a concave portion 335 for containing chip capacitors 220 (FIG. 21(D)). First, by pressuring the substrates, the epoxy resin (insulating resin) of the bonding resin layers 238a and 238b is pushed outside and the epoxy resin is made hermetic contact with the first, second and third resin substrates 230a, 230b and 230c. Further, since the substrates are pressurized and, at the same time, heated, the first resin substrate 230a, the second resin substrate 230b and the third resin substrate 230c are fixedly bonded to one another by interposing the bonding resin layers 238a and 238b as bonding plates.

(3) Then, using a printer, thermosetting or UV hardening bonding materials 236 are applied onto the base of the concave portion 335 (FIG. 21(E)). Alternatively, potting may be conducted instead of the application of the bonding materials.

Figure 22:
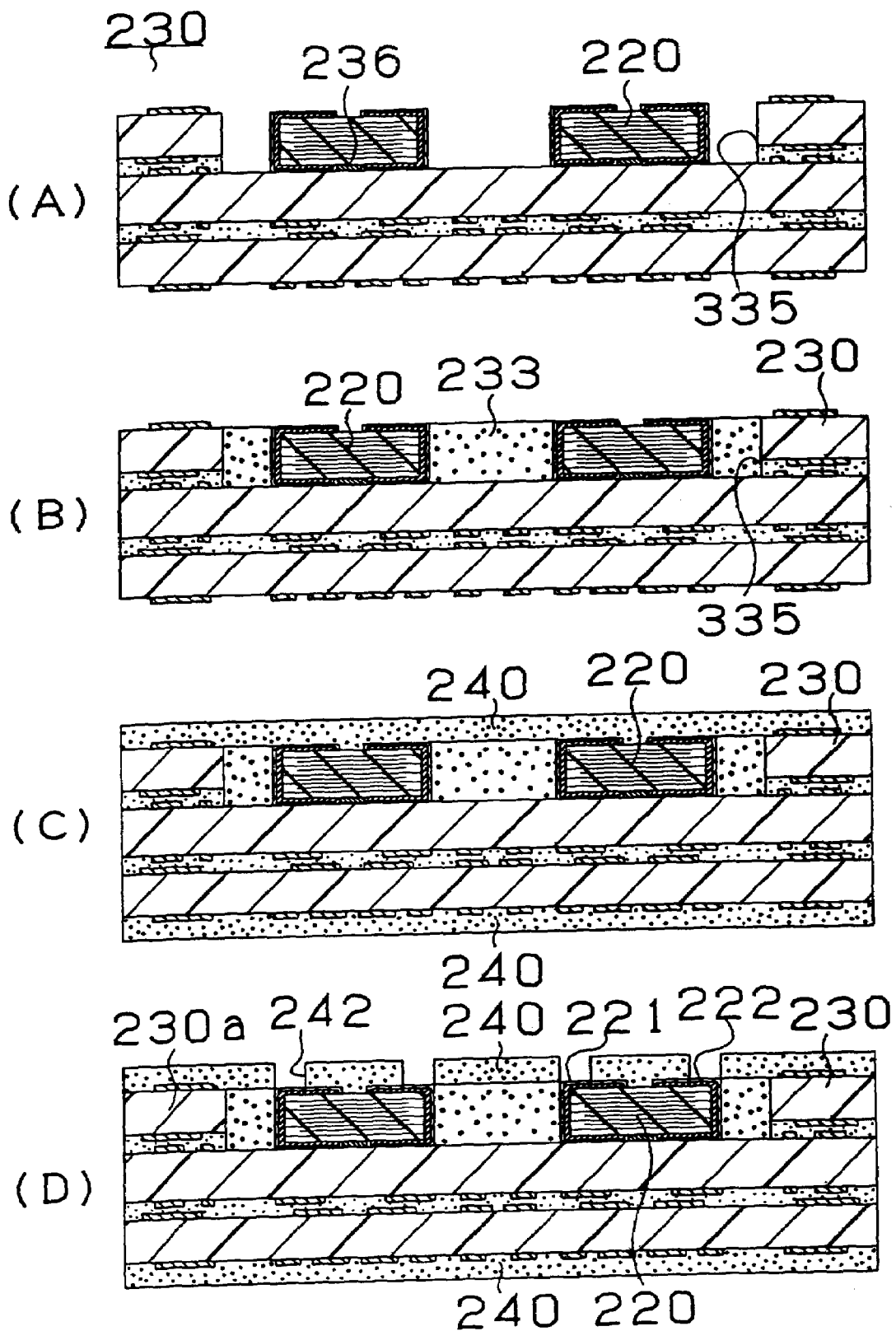
FIG. 22 is a view showing a process for manufacturing the printed circuit board according to the second embodiment of the present invention.

(4) Next, a plurality of chip capacitors 220 are mounted on the bonding material 236 (FIG. 22). By containing a plurality of chip capacitors 220 in the core substrate, the high integration of capacitors can be realized.

(5) Thereafter, a thermosetting resin is filled between the chip capacitors 220 in the concave portion 335, heated and hardened to thereby form a resin layer 233 (FIG. 22(B)). As the thermosetting resin, an epoxy resin, a phenol resin, a polyimide resin and a triazine resin are preferable. Consequently, the chip capacitors 220 within the concave portion 335 is fixed and the gaps between the chip capacitors 220 and the wall surface of the concave portion 335 are filled with the resin.

(6) Thermosetting epoxy resin sheets are laminated by vacuum pressing onto the substrate 230 which has been subjected to the above-stated steps, at a pressure of 5 kg/cm$^2$ while raising temperature to 50 to 150° C. to thereby provide interlayer resin insulating layers 240 made of an epoxy resin (FIG. 22(C)).

(7) Next, openings 42 for via holes reaching the first terminals 221 and the second terminals 222 of the chip capacitors 220 are formed in the interlayer resin insulating layer 240 at the resin substrate 230a side by applying laser (FIG. 22(D)).

Later steps are the same as those of (8) to (21) in the first embodiment stated above, which description will not be, therefore, given herein.

First Other Example of First Modification of Second Embodiment

Figure 24:
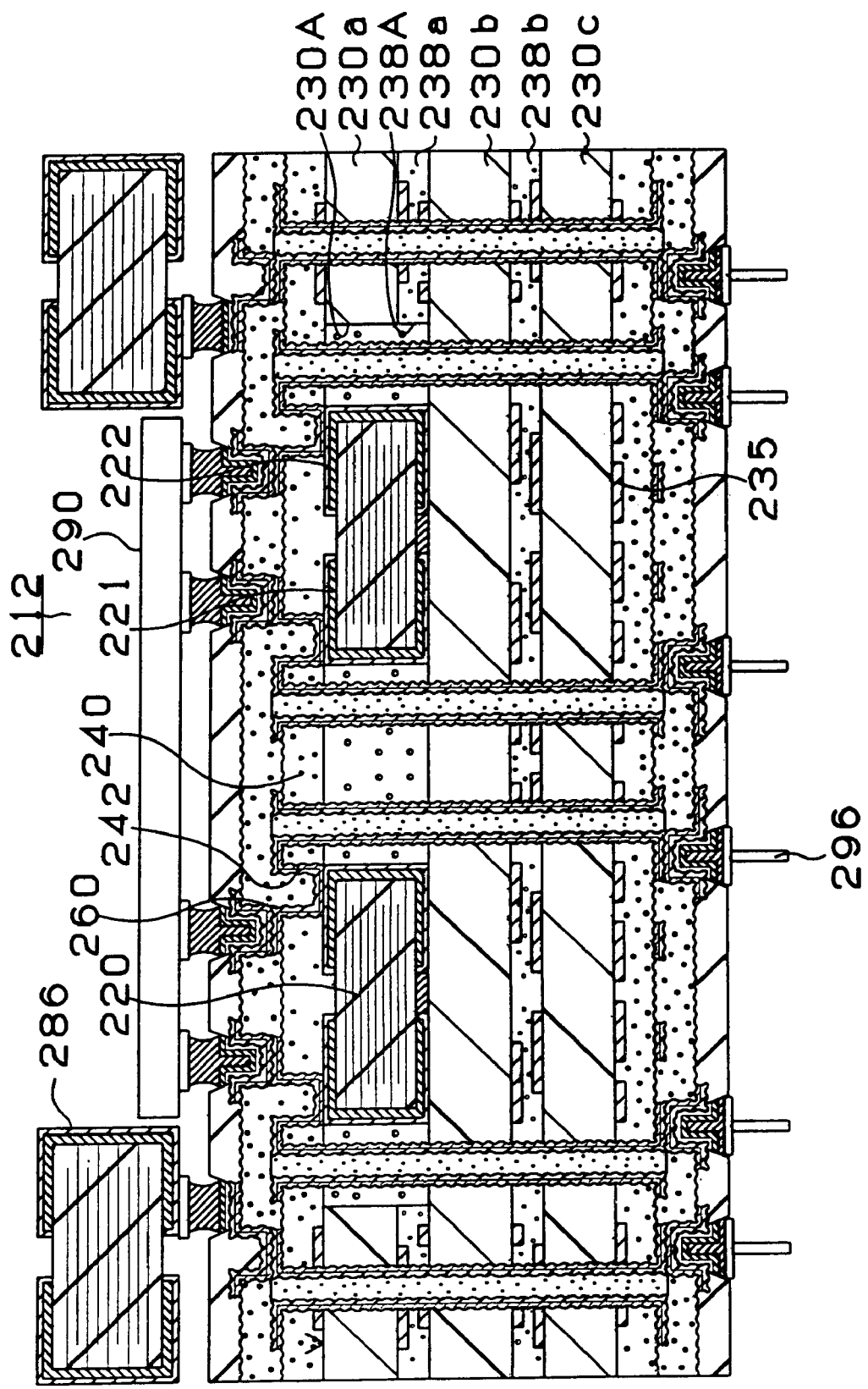
FIG. 24 is a cross-sectional view showing a state in which an IC chip is mounted on a printed circuit board according to a modification of the second embodiment of the present invention.

Next, a printed circuit board according to the first other example of the first modification of the second embodiment of the present invention will be described with reference to FIG. 24. The printed circuit board in the first other example is almost the same as that in the first modification of the second embodiment stated above. However, only the chip capacitors 220 contained in the core substrate 230 are provided in the first modification of the second embodiment, whereas mass storage chip capacitors 286 are mounted on the front and reverse sides of a core substrate in the first other example.

An IC chip momentarily consumes high power and performs complex arithmetic operation. Herein this first modification, to supply high power to the IC chip, chip capacitors 220 and chip capacitors 286 for power supply are provided. The advantage derived from these chip capacitors will be described with reference to FIG. 12.

FIG. 12 is a graph with a vertical axis indicating voltage supplied to the IC chip and a horizontal axis indicating time.

In FIG. 12, two-dot chain line C denotes the voltage variation of a printed circuit board which is not provided with power supply capacitors. If power supply capacitors are not provided, voltage attenuates greatly. A broken line A denotes the voltage variation of a printed circuit board having chip capacitors mounted on the surfaces thereof. Compared with the two-dot chain line C, voltage does not drop greatly. However, since loop length is larger, rate-controlled power supply cannot be conducted sufficiently. Namely, at the start of the supply of power, voltage falls. Further, a two-dot chain line B denotes the voltage drop of a printed circuit board including the chip capacitors described above with reference to FIG. 23. In this case, loop length can be shortened; however, mass storage chip capacitors can not be contained in a core substrate 230 and voltage, therefore, varies. Here, a solid line E denotes the voltage variation of the printed circuit board in the modification which printed circuit board has the chip capacitors 220 mounted in the core substrate and the mass storage chip capacitors 286 mounted on the surfaces thereof. Voltage variation is minimized by providing the chip capacitors 220 and the mass storage chip capacitors 286 (having relatively high inductance) in the vicinity of the IC chip.

Furthermore, as shown in FIG. 13(A), in the chip capacitor 220 of the printed circuit board in the first other example of the second embodiment, after the coating layer (not shown) of the first and second electrodes 221 and 222 are completely separated, the first and second electrodes 221 and 222 are coated with copper plated films 29. The first and second electrodes 221 and 222 each coated with the copper plated film 29 are electrically connected to each other by a via hole 260 made of a copper plated material. Here, the electrodes 221 and 222 of the chip capacitor are made by metalization and have irregular portions on the surfaces thereof. Due to this, if the substrate is used while exposing the metal layers, resin may sometimes remain on the irregular portions in the step of providing non-penetrating holes 242 in the connection layer 240. At this time, the resin residue causes connection defects between the first, second electrodes 221 and 222 and the via holes 260. In the first other example, by contrast, since the surfaces of the first and second electrodes 221 and 222 are smoothed by the copper plated films 29, no resin remains when providing non-penetrating holes 42 in the coated interlayer resin insulating layer 240 on the electrodes and the reliability of the connection between the electrodes 221, 222 and the via holes 260 when forming the via holes 260 can be enhanced.

Furthermore, the via holes 260 are formed by plating in the electrodes 221 and 222 having the copper plated films 29 formed thereon, respectively, the connection characteristics between the electrodes 221, 222 and the via holes 260 is good and disconnection does not occur between the electrodes 221, 222 and the via holes 260 even if a heat cycle test is conducted. Besides, no migration occurs and no disadvantages are derived in the connection portions of the via holes of the capacitors.

The copper plated films 29 are provided after the nickel/tin layer (coating layer) coated on the surface of each metal layer 26 in a phase of manufacturing chip capacitors is separated in a phase of mounting the chip capacitors on the printed circuit board. Alternatively, the copper plated films 29 can be directly coated on the metal layers 26 in the phase of manufacturing the chip capacitors 220. Namely, in the first other example, as in the case of the second embodiment, after openings reaching the copper plated films 29 of the electrodes are provided by applying laser, a de-smear process is performed to thereby form via holes by copper plating. Accordingly, even if an oxide film is formed on the surface of the copper plated film 29, the oxide film can be removed by the laser and de-smear processes, thereby making it possible to establish connection appropriately.

Further, rough layers 23α are provided on the surfaces of a dielectric 23 of the chip capacitors 220 which dielectric is made of ceramic. Due to this, the adhesiveness between the chip capacitors 220 made of ceramic and the interlayer resin insulating layer 240 made of a resin is high and the interlayer resin insulating layer 240 is not separated on the interface therebetween even if a heat cycle test is conducted. The rough layers 23α can be formed by polishing the surfaces of the chip capacitors 220 after sintering them or by roughing the surfaces before sintering them. In the first other example, the surfaces of the capacitors are roughed and the adhesiveness between the capacitors and the resin is thereby enhanced. Alternatively, a silane coupling process can be conducted to the surfaces of the capacitors.

As shown in FIG. 13(B), it is also possible to employ the first and second electrodes 21 and 22 of the first and second capacitors 220 while removing part of the coats 28 of the electrodes 21 and 22. This is because connection characteristics can be enhanced by exposing the first and second electrodes 221 and 222.

Second Modification of Second Embodiment

Next, the constitution of a printed circuit board according to the second modification of the second embodiment will be described with reference to FIG. 14.

The printed circuit board in the second modification is almost the same in constitution as the printed circuit board in the first embodiment stated above. They, however, differ in chip capacitors 20 contained in the core substrate 30. FIG. 14 is a plan view of chip capacitors. FIG. 14(A) shows a chip capacitor before being cut for providing a plurality of chip capacitors. In FIG. 14(A), a dashed line denotes a cut line. As shown in FIG. 14(B), in the printed circuit board in the first embodiment stated above, the first electrodes 21 and the second electrodes 22 are provided on the edges of the chip capacitor. FIG. 14(C) shows a chip capacitor before being cut for providing a plurality of chip capacitors in the second modification. In FIG. 14(C), a dashed line denotes a cut line. In the printed circuit board in the second modification, as shown in the plan view of FIG. 14(D), first electrodes 21 and second electrodes 22 are provided inside of the edges of the chip capacitor.

In the printed circuit board in the second modification, the chip capacitors 20 each having electrodes formed inside of the outer edges thereof are employed, so that mass storage chip capacitors can be employed.

Next, a printed circuit board according to the first other example of the second modification will be described with reference to FIG. 15.

FIG. 15 is a plan view of a chip capacitor 20 contained in the core substrate of the printed circuit board according to the first other example. In the first embodiment stated above, a plurality of small storage chip capacitors are contained in the core substrate. In the first other example, by contrast, a large, mass storage chip capacitor 20 is contained in the core substrate. The chip capacitor 20 consists of the first electrodes 21, the second electrodes 22, a dielectric 23, first conductive films 24 connected to the first electrodes 21, second conductive films 25 connected to the second electrodes 22, and electrodes 27 which are not connected to the first and second conductive films 24 and 25, for the connection of the upper and lower surfaces of the chip capacitor. The IC chip and the daughter board are connected to each other through the electrodes 27.

Since the large chip capacitor 20 is employed in the printed circuit board in the first modification, it is possible to employ a mass storage chip capacitor. Further, since the large chip capacitor 20 is employed, the printed circuit board does not warp even if a heat cycle is performed repeatedly.

Next, a printed circuit board according to the second other example of the second modification will be described with reference to FIG. 16. FIG. 16(A) shows a chip capacitor before being cut for providing a plurality of chip capacitors. In FIG. 16(A), a dashed line denotes an ordinary cut line. FIG. 16(B) is a plan view of the chip capacitors. As shown in FIG. 16(B), a plurality of (or in FIG. 16(B), three) chip capacitors for providing multiple capacitors are coupled to one another and employed as a large capacitor as a whole.

In the second other example, since the large chip capacitor 20 is employed, it is possible to employ a mass storage chip capacitor. Further, since the large chip capacitor is employed, the printed circuit board does not warp even if a heat cycle is performed repeatedly.

In the embodiment stated above, the chip capacitors are built in the printed circuit board. Alternatively, plate-like capacitors each constituted by providing a conductive film on a ceramic plate may be employed instead of the chip capacitors.

As stated above, according to the second embodiment, it is possible to contain the capacitors in the core substrate and to shorten the distance between the IC chip and the capacitors, thereby reducing the loop inductance of the printed circuit board. Further, since the core substrate is formed by providing a plurality of resin substrates having conductor circuits formed thereon in a multilayer manner, the wiring density within the core substrate is increased and the number of interlayer resin insulating layers can be reduced.

Moreover, since the resin is filled between the core substrate and the capacitors, a stress resulting from the capacitors or the like can be reduced even if it occurs and no migration occurs. Due to this, there is no fear that the electrodes of the capacitors are separated from the connection sections of the via holes and dissolved. Thus, it is possible to maintain desired performance even if a reliability test is executed.

In addition, even if the capacitors are coated with copper, it is possible to prevent the occurrence of migration.

Third Embodiment

Figure 30:
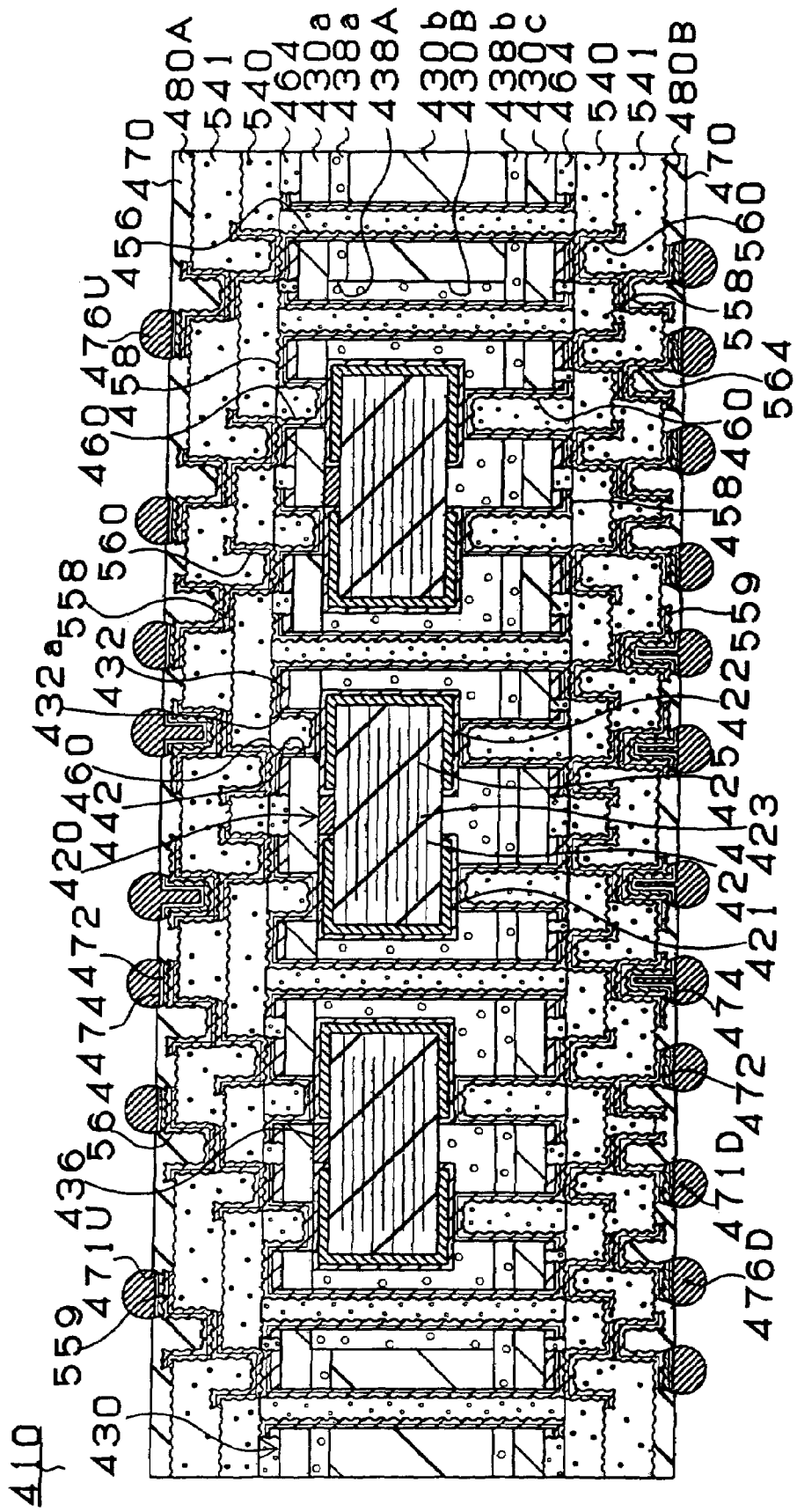
FIG. 30 is a cross-sectional view of the printed circuit board according to the third embodiment of the present invention.
Figure 31:
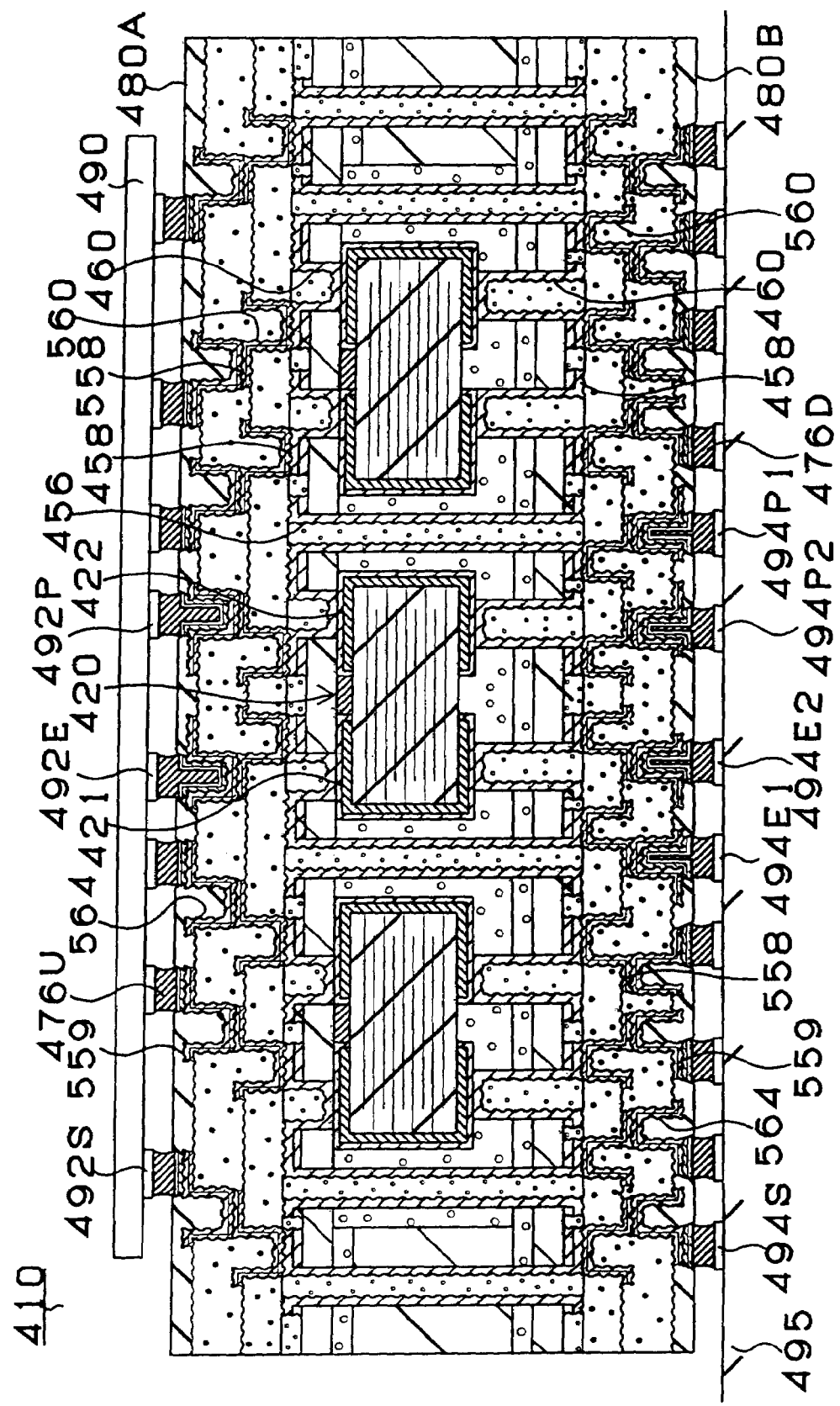
FIG. 31 is a cross-sectional view showing a state in which an IC chip is mounted on the printed circuit board shown in FIG. 30 and that the printed circuit board is attached to a daughter board.

The constitution of a printed circuit board according to the third embodiment of the present invention will be described hereinafter with reference to FIGS. 30 and 31. FIG. 30 is a cross-sectional view of a printed circuit board 410. FIG. 31 shows a state in which an IC chip 490 is mounted on the printed circuit board 410 shown in FIG. 30 and that the printed circuit board 410 is attached to a daughter board 495.

As shown in FIG. 30, the printed circuit board 410 consists of a core substrate 430 containing a plurality of chip capacitors 420, and buildup wiring layers 480A and 480B. Each of the buildup wiring layers 480A and 480B consists of interlayer resin insulating layers 540 and 541. Conductor circuits 558 and via holes 560 are formed on the interlayer resin insulating layer 540 of each of the buildup wiring layers 480A and 480B. Conductor circuits 559 and via holes 564 are formed on the interlayer rein insulating layer 541 of each of the buildup wiring layers 480A and 480B. Solder resist layers 470 are formed on the interlayer resin insulating layers 541, respectively. Via holes 460 and conductor circuits 458 to be connected to the chip capacitors 420 are provided on the core substrate 430. The buildup wiring layers 480A and 480B are connected to each other by way of through holes 456 formed in the core substrate 430.

As shown in FIG. 30, each of the chip capacitors 420 consists of the first electrode 421, the second electrode 422 and a dielectric 423 put between the first and second electrodes. A plurality of pairs of first conductive films 424 connected to the first electrode 421 side and second conductive films 425 connected to the second electrode 422 side are arranged on the dielectric 423 to face one another.

As shown in FIG. 31, solder bumps 476U to be connected to the pads 492E, 492P and 492S of the IC chip 490 are provided on the upper buildup wiring layer 480A. Solder bumps 476D to be connected to the pads 494E1, 494E2, 494P1, 494P2 and 494S of the daughter board 495 are provided on the lower buildup wiring layer 480B.

The signal pad 492S of the IC chip 490 is connected to the signal pad 494S of the daughter board 495 through the bump 476U—the conductor circuit 559—the via hole 564—the conductor circuit 558—the via hole 560—the through hole 456—the via hole 560—the conductor circuit 558—the via hole 564—the conductor circuit 559—the bump 476D.

The grounding pad 492E of the IC chip 490 is connected to the first electrodes 421 of the chip capacitors 420 through the bumps 476U—the via holes 564—the conductor circuits 558—the via holes 560—the conductor circuits 458—the via holes 460. The grounding pad 494E1 of the daughter board 495 is connected to the first electrodes 421 of the chip capacitors 420 through the bumps 476D—the via holes 564—the conductor circuits 558—the via holes 560—the through holes 456—the conductor circuits 458—the via holes 460. The grounding pad 494E2 is connected to the first electrodes 421 of the chip capacitors 420 through the bumps 476D—the via holes 564—the conductor circuits 558—the via holes 560—the conductor circuits 458—the via holes 460.

The power supply pad 492P of the IC chip 490 is connected to the second electrodes 422 of the chip capacitors 420 through the bumps 476U—the via holes 564—the conductor circuits 558—the via holes 560—the conductor circuits 458—the via holes 460. The power supply pad 494P1 of the daughter board 495 is connected to the second electrodes 422 of the chip capacitors 420 through the bumps 476D—the via holes 564—the conductor circuits 558—the via holes 560—the through holes 456—the conductor circuits 458—the via holes 460. The power supply pad 494P2 is connected to the first electrodes 422 of the chip capacitors 420 through the bumps 476D—the via holes 564—the conductor circuits 558—the via holes 560—the conductor circuits 458—the via holes 460. In this embodiment, the daughter board 495 side is connected to the first and second electrodes 421 and 422 of the chip capacitors 420 through the through holes 456. It is also possible to connect the daughter board 495 side thereto without employing the through holes.

As shown in FIG. 30, the core substrate 430 in this embodiment consists of the first resin substrate 430a to which the chip capacitors 420 are connected through bonding materials, the second resin substrate 430b connected to the first resin substrate 430a through a bonding resin layer (bonding plate) 438a and the third resin substrate 430c connected to the second resin substrate 430b through a bonding resin layer (bonding plate) 438b. An opening 430B capable of containing the chip capacitors 420 are formed in the second resin substrate 430b.

With this structure, the chip capacitors 420 can be contained in the core substrate 430, so that the distance between the IC chip 490 and each chip capacitor 420 is shortened and the loop inductance of the printed circuit board 410 can be reduced. Further, the core substrate 430 is constituted by providing the first resin substrate 430a, the second resin substrate 430b and the third resin substrate 430c in a multilayer manner, the core substrate 430 can obtain sufficient strength. Moreover, since the core substrate 430 is constituted smoothly by providing the first resin substrate 430a and the third resin substrate 430c on the both sides of the core substrate 430, respectively, it is possible to appropriately form the interlayer resin insulating layers 540, 541, the conductor circuits 558, 559 and the via holes 560 and 564 on the core substrate 430 and the probability of the occurrence of defective printed circuit boards can be decreased.

Furthermore, in this embodiment, the via holes 460 are provided on the both sides of the core substrate 430. This makes it possible to connect the daughter board 495 to each chip capacitors 420 at the shortest distance and high electric power can be supplied momentarily from the daughter board to the IC chip.

Figure 25:
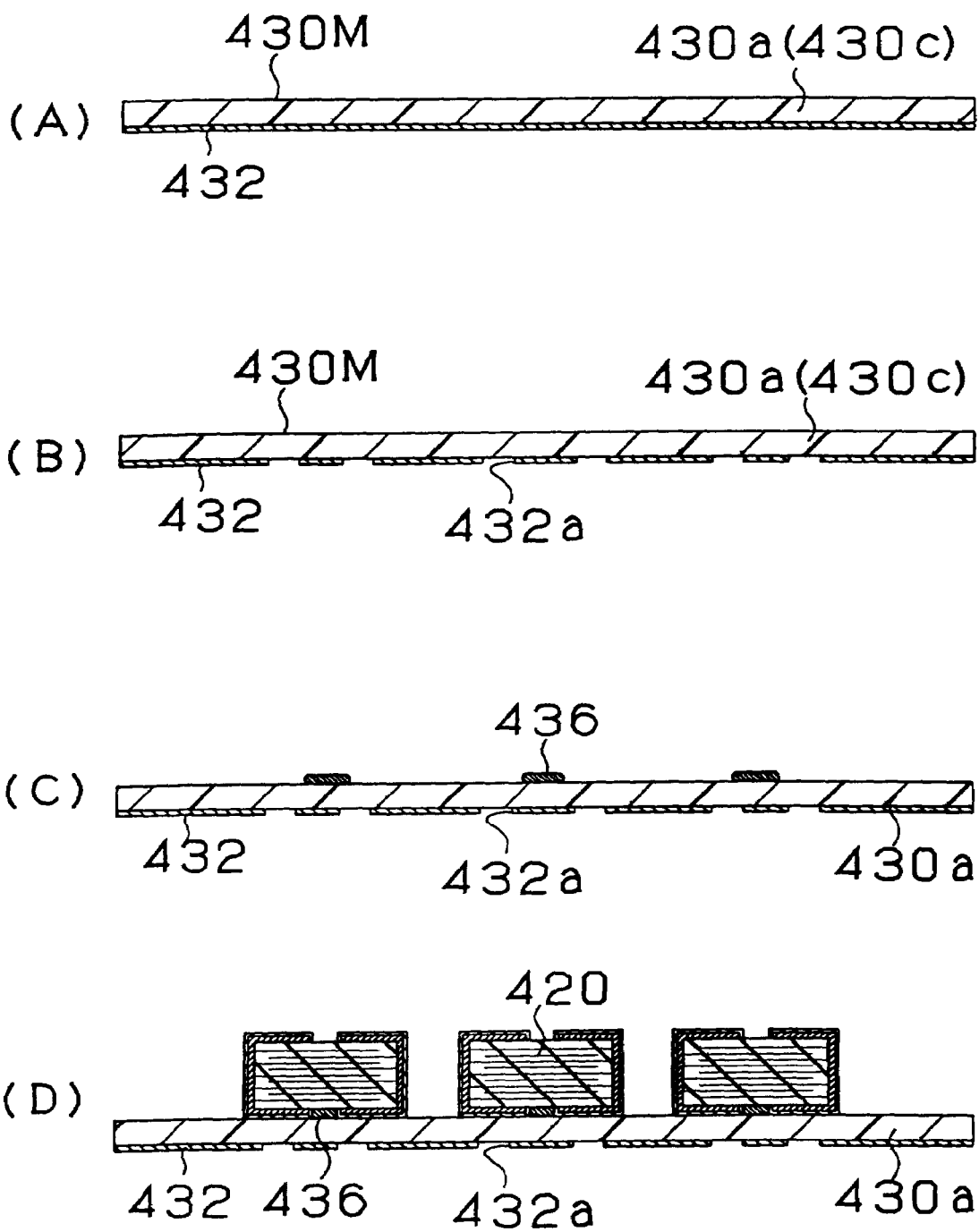
FIG. 25 is a view showing a process for manufacturing a printed circuit board according to the third embodiment of the present invention.
Figure 26:
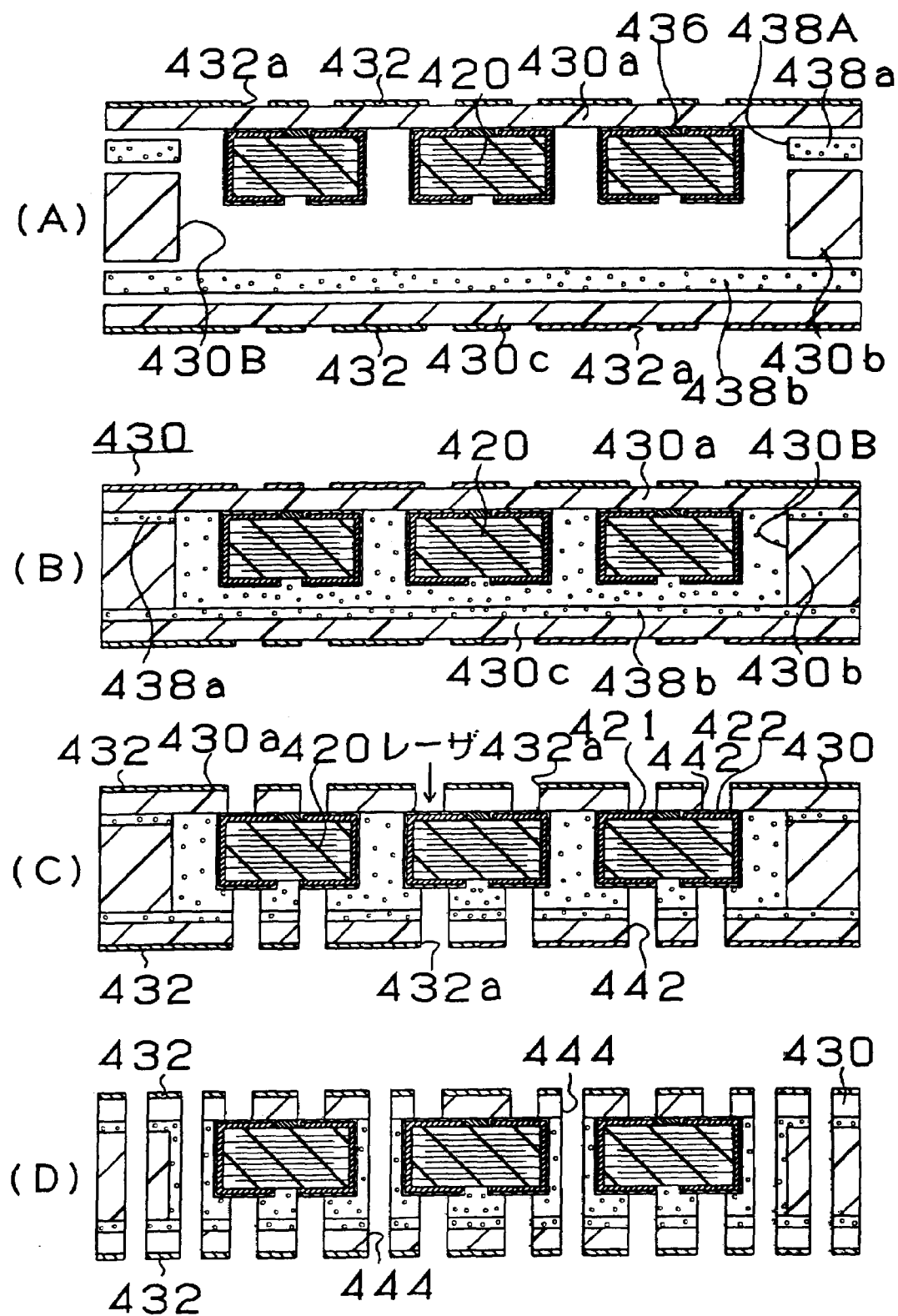
FIG. 26 is a view showing a process for manufacturing the printed circuit board according to the third embodiment of the present invention.
Figure 27:
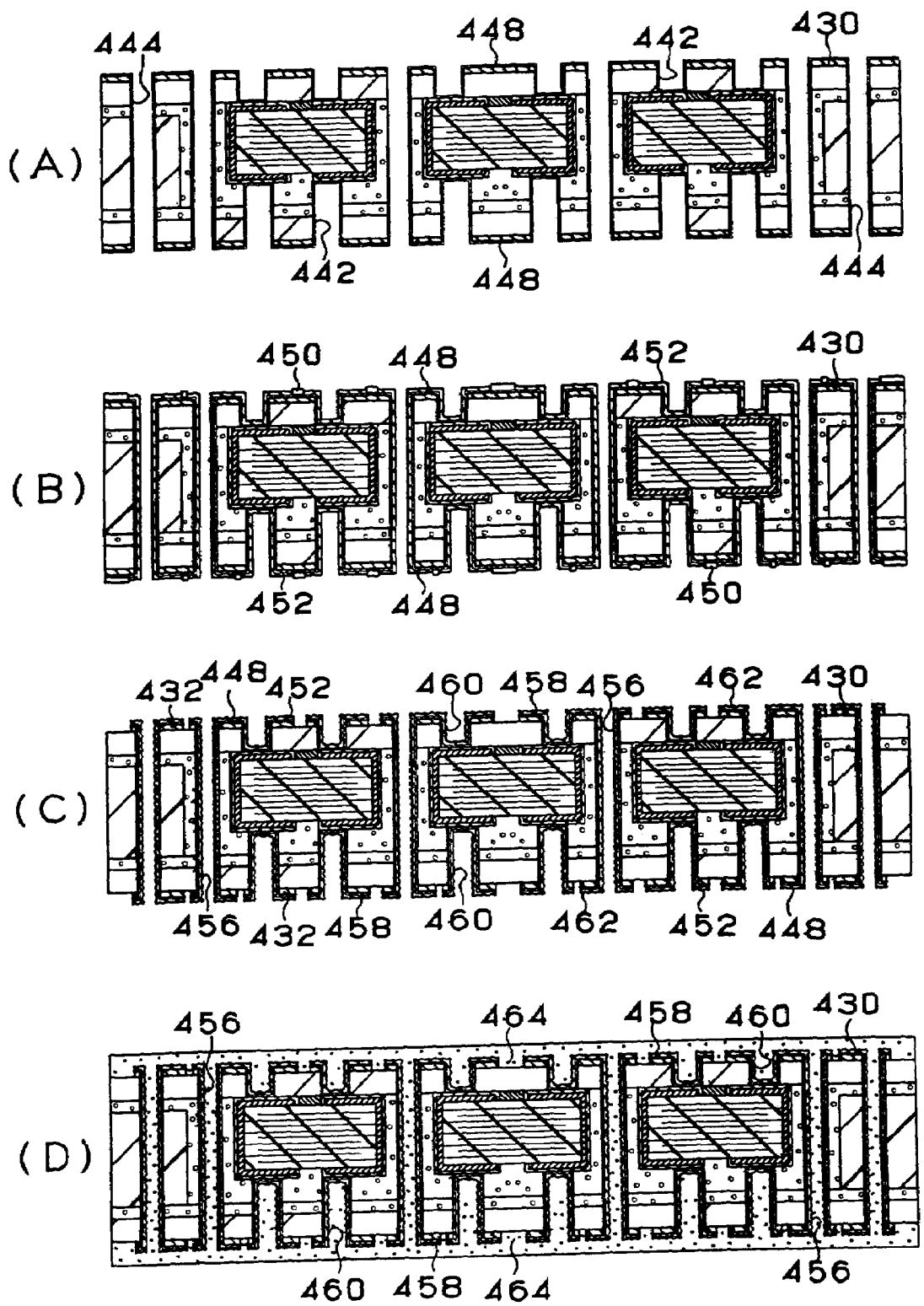
FIG. 27 is a view showing a process for manufacturing the printed circuit board according to the third embodiment of the present invention.
Figure 28:
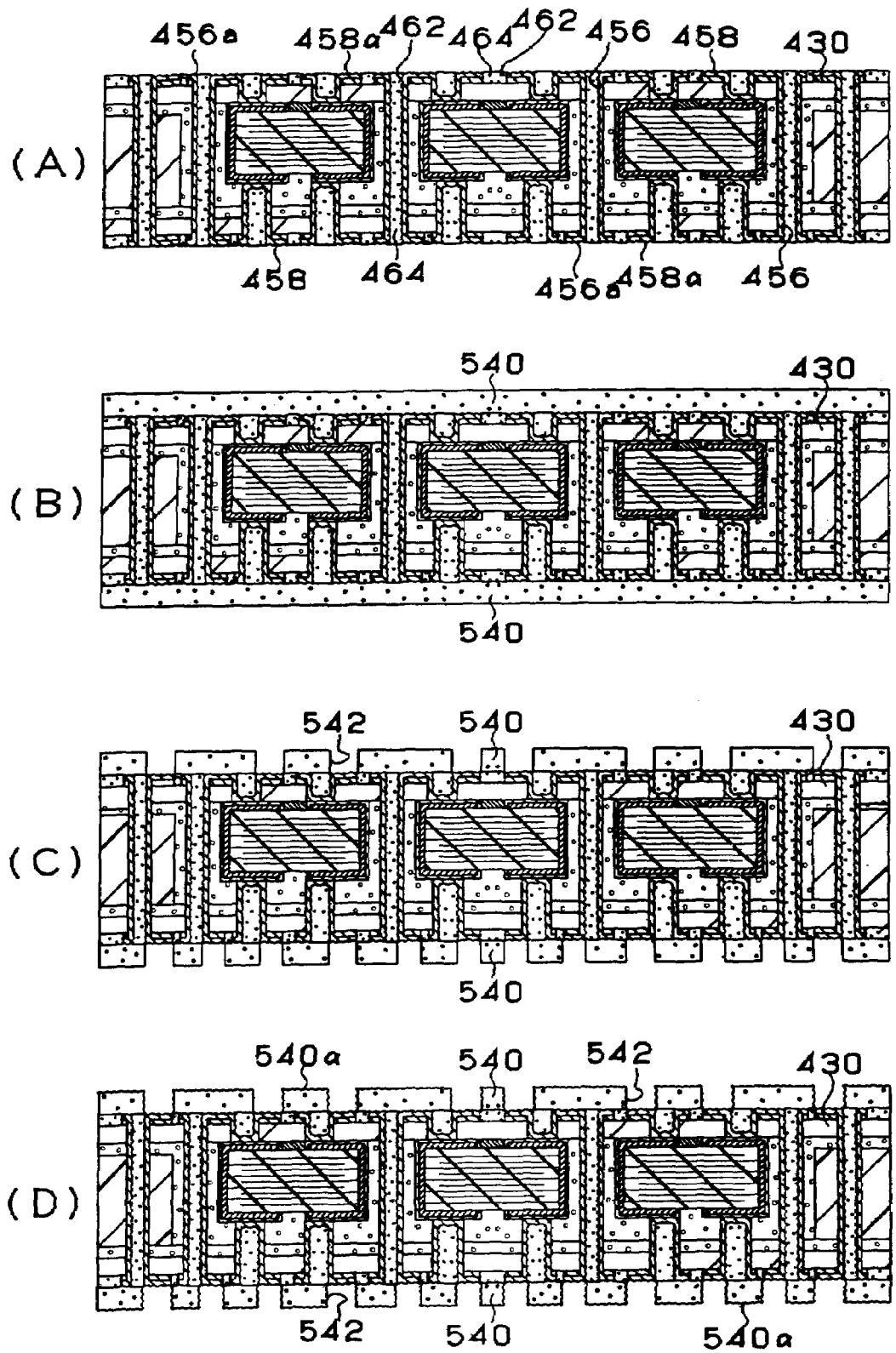
FIG. 28 is a view showing a process for manufacturing the printed circuit board according to the third embodiment of the present invention.
Figure 29:
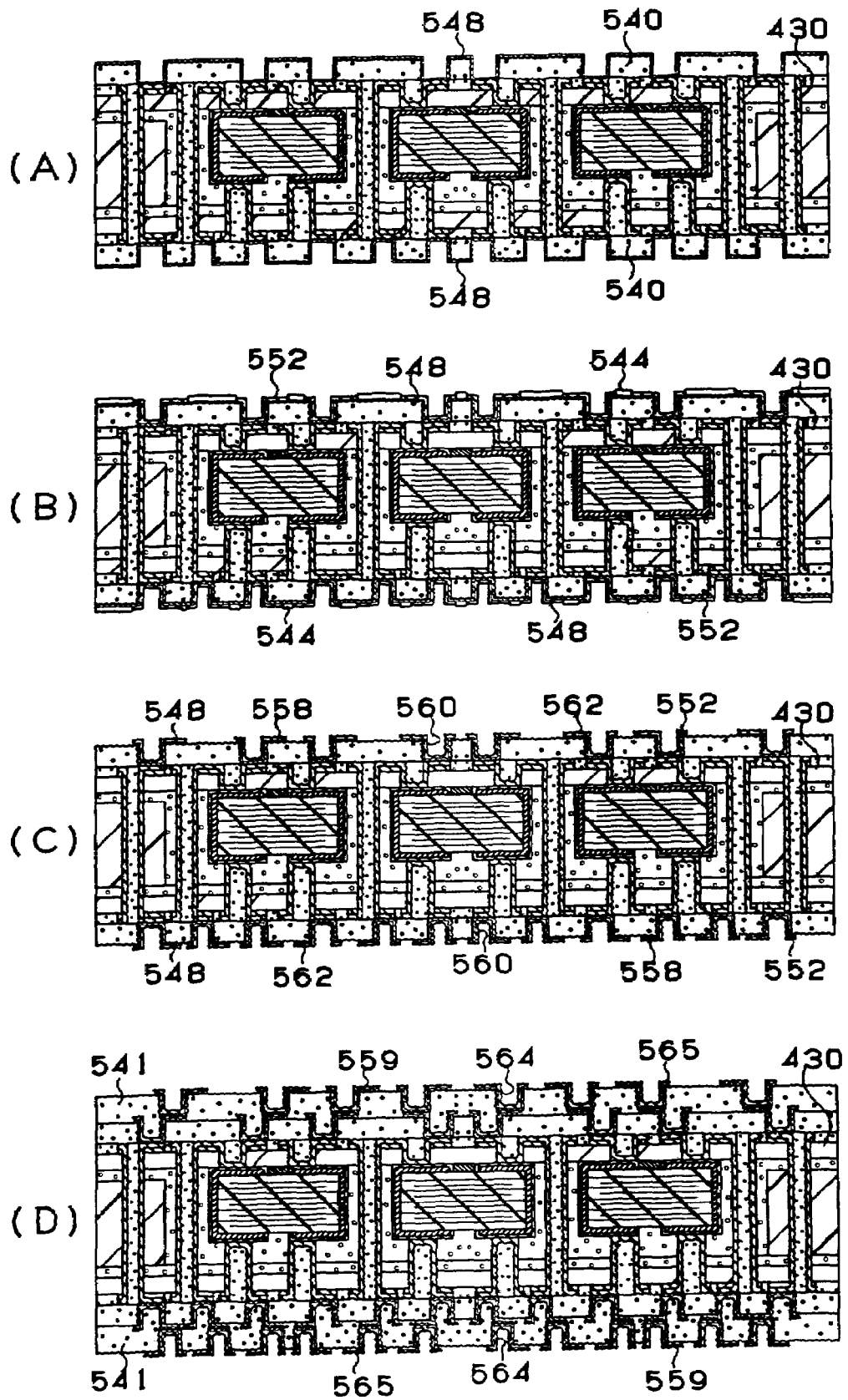
FIG. 29 is a view showing a process for manufacturing the printed circuit board according to the third embodiment of the present invention.

Moreover, in this embodiment, as shown in FIG. 25(D), an insulating bonding agent 436 is interposed between the first resin substrate 430a and each of the chip capacitors 420. Here, the coefficient of the thermal expansion of the bonding agent 436 is set lower than that of the core substrate 430, i.e., set close to that of the chip capacitors 420 made of ceramic. Due to this, even if an internal stress resulting from the difference in the coefficient of thermal expansion among the core substrate, the bonding layers 436 and the chip capacitors 420, occurs in a heat cycle test, cracks, separation and the like less occur to the core substrate, making it possible to attain high reliability. It is also possible to prevent the occurrence of migration.

A method of manufacturing the printed circuit board described above with reference to FIG. 30 will be described with reference to FIGS. 25 to 30.

(1) A one-sided copper-clad laminated plate 430M (first resin substrate 430a or the third resin substrate 430c) having a copper foil 432 laminated on one side of the resin substrate having a core having a thickness of 0.1 mm and made of glass cloth or the like which a BT (Bismaleimide-Triazine) resin is impregnated into and hardened in, is employed as a starting material (FIG. 25(A)).

Next, the copper foil 432 of the copper-clad laminated plate 430M is etched into a pattern, thereby forming openings 432a for forming via holes are formed (FIG. 25(B)).

(2) Using a printer, a thermosetting or UV hardening bonding material 436 is applied onto portions of the first resin substrate 430a on which the copper foil 432 is not laminated (FIG. 25(C)). Instead of the application of the bonding material, potting may be performed.

Next, a plurality of chip capacitors 420 made of ceramic are mounted on the bonding material 436 and bonded to the first resin substrate 430a through the bonding material 436 (FIG. 25(D)). Either one or a plurality of chip capacitors 420 may be provided; however, if a plurality of chip capacitors 420 are employed, the high integration of the capacitors can be realized.

(3) Then, resin layers for bonding (bonding resin layers) 438a and 438b each having a core made of glass cloth or the like and impregnated with an epoxy resin as well as the second resin layer 430b (having a thickness of 0.4 mm) having a core made of glass cloth or the like which a BT resin is impregnated into and hardened in, are prepared. Openings 36A and 430B capable of containing the chip capacitors 420 are formed in the bonding resin layer 438a and the second resin layer 430b, respectively. First, the second resin substrate 430b is mounted on the third resin substrate 430c through the bonding resin layer 438b with the surface of the third resin substrate 430c laminated with the copper foil 432 directed downward. Next, the first resin substrate 430a is inverted and mounted on the second resin substrate 430b through the bonding resin layer 438a. Namely, the first resin substrate 430a is superposed on the second resin substrate 430b so that the chip capacitors 420 connected to the first resin substrate 430a are directed toward the bonding rein layer 438a side and can be contained in the opening 430B formed in the second resin substrate 430b (FIG. 26(A)). By doing so, the chip capacitors 420 can be contained in the core substrate 430 and the printed circuit board having reduced loop inductance can be provided.

It is noted that a substrate made of ceramic or AlN cannot be used as the core substrate. This is because such a substrate has poor workability for the outside shape thereof, sometimes cannot contain capacitors and has gaps even if filled with a resin.

(4) The superposed substrates are pressurized using a thermal press, thereby integrating the first, second and third resin substrates 430a, 430b and 430c in a multilayer manner and forming the core substrate 430 having a plurality of chip capacitors 420 (FIG. 26(B)).

First, by pressurizing the substrates, the epoxy resin (insulating resin) is pushed outside of the bonding resin layers 438a and 438b and the gaps between the opening 430B and the chip capacitors 420 are filled with the resin. Further, since the substrates are pressurized and, at the same time, heated, the epoxy resin is hardened and the first resin substrate 430a, the second resin substrate 430b and the third resin substrate 430c are strongly bonded to one another by interposing the bonding rein layers 438a and 438b as bonding resin (bonding plates). In this embodiment, the space within the opening 430B is filled with the epoxy resin flowing out of the bonding resin layers. Alternatively, filler can be provided in the opening 430B.

Since the both sides of the core substrate 430 are the first resin substrate 430a and the third resin substrate 430c which are smooth, respectively, the interlayer resin insulating layers 540, 541, the conductor circuits 558, 559 and the via holes 560 and 564 can be appropriately formed in steps to be described later without damaging the smoothness of the core substrate 430 and the probability of the occurrence of defective printed circuit boards can be decreased. Further, the core substrate 430 can obtain sufficient strength.

(5) Next, the exposed regions of the copper foil 432 from the openings 432a for forming the via holes are removed by applying laser and openings 442 for via holes reaching the first and second electrodes 421 and 422 of the chip capacitors 420 are formed. Namely, using the copper foil 432 as a conformal mask, the openings 442 for via holes are formed in the core substrate 430 by applying laser. Then, the same step is executed to the other side of the substrate (FIG. 26(C)).

As a result, the opening diameters of the via holes depend on the opening diameters of the openings 432a of the copper foil 432 for forming the via holes, thereby making it possible to form each via hole to have an appropriate diameter. Likewise, the positional accuracy of the via hole openings depend on the opening positions of the openings 432a of the copper foil 432 for forming the via holes, thereby making it possible to form the via holes at appropriate positions even if the positional accuracy of the laser application is low.

(6) Penetrating holes 444 for through holes are formed in the core substrate 430 by drilling or applying laser (FIG. 26(D)). Thereafter, a de-smear process is performed using oxygen plasma. Alternatively, a de-smear process using chemicals such as permanganate may be performed.

(7) Next, using SV-4540 manufactured by ULVAC JAPAN, Ltd., a plasma process is performed to form rough surfaces on the entire surfaces of the core substrate 430. The plasma process is performed for two minutes while using, as inert gas, argon gas on conditions of power of 200 W, a gas pressure of 0.6 Pa and a temperature of 70° C. Then, sputtering is performed with Ni and Cu as targets and Ni—Cu metal layers 448 are formed on the surfaces of the core substrate 430, respectively (FIG. 27(A)). While sputtering is employed herein, metal layers of copper, nickel or the like may be formed by electroless plating. In some cases, after performing sputtering, electroless plated films may be formed. A roughing process may be performed using an acid or an oxidizer. The rough layers are preferably 0.1 to 5 μm thick.

(8) Next, photosensitive dry films are bonded onto the surfaces of the Ni—Cu metal layers 448 and exposure and development processes are performed while mounting masks, thereby forming resists 450 each having a predetermined pattern. The core substrate 430 is then immersed in an electroplating solution, current is applied to the substrate 430 through the Ni—Cu metal layers 448 and electroplating is conducted to portions in which the resists 450 are not formed on the following conditions, thereby forming electroplated films 452 (FIG. 27(B)).

| [Electroplating Solution] | |
|---|---|
| Sulfuric acid | 2.24 mol/l |
| Copper sulfate | 0.26 mol/l |
| Additive | 19.5 mol/l |
| (Kaparacid HL manufactured by Atotech Japan | |
| [Electroplating Conditions] | |
| Current density | 1 A/dm² |
| Duration | 120 minutes |
| Temperature | 22 ± 2° C. |

(9) After separating and removing the resists 450 with 5% NaOH, the Ni—Cu metal layers 448 and the copper foil 432 under the resists 450 are dissolved and removed by etching with an etching solution of a mixture of a nitride acid, a sulfuric acid and hydrogen peroxide, thereby forming conductor circuits 458 (including via holes 460) and through holes 456 each consisting of the copper foil 432, the Ni—Cu metal layer 448 and the electroplated copper film 452. After washing and drying the resultant substrate, an etching solution is sprayed on the both sides of the substrate and the surfaces of the conductor circuits 458 (including the via holes 460) and the through holes 456 are etched, thereby forming rough layers 462 on the entire surfaces of conductor circuits 458 (including the via holes 460) and the through holes 456 (FIG. 27(C)). As the etching solution, a mixture of 10 parts by weight of an imidazole copper (II) complex, 7 parts by weight of an glycolic acid, 5 parts by weight of potassium chloride and 78 parts by weight of ion-exchange water is employed.

(10) Resin filler 464 mainly consisting of an epoxy resin is applied on the both sides of the substrate 430 using the printer, thereby filling the resin filler 464 between the conductor circuits 458 and in the through holes 456, and heating and drying the resin filler 464. Namely, by executing this step, the resin filler 464 is filled between the conductor circuits 458 and in the via holes 460 and the through holes 456 (FIG. 25(D)).

(11) One side of the substrate 430 for which the process described in (10) above has been completed, is polished by belt sander polishing using belt abrasive paper (manufactured by Sankyo Rikagaku Co., Ltd.) in such a manner that the resin filler 464 is not left on the surfaces of the conductor circuits 458 and the land surfaces 456a of the through holes 456. Then, buffing is performed to remove flaws caused by the belt sander polishing. These series of polishing are also conducted to the other side of the substrate 430. Next, the resin filler 464 thus filled is heated an hardened. Thus, it is possible to obtain a wiring substrate wherein the surface layer portion of the resin filler 464 filled in the through holes 456 and the like and rough surfaces 462 on the upper surfaces of the conductor circuits 458 are removed, the both sides of the substrate 430 are smoothed, the resin filer 464 and the conductor circuits 458 are strongly bonded to one another through the rough surfaces 462, and the inner walls of the through holes 456 and the resin filler 464 are strongly bonded to one another through the rough surfaces 462.

Next, the same etching solution as that employed in (9) above is sprayed on the both sides of the substrate 430 to etch the surfaces of the conductor circuits 458 and the land surfaces 456a of the through holes 456 which have been flattened once, thereby forming rough surfaces 458a on the entire surfaces of the conductor circuits 458 (FIG. 28(A)).

(12) Thermosetting epoxy resin sheets to be described later are laminated by vacuum pressing onto the substrate 430 which has been subjected to the above-stated steps, at a pressure of 5 kg/cm² while raising temperature to 50 to 150° C., to thereby provide interlayer resin insulating layers 540 (FIG. 28(B)) The degree of vacuum during vacuum pressing is 10 mmHg.

(13) Next, openings 542 for via holes are formed in the interlayer resin insulating layers 540 by applying laser (FIG. 28(C)).

(14) Using SV-4540 manufactured by ULVAC JAPAN, Ltd. employed in the step of (7), a plasma process is performed to form rough surfaces 540α on the surfaces of the interlayer resin insulating layers 540 (FIG. 28(D)). Here, as in the case of the step of (7), a rouging process may be performed by using either an acid or an oxidizer. The rough layers are preferably 0.1 to 5 μm thick.

(15) Thereafter, as in the case of the step of (7), sputtering is performed with Ni and Cu as targets, to thereby form Ni—Cu metal layers 548 on the surfaces of the interlayer resin insulating layers 540 (FIG. 29(A)). While sputtering is performed herein, metal layers of copper, nickel or the like may be formed by electroless plating. In some cases, after forming the metal layers by sputtering, electroless plated films may be formed.

(16) Then, as in the case of the step of (8), photosensitive dry films are bonded onto the surfaces of the Ni—Cu metal layers 548 and exposure and development processes are performed while mounting masks, thereby forming resists 544 each having a predetermined pattern. The core substrate is then immersed in an electroplating solution, current is applied to the substrate through the Ni—Cu metal layers 548 and electroplating is conducted to portions in which the resists 544 are not formed, thereby forming electroplated films 552 (FIG. 29(B)).

(17) Thereafter, the same process as in the step of (9) is performed to thereby form conductor circuits 558 (including via holes 560) each consisting of the Ni—Cu metal layer 548 and the electroplated film 552. After washing and drying the resultant substrate, an etching solution is sprayed on the both sides of the substrate, which are thus etched, thereby forming rough surfaces 154 on the entire surfaces of the conductor circuits 558 (including the via holes 560) (FIG. 29(C)).

(18) The steps of (12) to (17) are further repeated, thereby forming interlayer resin insulating layers 541, conductor circuits 559 (including via holes 564) and rough surfaces 565 further above (FIG. 29(D)).

Later steps are the same as those of (16) to (19) in the first embodiment stated above, which description will not be, therefore, given herein.

The mounting of the IC chip 490 on the printed circuit board 410 completed through the above steps and the attachment of the printed circuit board 410 to the daughter board 495 are the same as those in the first embodiment, which description will not be, therefore, given herein.

First Other Example of Third Embodiment

Figure 32:
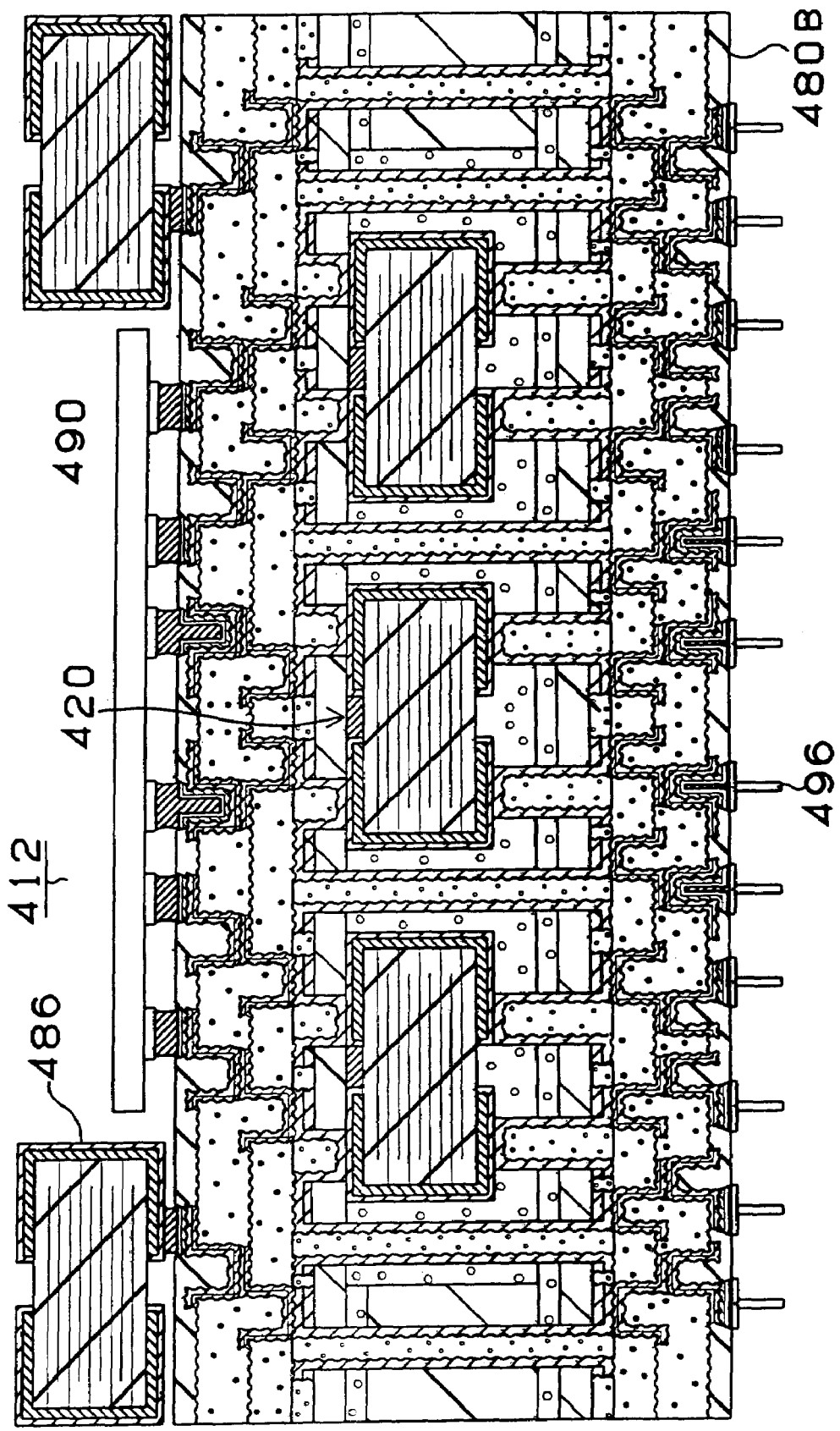
FIG. 32 is a cross-sectional view showing a state in which an IC chip is mounted on a printed circuit board according to a modification of the third embodiment of the present invention.

A printed circuit board according to the first other example of the third embodiment of the present invention will be described hereinafter with reference to FIG. 32. The printed circuit board in the first other example is almost the same as the printed circuit board in the third embodiment stated above. However, in the printed circuit board in the first other example, conductive connection pins 496 are provided at the printed circuit board and the printed circuit is connected to a daughter board through the conductive connection pins 496.

Further, in the third embodiment stated above, only the chip capacitors 420 contained in the core substrate 430 are provided. In this example, mass storage chip capacitors 486 are mounted on the front and reverse sides of the substrate.

The IC chip momentarily consumes high power and performs complex arithmetic operation. In the first other example, to supply high power to the IC chip, chip capacitors 420 and chip capacitors 486 for power supply are provided. The advantage derived from these chip capacitors will be described with reference to FIG. 12.

FIG. 12 is a graph with a vertical axis indicating voltage supplied to the IC chip and a horizontal axis indicating time. In FIG. 12, two-dot chain line C denotes the voltage variation of a printed circuit board which is not provided with power supply capacitors. If power supply capacitors are not provided, voltage attenuates greatly. A broken line A denotes the voltage variation of a printed circuit board having chip capacitors mounted on the surfaces thereof. Compared with the two-dot chain line C, voltage does not drop greatly. However, since loop length is larger, rate-controlled power supply cannot be conducted sufficiently. Namely, at the start of the supply of power, voltage falls. Further, a two-dot chain line B denotes the voltage drop of a printed circuit board including the chip capacitors described above with reference to FIG. 31. In this case, loop length can be shortened; however, mass storage chip capacitors cannot be contained in a core substrate 430 and voltage, therefore, varies. Here, a solid line E denotes the voltage variation of the printed circuit board in the first other example which printed circuit board has the chip capacitors 420 mounted in the core substrate and the mass storage chip capacitors 486 mounted on the surfaces thereof. Voltage variation is minimized by providing the chip capacitors 420 and the mass storage chip capacitors 486 (having relatively high inductance) in the vicinity of the IC chip.

First Modification of Third Embodiment

Figure 36:
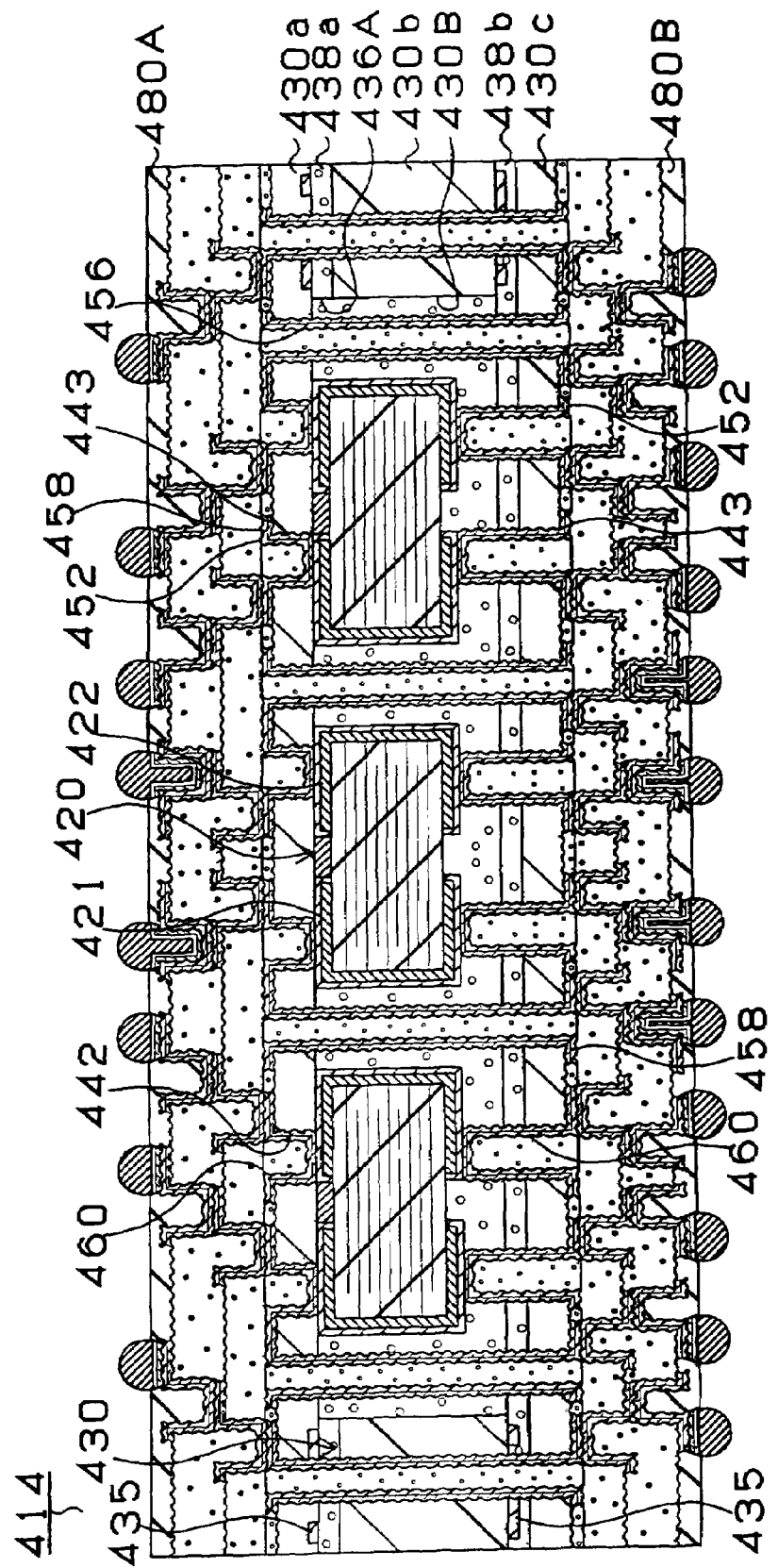
FIG. 36 is a cross-sectional view of the printed circuit board according to the first modification of the third embodiment of the present invention.
Figure 37:
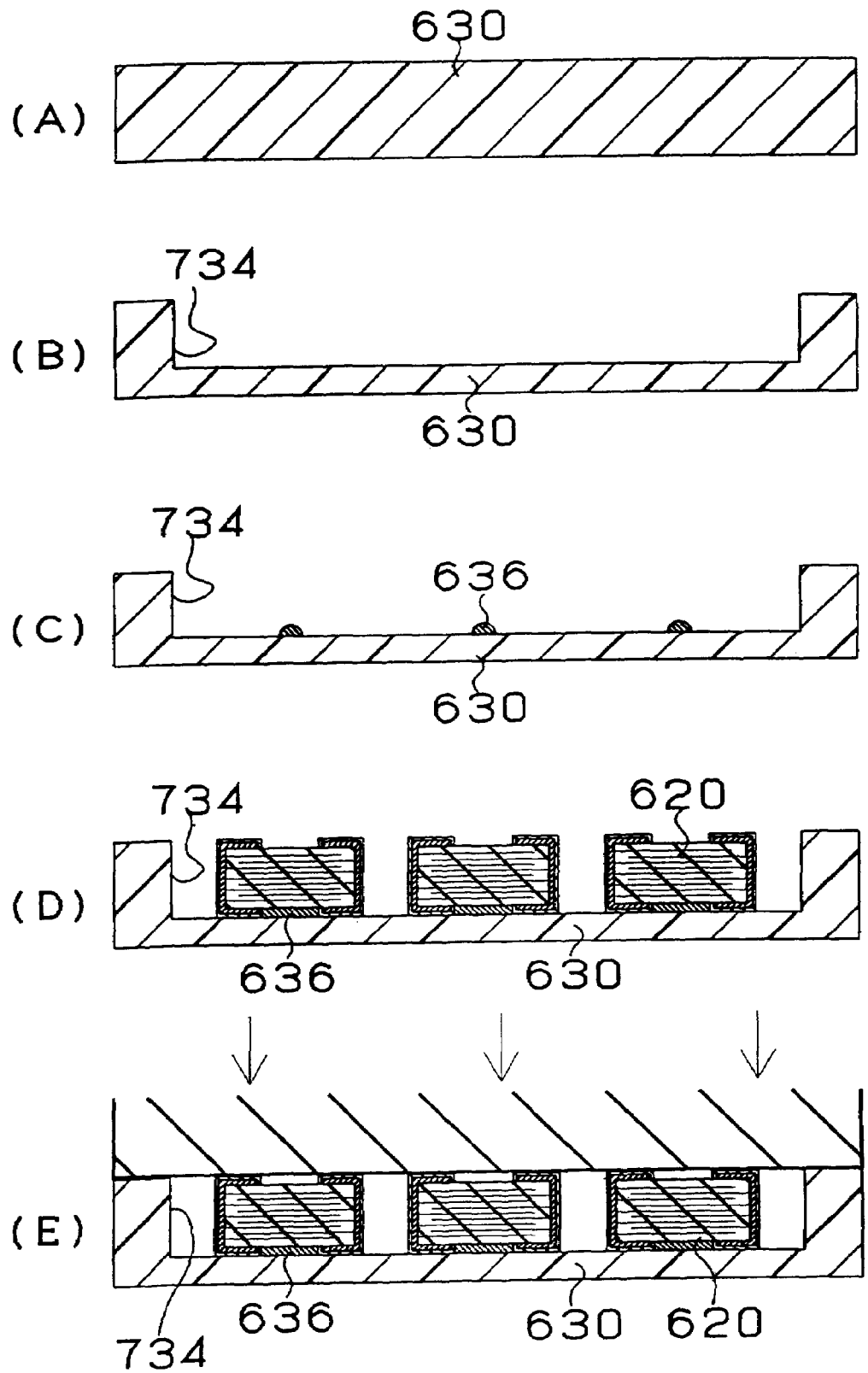
FIG. 37 is a view showing a process for manufacturing a printed circuit board according to the fourth embodiment of the present invention.
Figure 38:
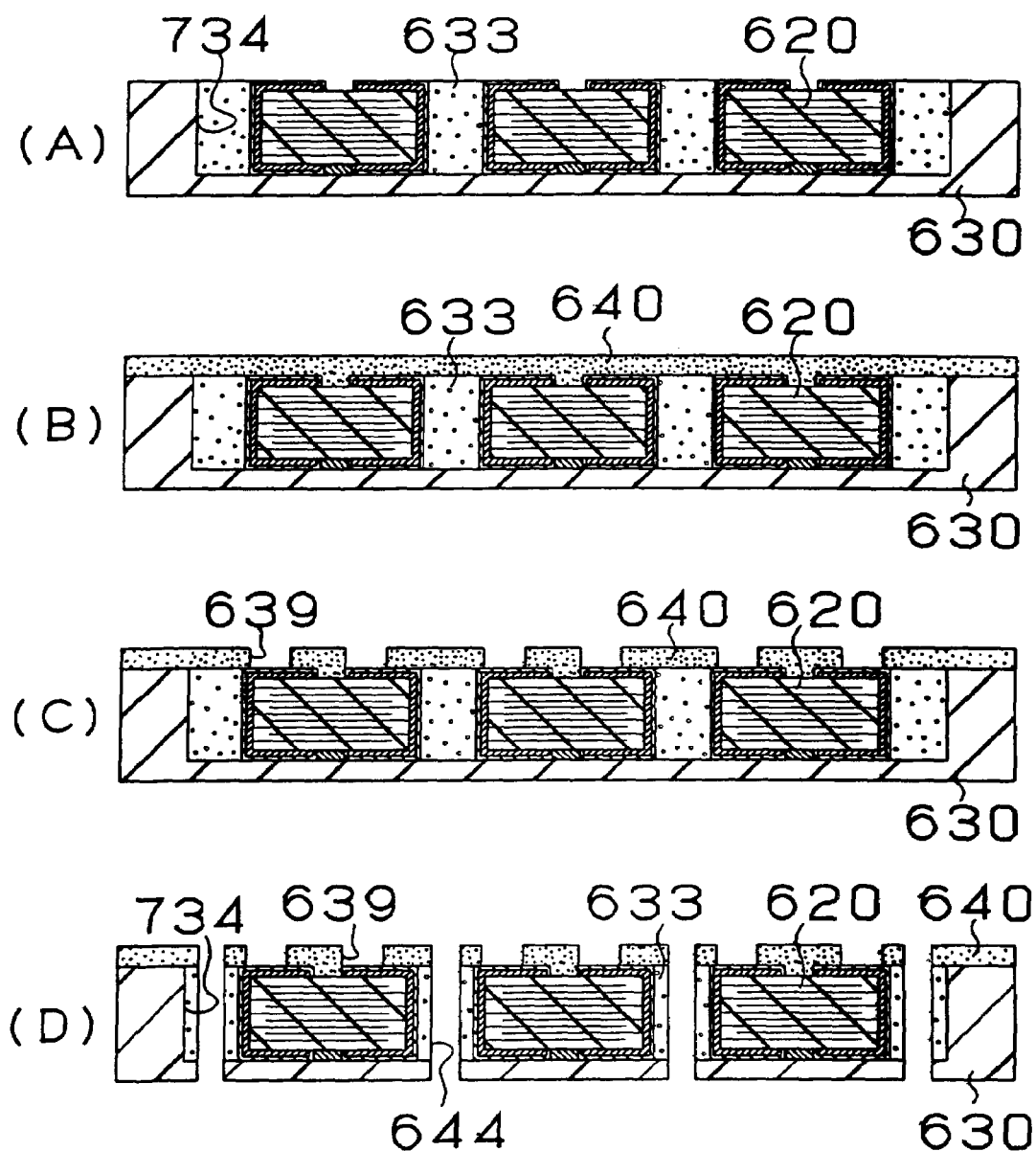
FIG. 38 is a view showing a process for manufacturing the printed circuit board according to the fourth embodiment of the present invention.
Figure 39:
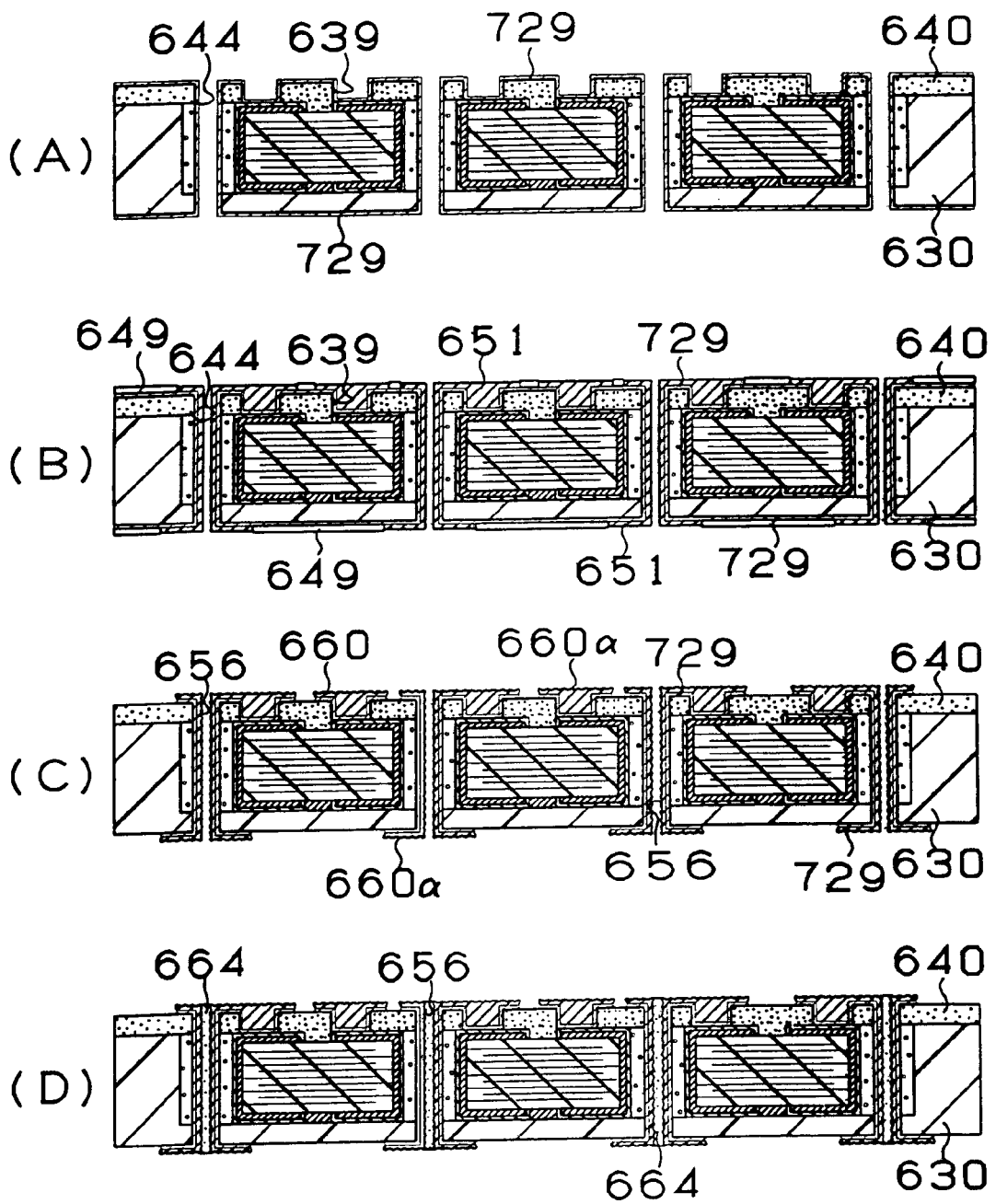
FIG. 39 is a view showing a process for manufacturing the printed circuit board according to the fourth embodiment of the present invention.
Figure 40:
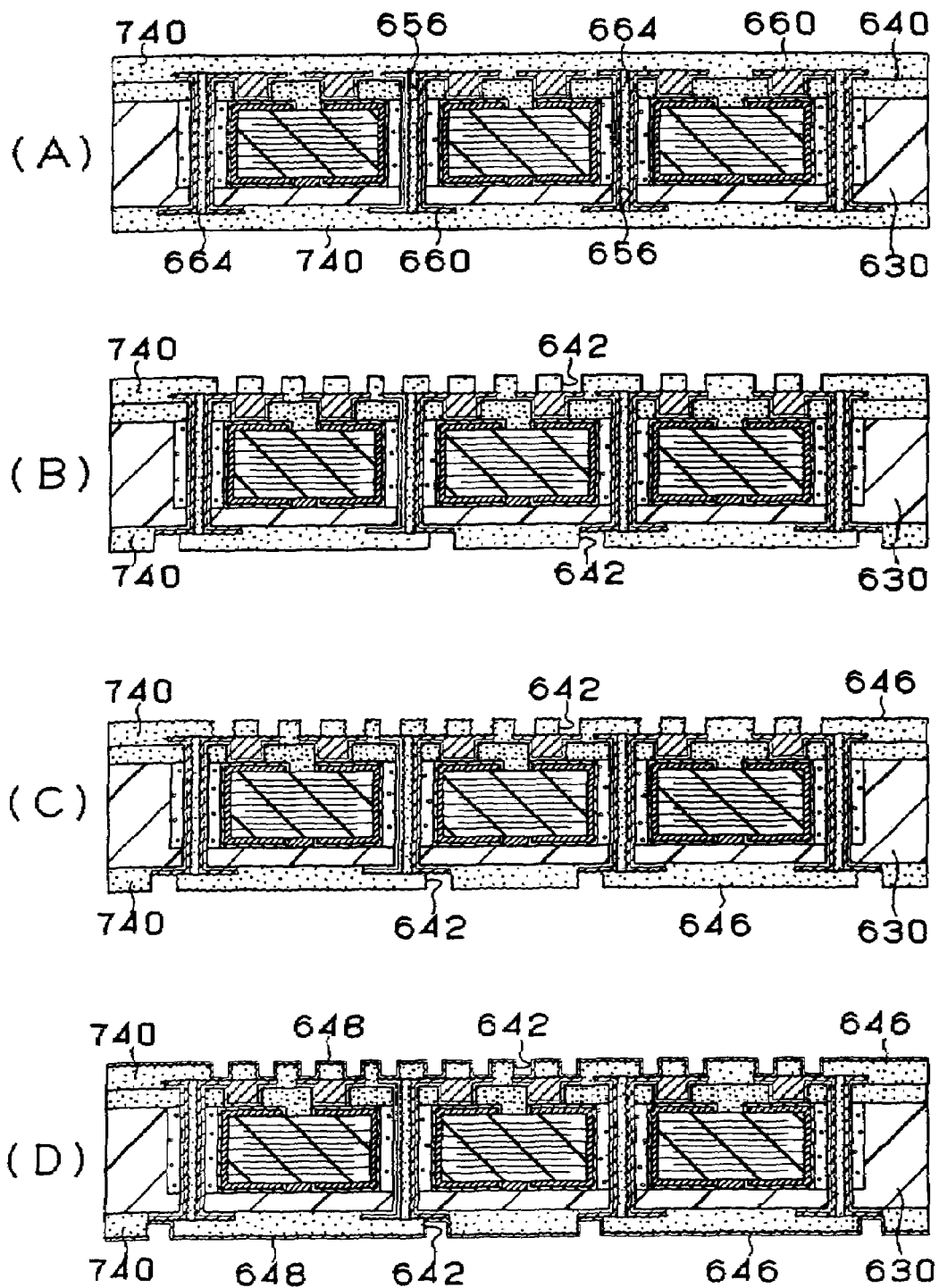
FIG. 40 is a view showing a process for manufacturing the printed circuit board according to the fourth embodiment of the present invention.

Next, a printed circuit board 414 according to the first modification of the third embodiment will be described with reference to FIG. 36. The printed circuit board in the first modification of the third embodiment is almost the same in constitution as the printed circuit board in the third embodiment stated above. In the third embodiment described above with reference to FIG. 30, each conductor circuit 458 consists of three layers, i.e., the copper foil 432, the Ni—Cu metal layer 448 and the electroplated film 452. In the printed circuit board 414 in the first modification of the third embodiment, by contrast, each conductor circuit 458 consists of two layers, i.e., an electroless plated film 443 and an electroplated film 452. Namely, the copper foil 432 is removed and thickness is reduced, thereby forming the conductor circuit 458 at fine pitch.

In addition, in the printed circuit board 414 in the first modification of the third embodiment, conductor circuits 435 are formed on the both sides of the second resin substrate 430b provided with an opening 430B for containing chip capacitors 420. In the first modification of the third embodiment, since the conductor circuits 435 are formed on the both sides of the second resin substrate 430b provided with the opening 430B for containing the chip capacitors 420, it is possible to increase wiring density within the core substrate 430 and to reduce the number of interlayer resin insulating layers to be built up.

Furthermore, as shown in FIG. 13(A), in the chip capacitor 420 of the printed circuit board in the first modification of the third embodiment, after the coating layer (not shown) of the first and second electrodes 421 and 422 are completely separated, the first and second electrodes 421 and 422 are coated with copper plated films 29. The first and second electrodes 421 and 422 each coated with the copper plated film 29 are electrically connected to each other by via holes 460 made of a copper plated material. Here, the electrodes 421 and 422 of the chip capacitor are made by metalization and have irregular portions on the surfaces thereof. Due to this, if the substrate is used while exposing the metal layers, the resin may sometimes remain on the irregular portions in the step of providing non-penetrating holes 442 in the first resin substrate 430a. At this time, the resin residue causes connection defects between the first, second electrodes 421, 422 and the via holes 460. In the first modification of the third embodiment, by contrast, since the surfaces of the first and second electrodes 421 and 422 are smoothed by the copper plated films 29, no resin remains when providing openings 442 in the coated first resin substrate 430a on the electrodes and the reliability of the connection between the electrodes 421, 422 and the via holes 460 when forming the via holes 460 can be enhanced.

Furthermore, the via holes 460 are formed by plating in the electrodes 421 and 422 having the copper plated films 29 formed thereon, respectively, the connection characteristic between the electrodes 421, 422 and the via holes 460 is good and disconnection does not occur between the electrodes 421, 422 and the via holes 460 even if a heat cycle test is conducted. Besides, no migration occurs and no disadvantages are derived in the connection section of the via holes of the capacitors.

The copper plated films 29 are provided after the nickel/tin layer (coating layer) coated on the surface of each metal layer 26 in a phase of manufacturing chip capacitors is separated in a phase of mounting the chip capacitors on the printed circuit board. Alternatively, the copper plated films 29 can be directly coated on the metal layers 26 in the phase of manufacturing the chip capacitors 420. Namely, in the first modification of the third embodiment, as in the case of the third embodiment, after openings reaching the copper plated films 29 of the electrodes are provided by applying laser, a desmear process is performed to thereby form via holes by copper plating. Accordingly, even if an oxide film is formed on the surface of the copper plated film 29, the oxide film can be removed by the laser and de-smear processes, thereby making it possible to establish connection appropriately.

Further, rough layers 23a are provided on the surfaces of a dielectric 423 of each chip capacitor 420 which dielectric is made of ceramic. Due to this, the adhesiveness between the chip capacitors 420 made of ceramic and the resin substrates 438a and 438b made of a resin is high and the first resin substrate 430a is not separated on the interface therebetween even if a heat cycle test is conducted. The rough layers 23a can be formed by polishing the surfaces of the chip capacitors 420 after sintering them or by roughing the surfaces before sintering them. In the first modification of the third embodiment, the surfaces of the capacitors are roughed and the adhesiveness between the capacitors and the resin is thereby enhanced. Alternatively, a silane coupling process can be conducted to the surfaces of the capacitors.

As shown in FIG. 13(B), it is also possible to employ the first and second electrodes 21 and 22 of the capacitors 420 while removing part of the coats 28 of the electrodes 21 and 22. This is because connection characteristics can be enhanced by exposing the first and second electrodes 21 and 22.

Figure 33:
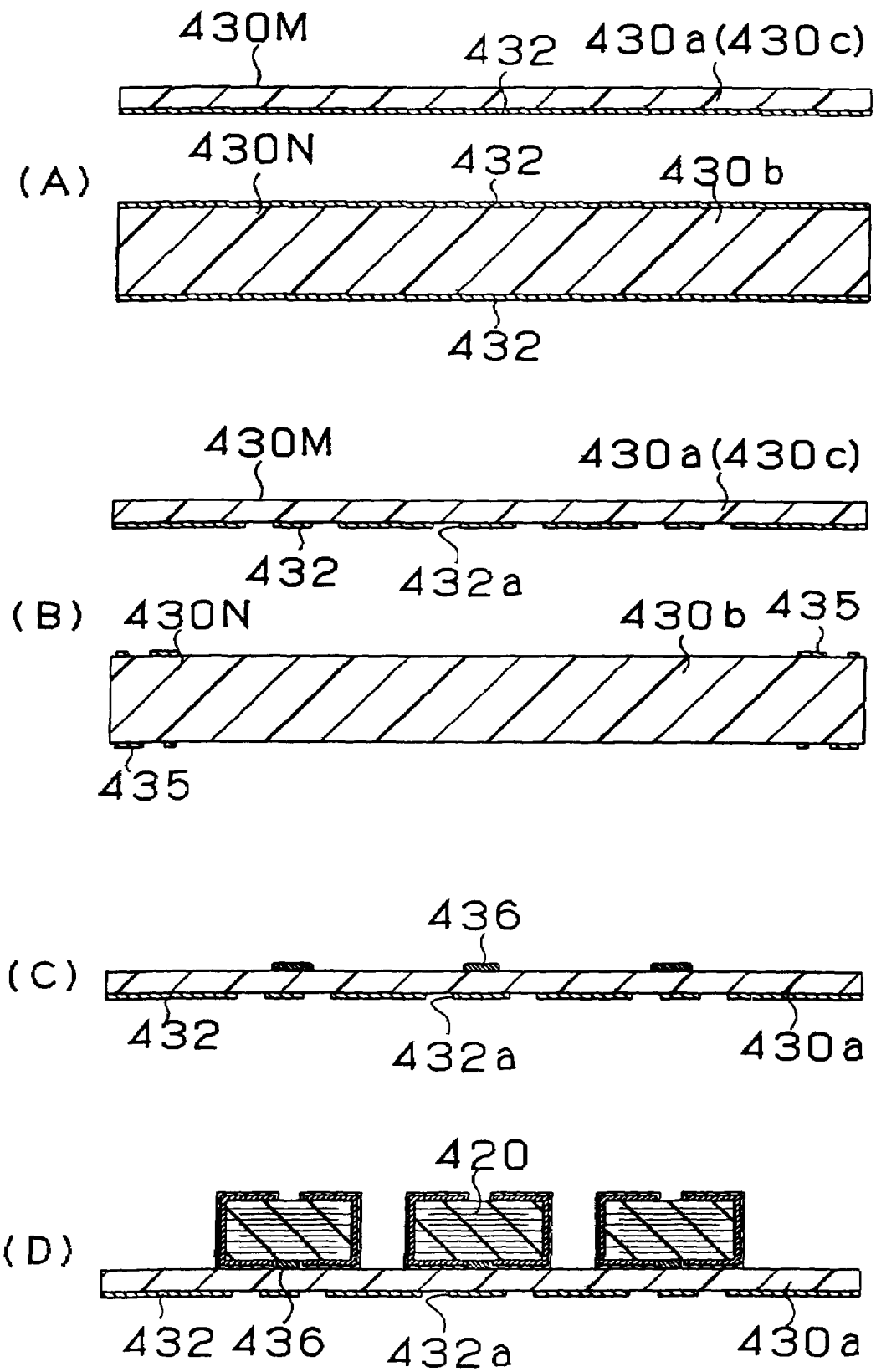
FIG. 33 is a view showing a process for manufacturing a printed circuit board according to the first modification of the third embodiment of the present invention.
Figure 34:
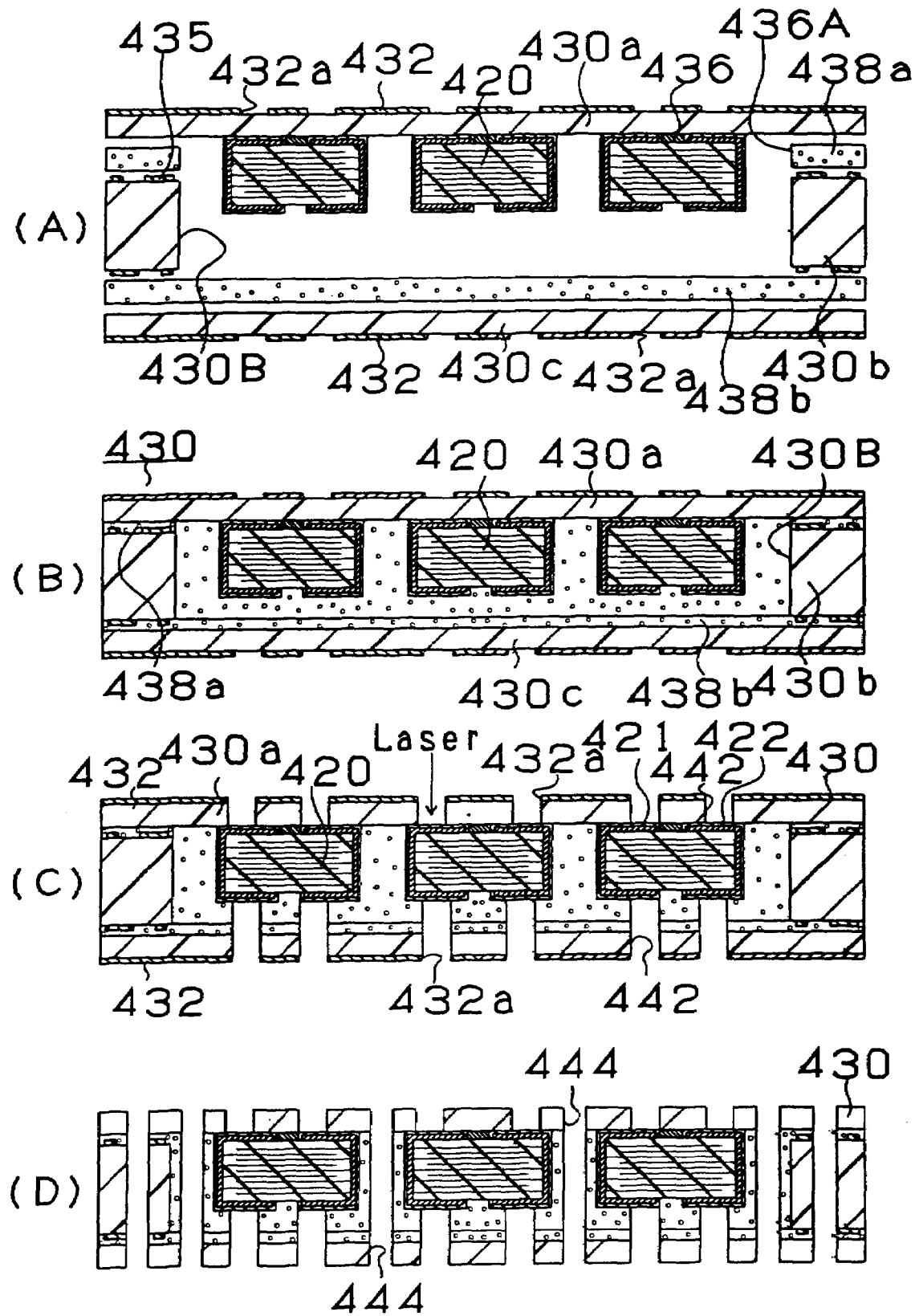
FIG. 34 is a view showing a process for manufacturing the printed circuit board according to the first modification of the third embodiment of the present invention.
Figure 35:
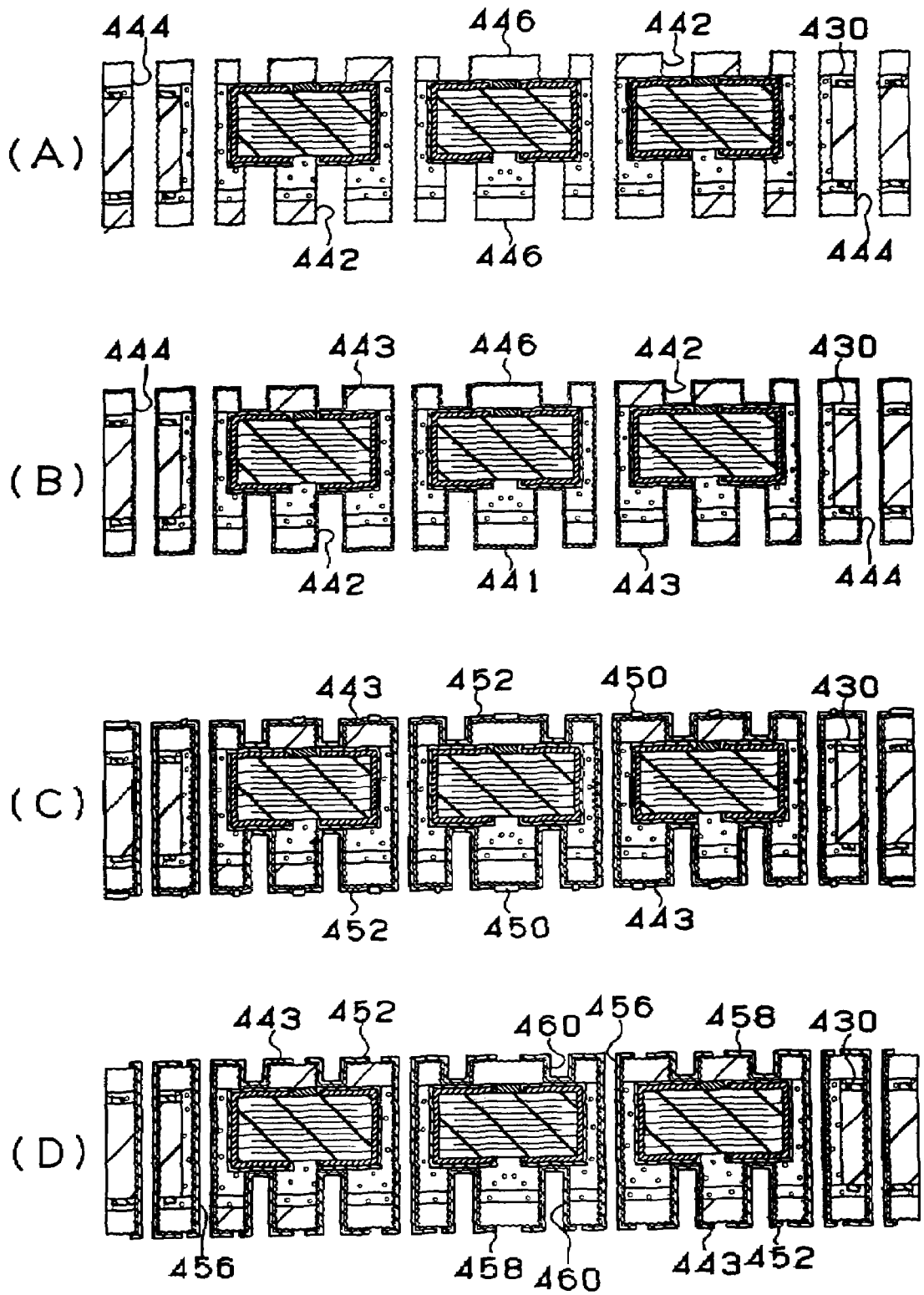
FIG. 35 is a view showing a process for manufacturing the printed circuit board according to the first modification of the third embodiment of the present invention.

A process for manufacturing the printed circuit board according to the first modification of the third embodiment of the present invention will be described with reference to FIGS. 33 to 35.

(1) One-sided copper-clad laminated plates 430M (the first resin substrate 430a and the third resin substrate 430c) each having a copper foil 432 laminated on one side of a resin substrate having a core having a thickness of 0.1 mm and made of glass cloth or the like which a BT (Bismaleimide-Triazine) resin is impregnated into and hardened in, is prepared. Also, a two-sided copper-clad laminated plate 430N (the second resin substrate 430b) having a copper foil 432 laminated on the both sides of a resin substrate having a core having a thickness of 0.4 mm and made of glass cloth or the like which a BT (Bismaleimide-Triazine) resin is impregnated into and hardened in, is prepared (FIG. 33(A)).

(2) Next, the copper foil 432 of each copper-clad laminated plate 430M is etched into a pattern, thereby forming openings 432a for forming via holes are formed. Likewise, the copper foils 432 of the both-sided copper-clad laminated plate 430N are etched into a pattern, thereby forming conductor circuits 435 (FIG. 33(B)). In the first modification of the third embodiment, the conductor circuit 435 are formed on the both sides of the second resin substrate 430b, so that the wiring density of the core substrate can be advantageously increased and that the number of interlayer resin insulating layers to be built up can be advantageously reduce.

(3) Using a printer, a thermosetting or UV hardening bonding material 436 is applied onto portions of the first resin substrate 430a on which the copper foils 432 are not laminated (FIG. 33(C)). Instead of the application of the bonding material, potting may be performed.

Next, a plurality of chip capacitors 420 made of ceramic are mounted on the bonding material 436 and bonded to the first resin substrate 430a through the bonding material 436 (FIG. 33(D)). Either one or a plurality of chip capacitors 420 may be provided; however, if a plurality of chip capacitors 420 are employed, the high integration of the capacitors can be realized.

(4) Then, resin layers for bonding (bonding resin layers) 438a and 438b each having a core made of glass cloth or the like and impregnated with an epoxy resin as well as the second resin layer 430b are prepared. Openings 36A and 430B capable of containing the chip capacitors 420 are formed in the bonding resin layer 438a and the second resin layer 430b, respectively. First, the second resin substrate 430b is mounted on the third resin substrate 430c through the bonding resin layer 438b with the surface of the third resin substrate 430c laminated with the copper foil 432 directed downward. Next, the first resin substrate 430a is inverted and mounted on the second resin substrate 430b through the bonding resin layer 438a. Namely, the first resin substrate 430a is superposed on the second resin substrate 430b so that the chip capacitors 420 can be contained in the opening 430B formed in the second resin substrate 430b (FIG. 34(A)). By doing so, the chip capacitors 420 can be contained in the core substrate 430 and the printed circuit board having reduced loop inductance can be provided.

(5) The superposed substrates are pressurized using a thermal press, thereby integrating the first, second and third resin substrates 430a, 430b and 430c in a multilayer manner and forming the core substrate 430 having a plurality of chip capacitors 420 (FIG. 34(B)).

In this embodiment, the epoxy resin flowing out of the bonding resin layers is filled in gaps within the openings 430. Alternatively, filler may be arranged in the openings 430B.

Since the both sides of the core substrate 430 are the first resin substrate 430a and the third resin substrate 430c which are smooth, respectively, the interlayer resin insulating layers 540, 541, the conductor circuits 558, 559 and the via holes 560 and 564 can be appropriately formed in steps to be described later without damaging the smoothness of the core substrate 430 and the probability of the occurrence of defective printed circuit boards can be decreased. Further, the core substrate 430 can obtain sufficient strength.

(6) Next, the exposed regions of the copper foils 432 from the openings 432a for forming the via holes are removed by applying laser and openings 442 for via holes reaching the first and second electrodes 421 and 422 of the chip capacitors 420 are formed. Namely, using the copper foils 432 as conformal masks, the openings 442 for the via holes are formed in the core substrate 430. Then, the same step is executed to the other side of the substrate (FIG. 34(C)). As a result, the opening diameters of the via holes depend on the opening diameters of the openings 432a of the copper foils 432 for forming the via holes, thereby making it possible to form each via hole to have an appropriate diameter. Likewise, the positional accuracy of the via hole openings depend on the opening positions of the openings 432a of the copper foil 432 for forming the via holes, thereby making it possible to form the via holes at appropriate positions even if the positional accuracy of the laser application is low.

(7) Thereafter, the copper foils 432 on the both sides of the core substrate 430 are etched by using an etching solution and thereby removed. By doing so, it is possible to form the thinner conductor circuits 458 in the later step to be described later and form the circuits 458 at fine pitch.

Next, penetrating holes 444 for through holes are formed in the core substrate 430 by drilling or applying laser (FIG. 34(D)). Thereafter, a de-smear process is performed using oxygen plasma. Alternatively, a de-smear process using chemicals such as permanganate may be performed.

(8) Next, using SV-4540 manufactured by ULVAC JAPAN, Ltd., a plasma process is performed to form rough surfaces 446 on the entire surfaces of the core substrate 430 (FIG. 35(A)). The plasma process is performed for two minutes while using, as inert gas, argon gas on conditions of power of 200 W, a gas pressure of 0.6 Pa and a temperature of 70° C. Alternatively, a roughing process may be performed using an acid or an oxidizer. The rough layers are preferably 0.1 to 5 μm thick.

(9) Next, the substrate 430 is immersed in an electroless copper plating solution having the following composition to thereby form electroless copper plated films 443 each having a thickness of 0.6 to 3.0 μm on the entirety of the rough surfaces 446 (FIG. 35(B)).

| [Electroless Plating Solution] | |
| --- | --- |
| NiSO$_4$ | 0.003 mol/l |
| tartaric acid | 0.200 mol/l |
| copper sulfate | 0.043 mol/l |
| HCHO | 0.050 mol/l |
| NaOH | 0.100 mol/l |
| α,α'-bipyridyl | 40 mg/l |
| polyethylene glycol (PEG) | 0.10 g/l |
| [Electroless Plating Conditions] | |
| 40 minutes at a solution temperature of 35° C. | |

While electroless plating is employed in this embodiment, metal layers of copper, nickel or the like may be formed by sputtering. In some cases, after forming the layers by sputtering, electroless plated films may be formed.

(10) Commercially available photosensitive dry films are bonded onto the electroless copper plated films 443. Masks are mounted on the films, respectively and the films are exposed with 100 mJ/cm$^3$ and developed with a 0.8% sodium carbonate solution, thereby providing plating resists 450 each having a thickness of 30 μm. Then, the substrate 430 is washed with water of a temperature of 50° C. and degreased, washed with water of a temperature of 25° C. and with a sulfuric acid, and subjected to copper electroplating on the following conditions, thereby forming electroplated copper films 452 each having a thickness of 20 μm (FIG. 35(C)).

| [Electroplating Solution] | |
| --- | --- |
| Sulfuric acid | 2.24 mol/l |
| Copper sulfate | 0.26 mol/l |
| Additive | 19.5 mol/l |
| (Kaparacid HL manufactured by Atotech Japan) | |
| [Electroplating Conditions] | |
| Current density | 1 A/dm$^2$ |
| Duration | 65 minutes |
| temperature | 22 ± 2° C. |

(11) After separating and removing the resists 450 with 5% NaOH, the electroless plated films 443 under the resists 450 are dissolved and removed by etching with an etching solution of a mixture of a sulfuric acid and hydrogen peroxide, thereby forming conductor circuits 458 (including via holes 460) and through holes 456 each consisting of the electroless copper plated film 443 and the electroplated copper film 452 each having a thickness of 18 μm (FIG. 35(D)). In the first modification of the third embodiment, the copper foils 432 are removed in advance as stated above, whereby the conductor films 458 can made thinner and formed at fine pitch. While the copper foils 432 are completely separated in this modification, it is also possible to make the conductor circuits 458 thinner and form the conductor circuits 458 at fine pitch by making the copper foils 432 thinner by light etching.

Later steps are the same as those of (10) to (18) in the third embodiment stated above, which description will not be, therefore, given herein.

In the first modification of the third embodiment stated above, the via holes are provided on the both sides of the core substrate. It is also possible to form via holes only on one side of the substrate. Further, the openings 432a of the copper foils 432 on the surfaces of the core substrate 430 are employed as conformal masks in this modification. It is also possible to provide openings reaching the capacitors by applying laser without employing the conformal masks of the core substrate 430.

Second Modification of Third Embodiment

Next, the constitution of a printed circuit board according to the second modification of the first embodiment will be described with reference to FIG. 14.

The printed circuit board in the second modification is almost the same in constitution as the printed circuit board in the first embodiment stated above. They, however, differ in chip capacitors 20 contained in the core substrate 30. FIG. 14 is a plan view of chip capacitors. FIG. 14(A) shows a chip capacitor before being cut for providing a plurality of chip capacitors. In FIG. 14(A), a dashed line denotes a cut line. As shown in FIG. 14(B), in the printed circuit board in the first embodiment stated above, the first electrodes 21 and the second electrodes 22 are provided on the edges of the chip capacitor. FIG. 14(C) shows a chip capacitor before being cut for providing a plurality of chip capacitors in the second modification. In FIG. 14(C), a dashed line denotes a cut line. In the printed circuit board in the second modification, as shown in the plan view of FIG. 14(D), first electrodes 21 and second electrodes 22 are provided inside of the edges of the chip capacitor.

In the printed circuit board in the second modification, the chip capacitors 20 each having electrodes formed inside of the outer edges thereof are employed, so that mass storage chip capacitors can be employed.

Next, a printed circuit board according to the first other example of the second modification will be described with reference to FIG. 15.

FIG. 15 is a plan view of a chip capacitor 20 contained in the core substrate of the printed circuit board according to the first other example. In the first embodiment stated above, a plurality of small storage chip capacitors are contained in the core substrate. In the first other example, by contrast, a large, mass storage chip capacitor 20 is contained in the core substrate. The chip capacitor 20 consists of the first electrodes 21, the second electrodes 22, a dielectric 23, the first conductive films 24 connected to the first electrodes 21, the second conductive films 25 connected to the second electrodes 22, electrodes 27 which are not connected to the first and second conductive films 24 and 25, for the connection of the upper and lower surfaces of the chip capacitor. The IC chip and the daughter board are connected to each other through the electrodes 27.

Since the large chip capacitor is employed in the printed circuit board in the first modification, it is possible to employ a mass storage chip capacitor. Further, since the large chip capacitor 20 is employed, the printed circuit board does not warp even if a heat cycle is performed repeatedly.

Next, a printed circuit board according to the second other example of the second modification will be described with reference to FIG. 16. FIG. 16(A) shows a chip capacitor before being cut for providing a plurality of chip capacitors. In FIG. 16(A), a dashed line denotes an ordinary cut line. FIG. 16(B) is a plan view of the chip capacitors. As shown in FIG. 16(B), a plurality of (or in FIG. 16(B), three) chip capacitors for providing multiple capacitors are coupled to one another and employed as a large capacitor as a whole.

In the second other example, since the large chip capacitor 20 is employed, it is possible to employ a mass storage chip capacitor. Further, since the large chip capacitor 20 is employed, the printed circuit board does not warp even if a heat cycle is performed repeatedly.

In the embodiment stated above, the chip capacitors are built in the printed circuit board. Alternatively, plate-like capacitors each constituted by providing a conductive film on a ceramic plate may be employed instead of the chip capacitors.

The structure of the third embodiment makes it possible to contain the capacitors in the core substrate and to shorten the distance between the IC chip and each capacitor, thereby reducing the loop inductance of the printed circuit board. Further, since the printed circuit board is constituted by providing resin substrates in a multilayer manner, the core substrate can obtain sufficient strength. Besides, the first resin substrate and the third resin substrate are provided on the both sides of the core substrate, respectively, thereby constituting the core substrate smoothly. Thus, it is possible to appropriately form interlayer resin insulating layers and conductor circuits on the core substrate and to thereby decrease the probability of the occurrence of defective printed circuit boards.

In addition, by adopting the manufacturing method of the third embodiment, the opening diameters of the via holes depend on the opening diameters of the openings of metal films, so that it is possible to form each via hole to have an appropriate diameter. Likewise, the positional accuracy of the via hole openings depend on the opening positions of the openings of the metal films, so that it is possible to form the via holes at appropriate positions even if the positional accuracy of the laser application is low.

Since it is possible to connect the substrate from the lower portions of the capacitors, the structure allows reducing the loop inductance and increasing the degree of freedom for arrangement.

Moreover, since the resin is filled between the core substrate and the capacitors, a stress resulting from the capacitors or the like can be reduced even if it occurs and no migration occurs. Due to this, there is no fear that the electrodes of the capacitors are separated from the connection sections of the via holes and dissolved. Thus, it is possible to maintain desired performance even if a reliability test is executed.

In addition, even if the capacitors are coated with copper, it is possible to prevent the occurrence of migration.

Fourth Embodiment

Figure 42:
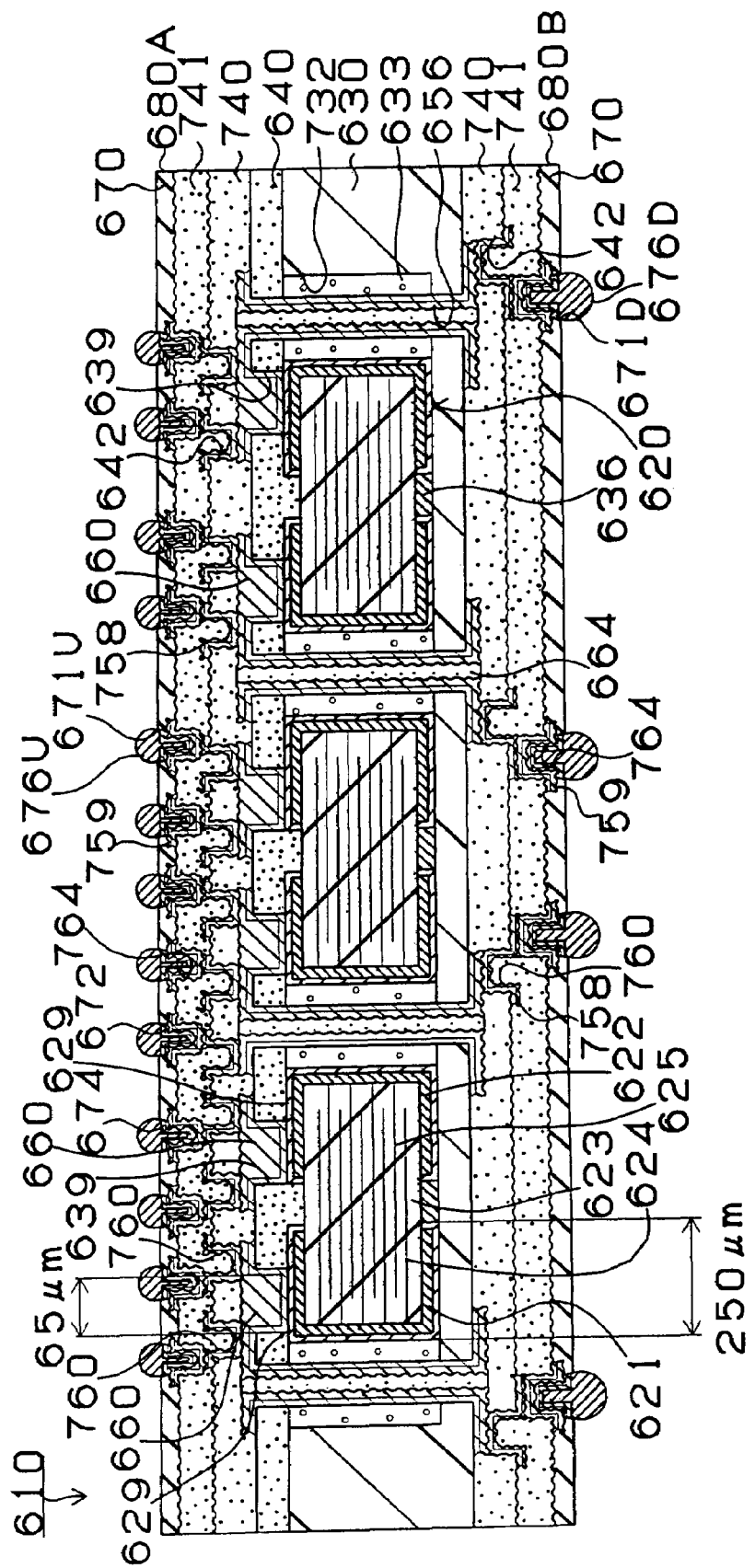
FIG. 42 is a cross-sectional view of the printed circuit board according to the fourth embodiment of the present invention.
Figure 43:
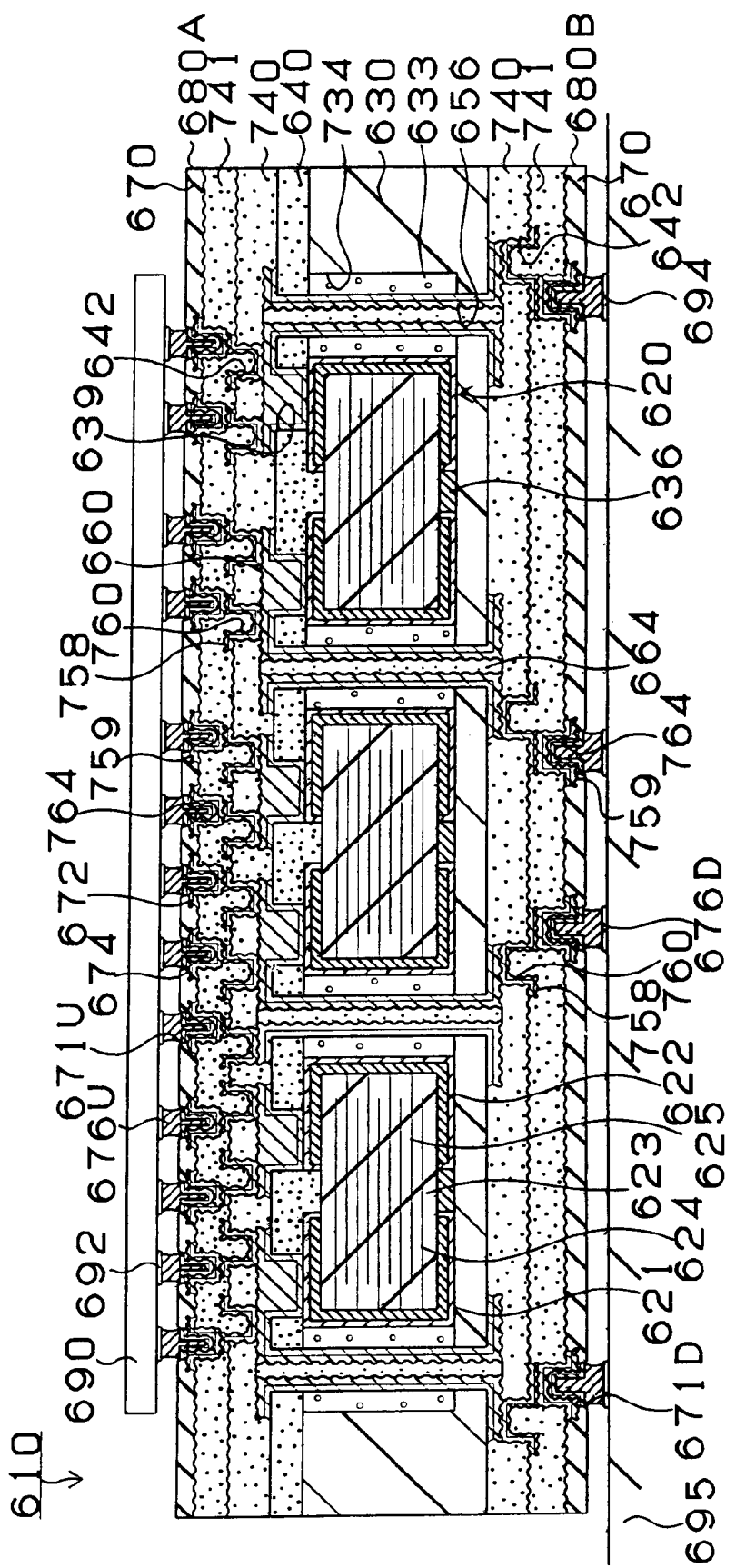
FIG. 43 is a cross-sectional view showing a state in which an IC chip is mounted on the printed circuit board according to the fourth embodiment of the present invention.
Figure 45:
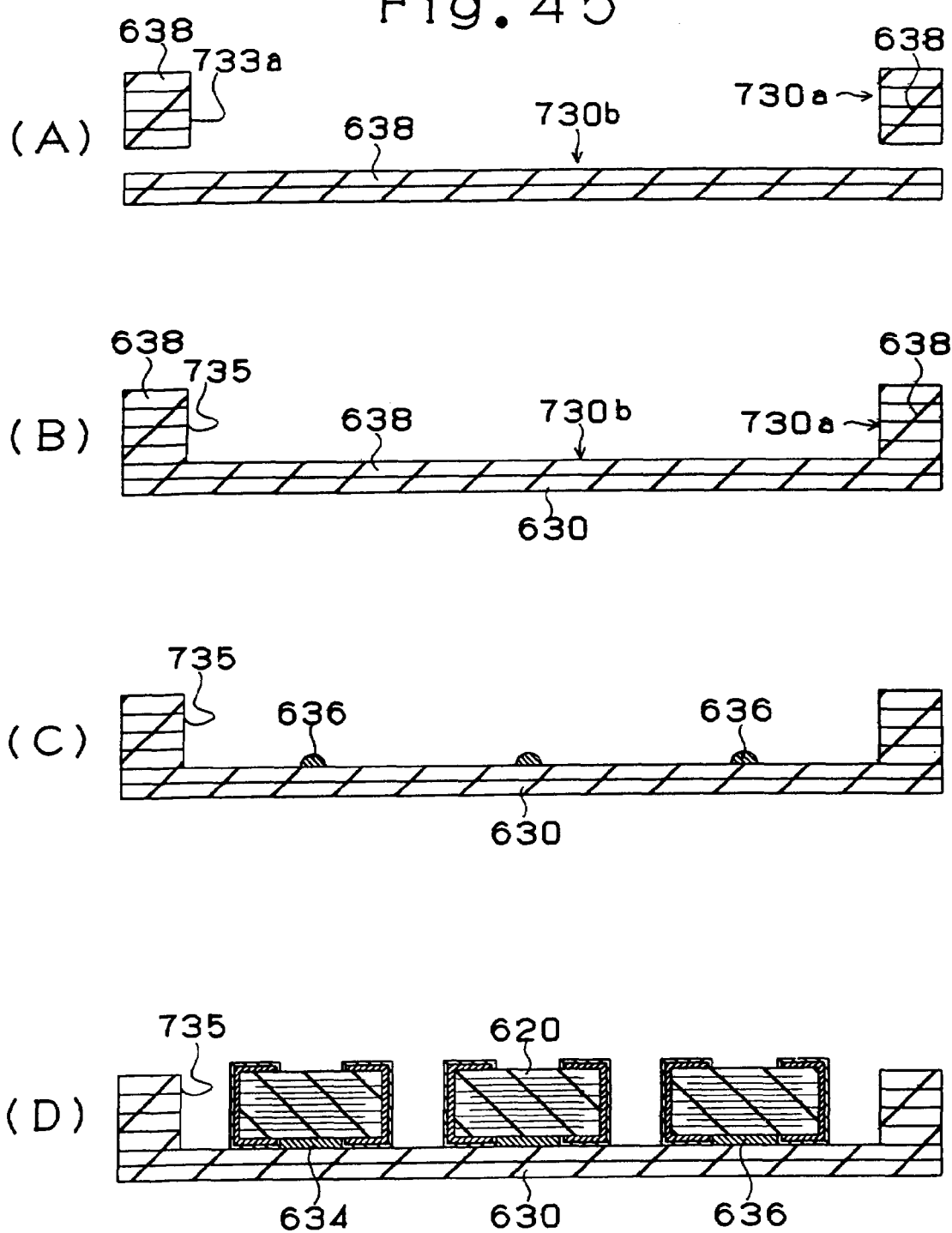
FIG. 45 is a view showing a process for manufacturing a printed circuit board according to the first modification of the fourth embodiment of the present invention.
Figure 46:
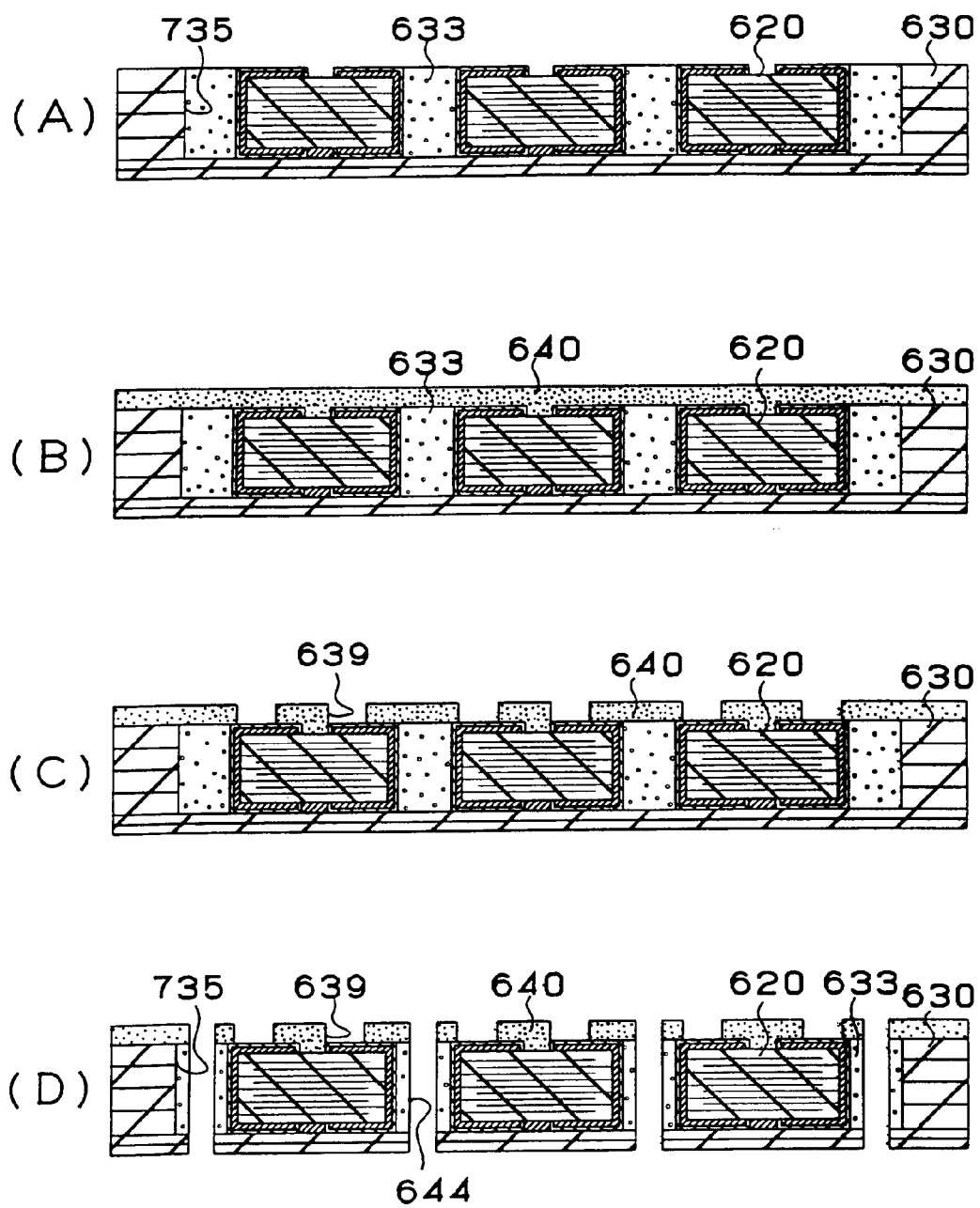
FIG. 46 is a view showing a process for manufacturing the printed circuit board according to the first modification of the fourth embodiment of the present invention.
Figure 47:
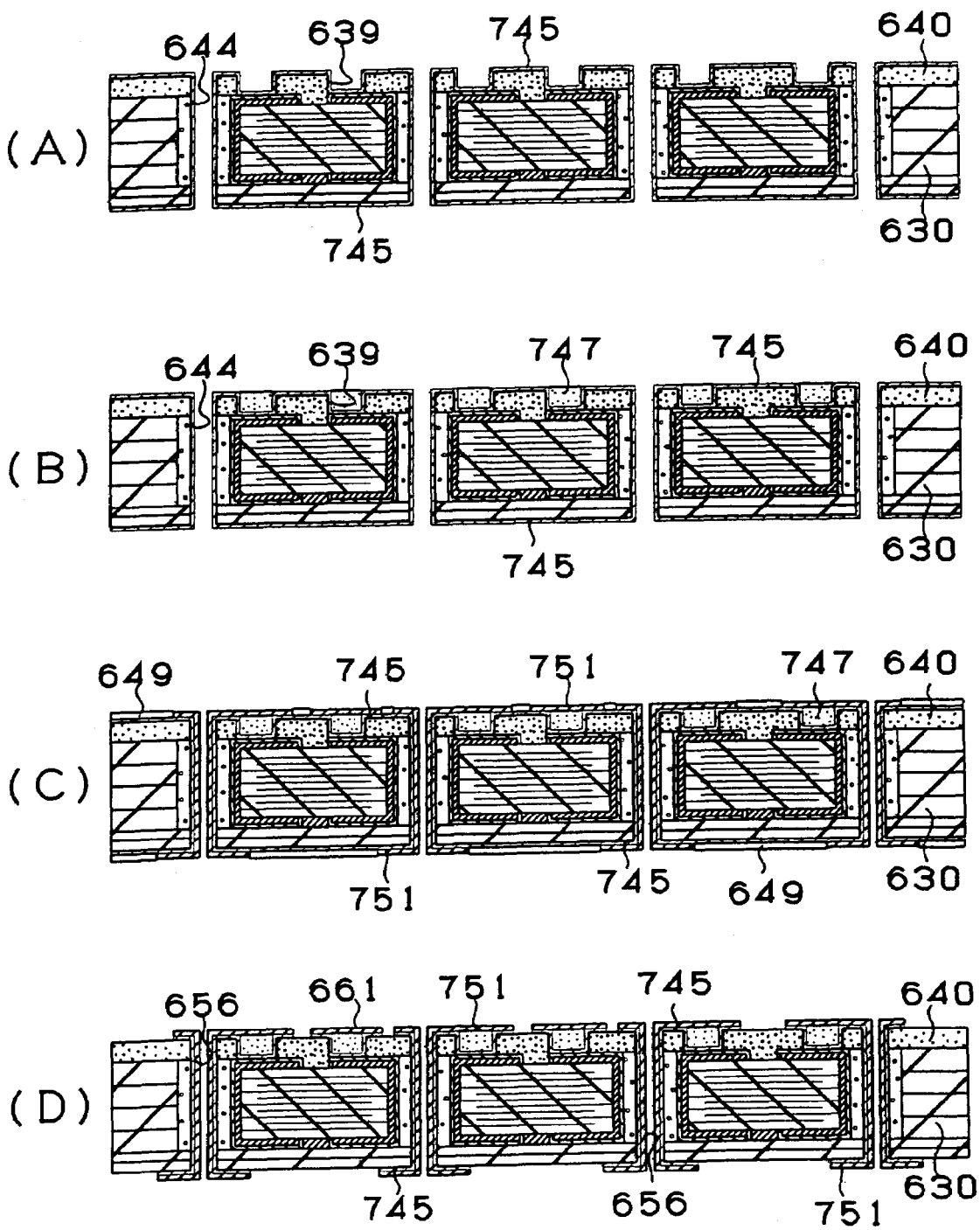
FIG. 47 is a view showing a process for manufacturing the printed circuit board according to the first modification of the fourth embodiment of the present invention.
Figure 48:
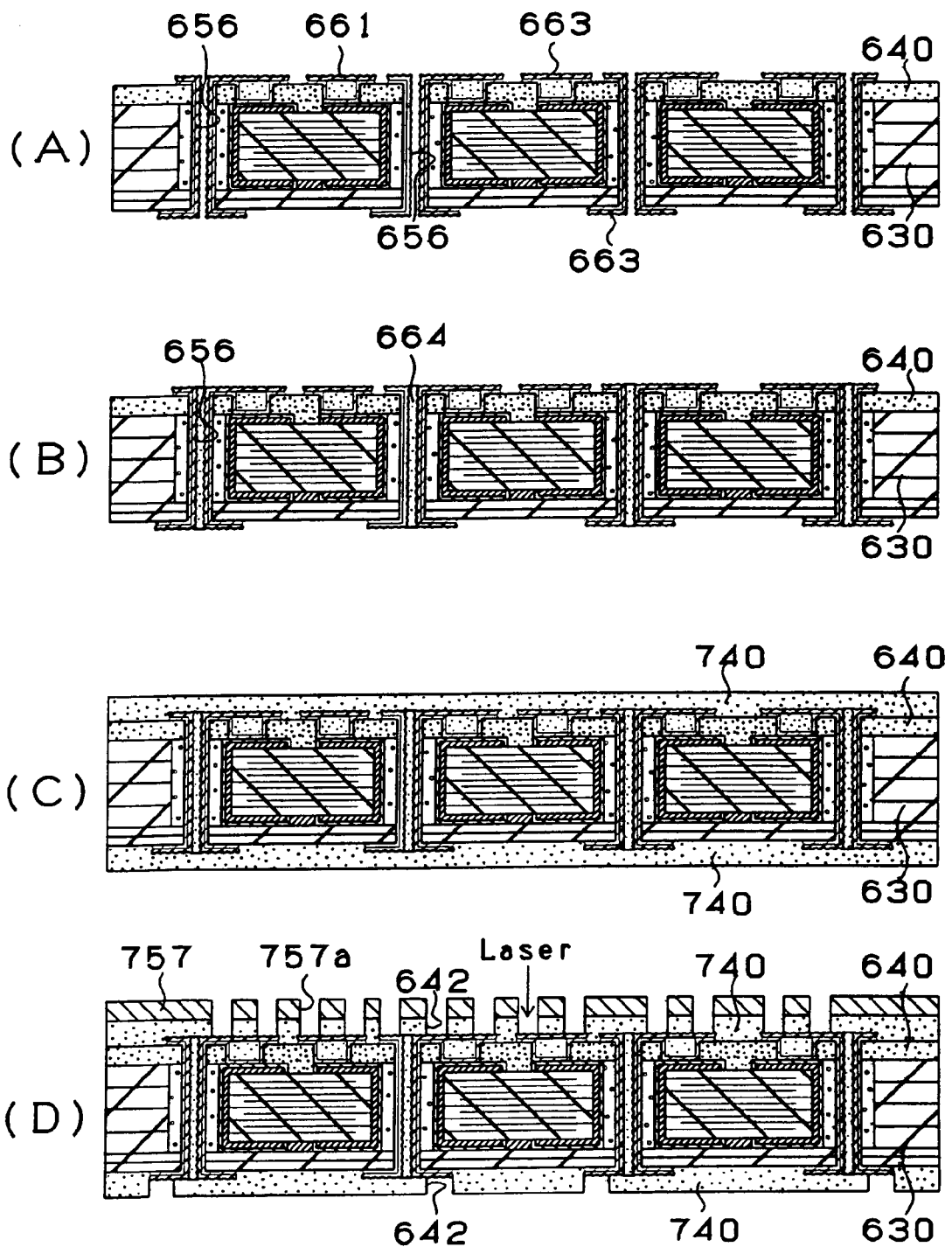
FIG. 48 is a view showing a process for manufacturing the printed circuit board according to the first modification of the fourth embodiment of the present invention.
Figure 49:
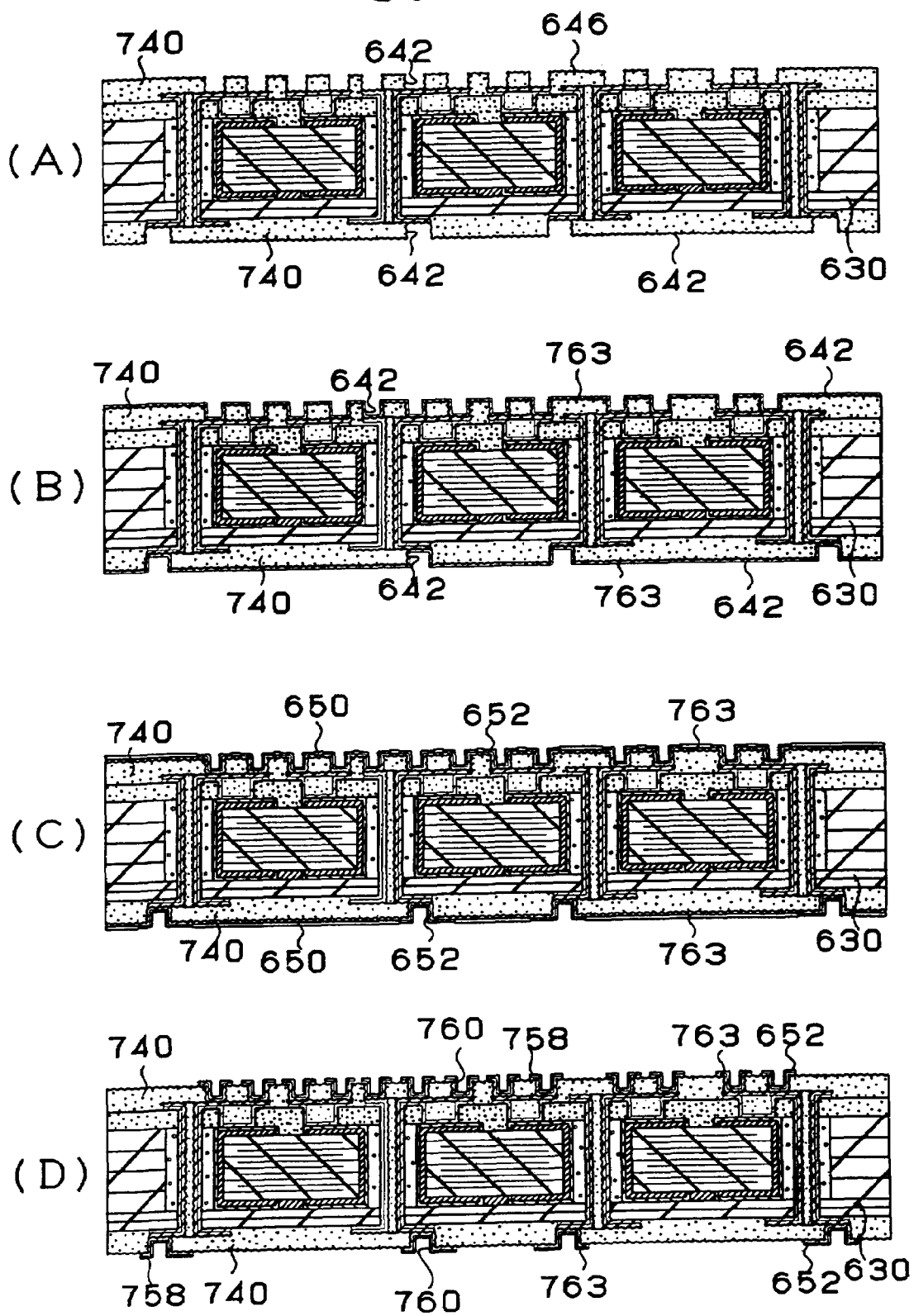
FIG. 49 is a view showing a process for manufacturing the printed circuit board according to the first modification of the fourth embodiment of the present invention.

A printed circuit board according to the fourth embodiment of the present invention will be described hereinafter with reference to FIGS. 42 to 44. FIG. 42 is a cross-sectional view of a printed circuit board 610. FIG. 43 shows a state in which an IC chip 690 is mounted on the printed circuit board 610 shown in FIG. 42 and that the printed circuit board 610 is attached to a daughter board 694. FIG. 44(A) is an enlarged view of a via hole 660 shown in FIG. 42. FIG. 44(B) is a typical view showing a state in which a plurality of via holes 760 are provided in the via hole 660 shown in FIG. 44(A), which view is seen from an arrow B side.

As shown in FIG. 42, the printed circuit board 610 consists of a core substrate 630 containing a plurality of chip capacitors 620, and buildup wiring layers 680A and 680B. Relatively large via holes 660 are connected to the electrodes 621 and 622 of the plural chip capacitors 620 contained in the core substrate 630. Each of the buildup wiring layers 680A and 680B consists of interlayer resin insulating layers 740 and 741. Conductor circuits 758 and relatively small via holes 760 are formed on the interlayer resin insulating layers 740, whereas conductor circuits 759 and relatively small via holes 764 are formed on the interlayer resin insulating layers 741. Solder resist layers 670 are provided on the interlayer resin insulating layers 741, respectively.

As shown in FIG. 13(A), each of the chip capacitors 620 consists of the first electrode 621, the second electrode 622 and a dielectric 23 put between the first and second electrodes. A plurality of pairs of the first conductive films 24 connected to the first electrode 621 side and the second conductive films 25 connected to the second electrode 622 side are arranged on the dielectric 23 to face one another. It is noted that as shown in FIG. 13(B), part of coats 28 of the first electrodes 21 and the second electrodes 22 of the capacitors 620 can be removed. This is because the connection characteristics with respect to the via holes made by plating can be enhanced by exposing the first and second electrodes 21 and 22.

As shown in FIG. 43, solder bumps 676U to be connected to the pads 692 of the IC chip 690 are formed on the via hole 764 of the upper buildup wiring layer 680A. Solder bumps 676D to be connected to the pads 694 of the daughter board 695 are formed on the via holes 764 of the lower buildup wiring layer 680B.

A resin substrate is employed as the core substrate. For example, a resin material used for an ordinary printed circuit board such as a glass epoxy resin impregnated material, a phenol resin impregnated material or the like can be employed. However, substrates made of ceramic or AlN cannot employed as the core substrate. This is because such a substrate has poor workability for the outside shape thereof, sometimes cannot contain capacitors and has gaps even if filled with a resin.

Also, a plurality of chip capacitors 620 are contained in a concave portion 734 formed in the core substrate, so that it is possible to arrange the chip capacitors 620 with high density. Further, since a plurality of chip capacitors 620 are contained in the concave portion 734, it is possible to make the heights of the chip capacitors 620 uniform. Due to this, the thicknesses of the resin layers 640 on the chip capacitors 620 can be made uniform, so that it is possible to appropriately form via holes 660. Besides, since the distance between the IC chip 690 and each chip capacitor 620 becomes shorter, so that it is possible to reduce loop inductance.

In addition, as shown in FIG. 44(A) which is an enlarged view of the via hole 660 shown in FIGS. 42 and 43, a plurality of via holes 760 in the upper buildup wiring layer 680A are connected to one via hole 660. The large via hole 660 as shown in FIG. 44(B) is formed to have an inside diameter of 125 μm and a land diameter of 165 μm, the small via hole 760 is formed to have an inside diameter of 25 μm and a land diameter of 65 μm. On the other hand, the chip capacitors 620 are formed rectangularly and the first and the first electrode 621 and the second electrode 621 of each capacitor are formed rectangularly to have one side of 250 μm. Due to this, even if the positions at which the chip capacitors are arranged are shifted by several tens of μm, it is possible to establish connection between the first electrodes 621 and the second electrodes 622 of the chip capacitors 620 and the via holes 660, thereby ensuring the supply of power from the chip capacitors 620 to the IC chip 690. Further, by providing a plurality of via holes 760, the same effect as that of connecting inductances in parallel. Due to this, the high frequency characteristics of power supply lines and ground lines are enhanced, thereby making it possible to prevent the malfunction of the IC chip due to lack of supply of power or the variation of earth level. Moreover, since the wiring length to each chip capacitor 620 from the IC chip can be shortened, it is possible to reduce loop inductance.

As shown in FIG. 42, the via holes 660 are formed as filled via holes filled with a plated material and having flat surfaces. This makes it possible to directly connect a plurality of via holes 760 onto the via hole 660. Thus, it is possible to enhance the characteristics of the connection between the via holes 660 and 760 and to ensure the supply of power from the chip capacitors 620 to the IC chip 690. In this embodiment, the filled via holes are formed by filling a plated material within the holes. It is also possible to employ filled via holes each having a metal film provided on the front surface after filling a resin in the holes.

The coefficients of thermal expansion of resin filler 633 and a bonding material 636 below the chip capacitors 620 are set lower than those of the core substrate 630 and resin insulating layers 640, i.e., set close to those of the chip capacitors 620 made of ceramic. Due to this, even if an internal stress resulting from difference in the coefficient of thermal expansion occurs among the core substrate 630, the resin insulating layers 640 and the chip capacitors 620 during a heat cycle test, cracks, separation and the like less occurs to the core substrate 630 and the resin insulating layers 640, thereby making it possible to attain high reliability.

Furthermore, since through holes 656 are formed in the resin layers 633 between the chip capacitors 620, no signal lines pass through the chip capacitors 620 made of ceramic. Thus, propagation delay caused by reflection due to the discontinuous impedance by a high dielectric and the passage of the high dielectric does not occur.

As show in FIG. 13(A), in the chip capacitor 620, a copper plated film 29 is coated on the surface of a metal layer 26 constituting the first electrode 621 and the second electrode 622. The plated film coat is formed by plating such as electroplating and electroless plating. As shown in FIG. 42, the first and second electrodes 621 and 622 coated with the copper plated films 29 are electrically connected to the via holes 660 made of a copper plated material. Here, the electrodes 621 and 622 of the chip capacitors are formed by metalization and have irregular portions on the surfaces thereof. Due to this, if the substrate is used while exposing the metal layers 26, resin may sometimes remain on the irregular portions in a step of providing openings 639 in resin insulating layers 640 as will be described later. At this time, the resin residue causes connection defects between the first, second electrodes 621 and 622 and the via holes 660. To prevent this, the surfaces of the first and second electrodes 621 and 622 are smoothed by the copper plated films 29. Thus, no resin remains when providing the openings 639 in the resin insulating layers 640 coated on the electrodes and the reliability of the connection between the electrodes 621, 622 and the via holes 660 when forming the via holes 660 can be enhanced.

Furthermore, since the via holes 660 are formed by plating in the electrodes 621 and 622 having the copper plated films 29 formed thereon, respectively, the characteristic of the connection between the electrodes 621, 622 and the via holes 660 is high and disconnection does not occur between the electrodes 621, 622 and the via holes 660 even if a heat cycle test is conducted.

The copper plated films 29 are provided after the nickel/tin layer (coating layer) coated on the surface of each metal layer 26 in a phase of manufacturing chip capacitors is separated in a phase of mounting the chip capacitors on the printed circuit board. Alternatively, the copper plated films 29 can be directly coated on the metal layers 26 in the phase of manufacturing the chip capacitors 220. Namely, in this embodiment, after openings reaching the copper plated films 29 of the electrodes are provided by applying laser, a de-smear process is performed to thereby form via holes by copper plating. Accordingly, even if an oxide film is formed on the surface of the copper plated film 29, the oxide film can be removed by the laser and de-smear processes, thereby making it possible to establish connection appropriately.

Further, rough layers 23α may be provided on the surfaces of the dielectrics 23 of the chip capacitors 620 which dielectrics are made of ceramic. By doing so, the adhesiveness between the chip capacitors 620 made of ceramic and the interlayer resin insulating layer 640 made of a resin is high and the interlayer resin insulating layer 640 is not separated on the interface therebetween even if a heat cycle test is conducted. The rough layers 23α can be formed by polishing the surfaces of the chip capacitors 620 after sintering them or by roughing the surfaces before sintering them. In this embodiment, the surfaces of the capacitors are roughed and the adhesiveness between each capacitor and the resin is thereby enhanced. Alternatively, a silane coupling process can be conducted to the surfaces of the capacitors.

Next, a method of manufacturing the printed circuit board described above with reference to FIG. 42 will be described with reference to FIGS. 37 to 42.

(1) First, a core substrate 630 consisting of an insulating resin substrate is employed as starting material (FIG. 37(A)). Next, a concave portion 734 for providing capacitors therein is formed on one side of the core substrate 630 by conducting spot facing or by providing a through hole in the insulating resin, followed by pressing and bonding (FIG. 37(B)). The concave portion 734 is formed to be wider than an area in which a plurality of capacitors can be arranged. By doing so, it is possible to ensure that a plurality of capacitors are provided in the core substrate 630.

(2) Then, using a printer, a bonding material 636 is applied onto the concave portion 734 (FIG. 37(C)). Alternatively, the bonding material can be applied onto the concave portion by a potting, a die-bonding method, a method of applying a bonding sheet or the like. As the bonding material 636, one having a lower coefficient of expansion than that of the core substrate is employed. Next, a plurality of chip capacitors 620 made of ceramic are bonded to the concave portion 734 through the bonding material 636 (FIG. 37(D)). Here, by providing a plurality of capacitors 620 in the concave portion 734 having a flat base, the heights of the plural chip capacitors 620 are made uniform. Therefore, it is possible to form interlayer resin insulating layers 640 on the core substrate 630 to have uniform thickness and to appropriately form via holes 660 in later steps.

Then, the upper surfaces of the plural chip capacitors 620 are pressed or struck to thereby make the heights of the capacitors 620 uniform (FIG. 37(E)). Through this step, in providing a plurality of chip capacitors 620 within the concave portion 734, the heights of the chip capacitors 620 can be made completely uniform and the core substrate 630 can be made smooth even if the sizes of the plural chip capacitors 620 are uneven.

(3) Thereafter, a thermosetting resin is filled between the chip capacitors 620 within the concave portion 734, heated and hardened to thereby form an interlayer rein insulating layer 633 (FIG. 38(A)). As the thermosetting resin, an epoxy resin, a phenol resin, a polyimide resin or a triazine resin is preferable. As a result, the chip capacitors 620 within the concave portion 734 can be fixed. The resin layer 633 having a lower coefficient of thermal expansion than that of the core substrate is employed.

Alternatively, a thermoplastic resin may be employed. It is also possible to impregnate filler in a resin so as to match the coefficient of thermal expansion. The filler involves, for example, inorganic filler, ceramic filler, metal filler and the like.

(4) Further, using the printer, an epoxy resin or a polyolefin resin is applied on the resultant substrate to thereby form a resin insulating layer 640 (FIG. 38(B)). Instead of applying a resin, a resin film may be bonded.

Alternatively, one type or more of a thermosetting resin, a thermoplastic resin, a complex of a photosensitive resin, a thermosetting resin and a thermoplastic resin, a complex of a photosensitive resin and a thermoplastic resin and the like can be employed. Two layers may be constituted using them.

(5) Next, openings 639 for relatively large via holes are formed in the resin insulating layer 640 by applying laser (FIG. 38(C)). A de-smear process follows. Instead of applying laser, exposure and development processes can be performed. Holes 644 for through holes are formed in the resin layer 633 by drilling or applying laser, heated and hardened (FIG. 38(D)). In some cases, a roughing process using an acid or an oxidizer or a roughing process by a plasma process may be performed. By doing so, the adhesiveness of the rough layers is ensured.

(6) Thereafter, a copper plated film 729 is formed on the surface of the resin insulating layer 640 by electroless copper plating (FIG. 39(A)). Instead of electroless plating, sputtering may be conducted with Ni and Cu as targets to form an Ni—Cu metal layer. Alternatively, after forming the metal layer by sputtering, an electroless plated film may be formed.

(7) Next, photosensitive dry films are bonded onto the surfaces of the copper plated films 729, exposed and developed while mounting masks, thereby forming resists 649 each having a predetermined pattern. The core substrate 630 is immersed in an electroplating solution, current is applied through the copper plated films 729 and electroplated plates 651 are formed on portions on which the resists 649 are not formed (FIG. 39(B)).

(8) After separating and removing the plating resists 649 with 5% NaOH, the copper plated films 729 under the plating resists 649 are etched, dissolved and removed by a solution mixture of a sulfuric acid and hydrogen peroxide, thereby forming relative large via holes 660 and through holes 656 each having a filled via hole structure consisting of the copper plated film 729 and the electroplated copper film 651. The diameters of the large via holes are preferably within a range of 100 to 600 µm. The diameters are more preferably 125 to 350 µm. In this case, the large via holes are each formed to have a diameter of 165 µm. The through holes are each formed to have a diameter of 250 µm. An etching solution is sprayed on the both sides of the substrate 630 to etch the surfaces of the via holes 660 and the land surfaces of the through holes 656, thereby forming rough surfaces 660α on the entire surfaces of the via holes 660 and the through holes 656 (FIG. 39(C)).

(9) Thereafter, resin filler 664 mainly consisting of an epoxy resin is filled in the through holes 656, and dried (FIG. 39(D)).

(10) Thermosetting epoxy resin sheets each having a thickness of 50 µm are laminated by vacuum pressing on the both sides of the substrate 630 which has been subjected to the above-stated steps, respectively, at a pressure of 5 kg/cm² while raising temperature to 50 to 150° C. to thereby provide interlayer resin insulating layers 740 made of an epoxy resin (FIG. 40(A)). The degree of vacuum during vacuum pressing is 10 mmHg. A cycloolefin resin instead of the epoxy resin can be employed.

(11) Next, openings 642 for relatively small via holes are formed in the interlayer resin insulating layers 740 having a thickness of 65 µm by applying $CO_2$ gas laser (FIG. 40(B)). The diameters of the relatively small via holes are preferable in a range of 25 to 100 µm. Then, a de-smear process is performed using oxygen plasma.

(12) Next, using SV-4540 manufactured by ULVAC JAPAN, Ltd., a plasma process is performed to rough the surfaces of the interlayer resin insulating layers 740, thereby forming rough surfaces 646 (FIG. 40(C)). The plasma process is performed for two minutes while using, as inert gas, argon gas on conditions of power of 200 W, a gas pressure of 0.6 Pa and a temperature of 70° C. The roughing process may be performed using either an acid or an oxidizer. The rough layers are preferably 0.1 to 5 µm.

(13) Next, after exchanging argon gas contained inside, using the same device, sputtering is performed on conditions of an atmospheric pressure of 0.6 Pa, a temperature 80° C., power of 200 W and a duration of 5 minutes with Ni and Cu as targets and Ni—Cu metal layers 648 are formed on the surfaces of the interlayer resin insulating layers 740, respectively. At this time, the thickness of each of the formed Ni—Cu metal layers 648 is 0.2 µm (FIG. 40(D)). Plated films such as electroless plated films may be formed or plated films may be formed on the sputtered surfaces.

(14) Commercially available photosensitive dry films are bonded onto the both sides of the substrate 630 for which the above processes have been completed, photomask films are mounted thereon, the films are exposed with 100 mJ/cm³ and then developed with a 0.8% sodium carbonate solution, thereby providing plating resists 650 each having a thickness of 15 µm. Then, electroplating is performed on the following conditions, thereby forming electroplated films 652 each having a thickness of 15 µm (FIG. 41(A)). It is noted that additive contained in an electroplating solution is Kaparacid HL manufactured by Atotech Japan.

| [Electroplating Solution] | |
| --- | --- |
| Sulfuric acid | 2.24 mol/l |
| Copper sulfate | 0.26 mol/l |
| Additive | 19.5 mol/l |
| (Kaparacid HL manufactured by Atotech Japan) | |
| [Electroplating Conditions] | |
| Current density | 1 A/dm² |
| Duration | 65 minutes |
| Temperature | 22 ± 2° C. |

(15) After separating and removing the resists 650 with 5% NaOH, the Ni—Cu metal layers 648 under the plating resists are dissolved and removed by etching using a solution mixture of a nitric acid, a sulfuric acid and hydrogen peroxide, thereby forming conductor circuits 758 each consisting of the Ni—Cu metal layer 648 and the electroplated film 652 and a plurality of relatively small via holes 760 connected onto the via hole 660 (FIG. 41(B)). In this embodiment, the via hole 660 is formed to have a filled via hole structure, thereby making it possible to directly connect a plurality of via holes 760 to the via hole 660.

Later steps are the same as those of (16) to (19) in the first embodiment stated above, which description will not be, therefore, given herein.

Next, description will be given to the mounting of the IC chip on the printed circuit board 610 completed through the above-stated steps (FIG. 42) and to the attachment of the printed circuit board to the daughter board, with reference to FIG. 43. The IC chip 690 is mounted on the printed circuit board 610 thus completed so that the solder pads 692 of the IC chip 690 correspond to the solder bumps 676U of the printed circuit board 610 and a reflow process is performed, thereby mounting the IC chip 690 on the printed circuit board 610. Likewise, a reflow process is performed so that the pads 694 of the daughter board 695 correspond to the solder bumps 676D of the printed circuit board 610, thereby attaching the printed circuit board 610 to the daughter board 695.

The above-stated resin contains a refractory resin, soluble particles, a hardening agent and other components, each of which is the same as that described in the first embodiment and will not be described herein.

First Modification of Fourth Embodiment

Figure 52:
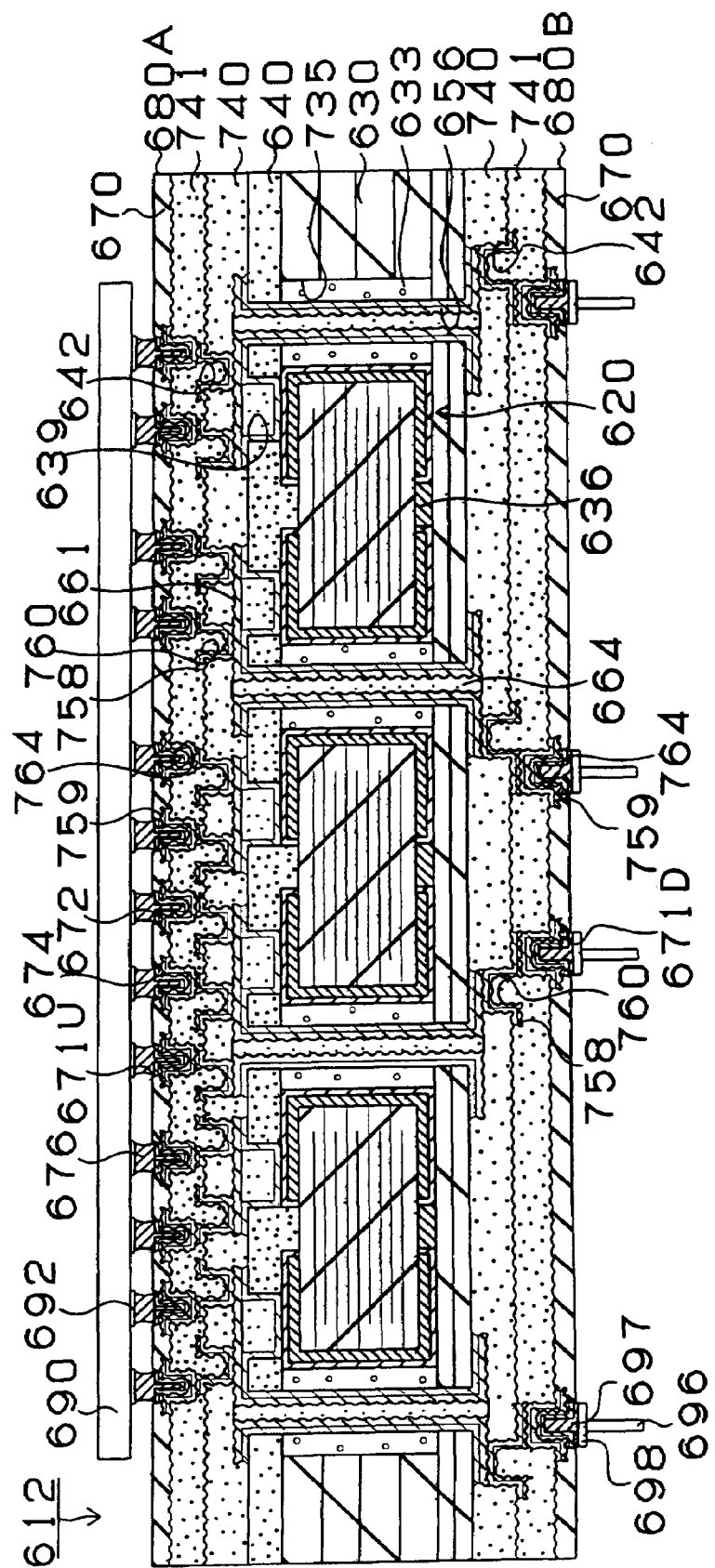
FIG. 52 is a cross-sectional view showing a state in which an IC chip is mounted on the printed circuit board according to the first modification of the fourth embodiment of the present invention.

Next, a printed circuit board 612 according to the first modification of the fourth embodiment of the present invention will be described with reference to FIG. 52. In the fourth embodiment stated above, description has been given to a case of arranging the BGA. The first modification of the fourth embodiment is almost the same as the fourth embodiment. However, as shown in FIG. 52, the printed circuit board in this modification is constituted into a PGA system establishing connection through conductive connection pins 696.

Next, a method of manufacturing the printed circuit board stated above with reference to FIG. 32 will be described with reference to FIGS. 45 to 52.

(1) First, a through hole 733a for containing chip capacitors are formed in a multilayer plate 730α constituted by providing four bonding resin layers 638 impregnated with an epoxy resin. Also, a multilayer plate 730β constituted by providing two bonding resin layers 638 is prepared (FIG. 45(A)). Here, as the bonding resin layers 638, those containing a BT resin, a phenol resin or a reinforcing material such as glass cloth in addition to the epoxy resin can be employed.

(2) Next, the multilayer plates 730α and 730β are press-contacted with each other, heated and hardened, thereby forming a core substrate 630 provided with a concave portion 735 capable of containing a plurality of chip capacitors 620 (FIG. 45(B)).

(3) Then, using potting (dispenser), a bonding material 636 is applied to the positions of the concave portion 735 at which the capacitors are to be arranged (FIG. 45(C)). Alternatively, the bonding material can be applied to the concave portion by a printing method, a die-bonding method, a method of applying bonding sheets or the like. Thereafter, a plurality of chip capacitors 620 made of ceramic are contained in the concave portion 735 through the bonding material 636 (FIG. 45(D)).

(4) Then, a thermosetting resin is filled between the chip capacitors 620 within the concave portion 735, heated and hardened, thereby forming a resin layer 633 (FIG. 46(A)). At this time, as the thermosetting resin, an epoxy resin, a phenol resin, a polyimide resin or a triazine resin is preferable. As a result, the chip capacitors 620 within the concave portion 735 can be fixed.

(5) Further, using a printer, the epoxy or polyolefin resin described above is applied onto the resultant substrate to thereby form a resin insulating layer 640 (FIG. 46(B)). Alternatively, a resin film may be bonded instead of applying a resin.

(6) Next, openings 639 for relatively large via holes are formed in the resin insulating layer 640 by exposure and development processes or by applying laser (FIG. 46(C)). The diameters of the relatively large via holes are preferable in a range of 100 to 600 μm. Especially, the relatively large are preferable in a range of 125 to 350 μm. In this case, the via holes are each formed to have a diameter of 165 μm. Holes 644 for through holes each having a diameter of 250 μm are formed in the resin layer 633 by drilling or by applying laser, heated and hardened (FIG. 46(D)).

(7) A palladium catalyst is applied to the substrate 630. Then, the core substrate is immersed in an electroless plating solution to uniformly deposit electroless plated films 745 (FIG. 47(A)). Then, resin filler is filled in the openings 639 on which the electroless plated films 745 are respectively formed, and dried. By doing so, a resin layer 747 is formed is each opening 639 (FIG. 47(B)).

(8) Thereafter, photosensitive dry films are bonded to the surfaces of the electroless plated films 745, masks are mounted thereon, exposure and development processes are performed, thereby forming resists 649 each having a predetermined pattern. The core substrate 630 is then immersed in an electroless plating solution, thereby forming plated covers 751 each consisting of an electroless plated film (FIG. 47(C)).

(9) After the above step, the resists 649 are separated with 5% NaOH. Thereafter, the electroless plated films 745 under the resists 649 are etched away with a solution mixture of a sulfuric acid and hydrogen peroxide, thereby forming relatively large via holes 661 of a filled via hole structure and through holes 656 (FIG. 47(D)). By constituting the via holes 661 to have the filled via hole structure, it is possible to directly connect a plurality of via holes 760 to one via hole 661 in a step to be described later.

(10) After the substrate 630 is washed and degreased with an acid, the substrate 630 is subjected to soft-etching. Then, an etching solution is sprayed on the both sides of the substrate 630 to etch the surfaces of the via holes 661 and the land surfaces and inner walls of the through holes 656, thereby forming rough surfaces 663 on the entire surfaces of the via holes 661 and the through holes 656 (FIG. 48(A)). As the etching solution, an etching solution containing 10 parts by weight of an imidazole copper (II) complex, 7 parts by weight of a glycolic acid and 5 parts by weight of potassium chloride (MEC etch BOND manufactured by Mec Company Ltd.) is employed.

(11) Next, 100 parts by weight of bisphenol F epoxy monomer (YL983U having a molecular weight of 310 and manufactured by Yuka Shell), 170 parts by weight of $SiO_2$ spherical particles having a surface coated with a silane coupling agent, having a mean particle diameter of 1.6 μm and having a maximum particle diameter of 15 μm or less (CRS 11-1-CE manufactured by ADTEC) and 1.5 parts by weight of a leveling agent (PERENOL S4 manufactured by SANNOPCO) are stirred and mixed to thereby prepare resin filler 664 having a viscosity of 45 to 49 Pa·s at 23±1° C. As a hardening agent, 6.5 parts by weight of an imidazole hardening agent (2E4MZ-CN manufactured by Shikoku Chemicals) is employed.

Thereafter, the resin filler 664 is filled in the through holes 656 and dried (FIG. 48(B)).

(12) Next, 30 parts by weight of a bisphenol A epoxy resin (Epicoat 1001 having an epoxy equivalent of 469 and manufactured by Yuka Shell), 40 parts by weight of a cresol novolac epoxy resin (Epichron N-673 having an epoxy equivalent of 215 and manufactured by Dainippon Ink & Chemicals) and 30 parts by weight of a phenol novolac resin containing triazine structure (Phenolight KA-7052 having a phenol hydroxyl group equivalent of 120 and manufactured by Dainippon Ink & Chemicals) are heated and dissolved in 20 parts by weight of ethyl diglycol acetate and 20 parts by weight of solvent naphtha while being stirred. Then, 15 parts by weight of polybutadiene rubber having epoxy terminal (Denalex R-45EPT manufactured by Nagase Chemicals), 1.5 parts by weight of pulverized 2-phenyl-4,5bis(hydroxymethyl) imidazole, 2 parts by weight of particle-size reduced silica and 0.5 parts by weight of a silicon defoaming agent are added thereto, thus preparing an epoxy resin composition.

The obtained epoxy resin composition is applied onto a PET film having a thickness of 38 μm by using a roll coater so that the thickness of the film is 50 μm after the film is dried, and dried at 80 to 120° C. for 10 minutes, thereby manufacturing resin films for interlayer resin insulating layers.

(13) The resin films for forming interlayer resin insulating layers slightly larger than the substrate 630 manufactured in (12) are mounted on the both sides of the substrate, respectively, temporarily pressed on conditions of a pressure of 4 kgf/cm², a temperature of 80° C. and a press duration of 10 seconds, and cut. Then, the resin films are bonded using a vacuum laminator device by the following method, thereby forming interlayer resin insulating layers 740 (FIG. 48(C)). Namely, the interlayer resin insulating films are actually pressed on the substrate 630 on conditions of the degree of vacuum of 0.5 Torr, a pressure of 4 kgf/cm², a temperature of 80° C. and a press duration of 60 seconds and then thermally hardened at 170° C. for 30 minutes.

(14) Next, openings 642 for relatively small via holes of 65 μm are formed in the interlayer resin insulating layers 740 by applying $CO_2$ gas laser through masks 757 in which penetrating holes 757a each having a thickness of 1.2 mm (FIG. 48(D)) are formed. The diameters of the relatively small via holes are preferably in a range of 25 to 100 μm.

(15) The substrate 630 having the via hole openings 642 formed therein is immersed in a solution containing 60 g/l of a permanganate acid at a temperature of 80° C. for 10 minutes and epoxy resin particles existing on the surfaces of the interlayer resin insulating layers 740 are dissolved and removed, thereby forming rough surfaces 646 on the surfaces of the interlayer resin insulating layers 740 including the inner walls of the via hole openings 642 (FIG. 49(A)). The roughing process may be performed using an acid or an oxidizer. The rough surfaces are preferably 0.5 to 5 μm.

(16) Next, the substrate 630, for which the above stated processes have been completed, is immersed in a neutral solution (manufactured by Siplay) and washed. A palladium catalyst is applied to the surfaces of the substrate 630 which surfaces have been roughed (with a rough depth of 3 μm), thereby attaching catalyst cores on the surfaces of the interlayer resin insulating layers 740 and the inner wall surfaces of the via hole openings 642.

(17) Then, the substrate 630 is immersed in an electroless copper plating solution having the following composition to form electroless copper plated films 763 each having a thickness of 0.6 to 3.0 μm on the entire rough surfaces 646 (FIG. 49(B)).

| [Electroless Plating Solution] | |
| --- | --- |
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 40 mg/l |
| Polyethylene glycol (PEG) | 0.10 g/l |
| [Electroless Plating Conditions] | |
| 40 minutes at a solution temperature of 35° C. | |

(18) Commercially available photosensitive dry films are bonded onto the electroless copper plated films 763, masks are mounted thereon, respectively and the films are exposed with 100 mJ/cm² and developed with a 0.8% sodium carbonate solution, thereby providing plating resists 650 each having a thickness of 30 μm. Then, the resultant substrate 630 is washed with water of a temperature of 50° C. and degreased, washed with water of a temperature of 25° C. and with a sulfuric acid, and subjected to electroplating on the following conditions, thereby forming electroplated copper films 652 each having a thickness of 20 μm (FIG. 49(C)).

| [Electroplating Solution] | |
| --- | --- |
| Sulfuric acid | 2.24 mol/l |
| Copper sulfate | 0.26 mol/l |
| Additive | 19.5 mol/l |
| (Kaparacid HL manufactured by Atotech Japan) | |
| [Electroplating Conditions] | |
| Current density | 1 A/dm² |
| Duration | 65 minutes |
| temperature | 22 ± 2° C. |

(19) After separating and removing the plating resists 650 with 5% NaOH, the electroless plated films 763 under the plating resists 650 are etched with a solution mixture of a sulfuric acid and hydrogen peroxide, removed and dissolved, thereby forming conductor circuits 758 and relatively small via holes 760 each consisting of the electroless copper plated film 763 and the electroplated copper film 652 and having a thickness of 18 μm (FIG. 49(D)). The same process as that in (10) is performed, i.e., rough surfaces 622 are formed by employing an etching solution containing a cupric complex and an organic acid (FIG. 50(A)).

(20) The steps of (13) to (19) are repeated, thereby forming interlayer resin insulating layers 741, conductor circuits 759 and via holes 764 further above (FIG. 50(B)).

(21) Next, a solder resist composition (an organic resin insulating material) is obtained in the same manner as that in the first embodiment.

(22) Then, the solder resist composition prepared in (21) is applied to each side of the multilayer printed board to have a thickness of 20 μm. After a drying process is performed on conditions of 70° C. for 20 minutes and 70° C. for 30 minutes, a photomask having a thickness of 5 mm on which the pattern of solder resist openings are drawn, is closely attached to each solder resist composition, exposure is performed with ultraviolet rays of 1000 mJ/cm², development is performed with a DMTG solution to thereby form openings 671U and 671D.

Thereafter, a heating process is performed to harden the solder resist composition on conditions of 80° C. for 1 hour, 100° C. for 1 hour, 120° C. for 1 hour and 150° C. for 3 hours to thereby harden the solder resist composition and form solder resist layers 670 each having openings 671U and 671D and having a thickness of 20 μm (FIG. 51(A)). The solder resist composition may be a commercially available solder resist composition.

(23) Then, the substrate 630 having the solder resist layers 670 formed thereon is immersed in the same electroless nickel plating solution as that employed in the first embodiment, thereby forming a nickel plated layer 672 in each of the openings 671U and 671D. Further, the substrate is immersed in the same electroless gold plating solution as that employed in the first embodiment, thereby forming a gold plated layer 674 having a thickness of 0.03 μm on the nickel plated layer 672 (FIG. 51(B)).

(24) Thereafter, a solder paste containing tin-lead is printed on each opening 671U of the solder resist layers 670 on the side of the substrate on which the IC chip is mounted. Further, a solder paste as a conductive bonding agent 697 is printed in each opening 671 on the other side of the substrate. Next, conductive connection pins 696 are attached to and supported by an appropriate pin holding device and the fixed portions 698 of the respective conductive connection pins 696 are brought into contact with the conductive bonding agent 697 within the openings 671D. After a reflow process is performed, the conductive connection pins 696 are attached to the conductive bonding agent 697. Also, to attach the conductive connection pins 696, the conductive bonding agent 697 may be formed into a ball shape or the like and put in the openings 671D, or the conductive bonding agent 697 may be joined to the fixed portions 698 to attach the conductive connection pins 696, followed by a reflow process.

Figure 53:
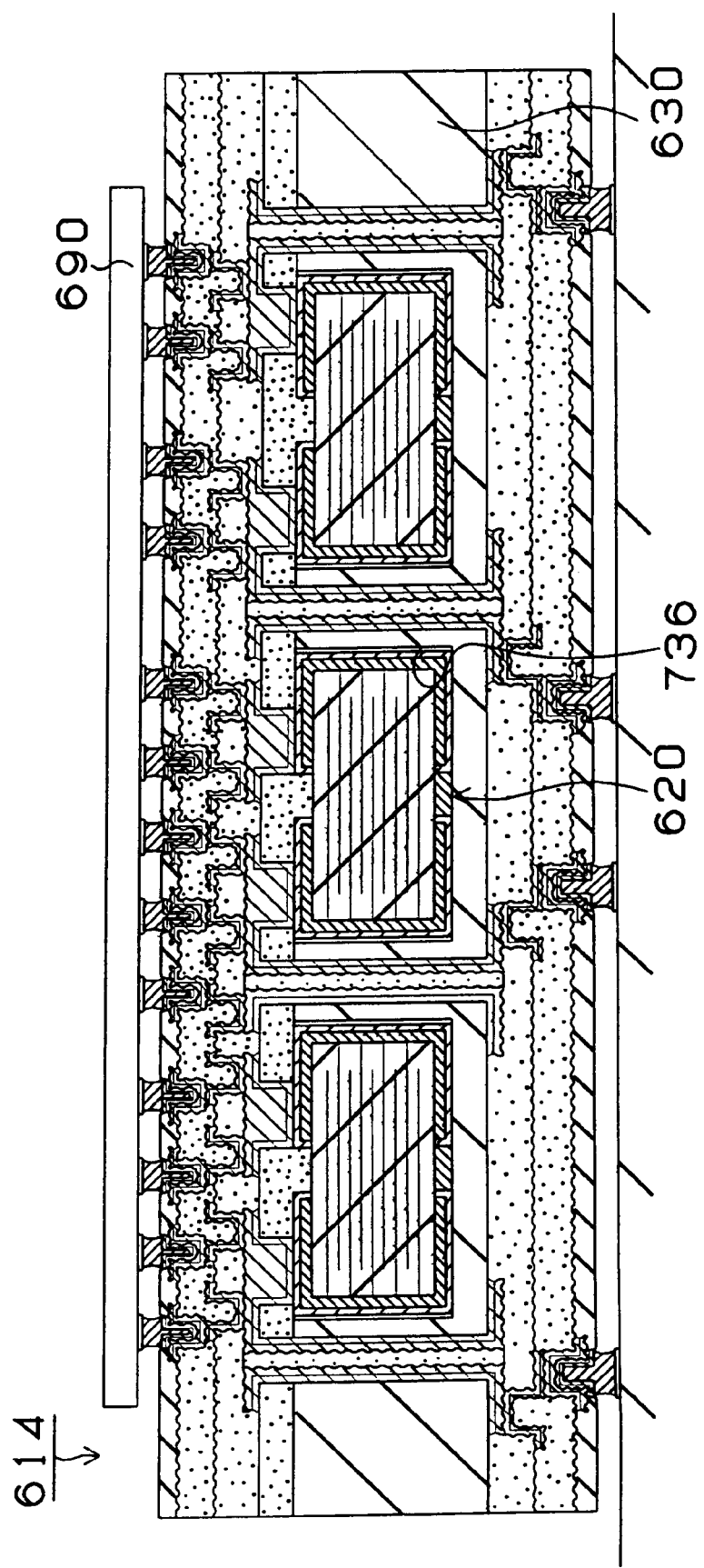
FIG. 53 is a cross-sectional view showing a state in which an IC chip is mounted on the printed circuit board according to the second modification of the fourth embodiment of the present invention.

Thereafter, the IC chip 690 is mounted on the printed circuit board 612 so that the solder pads 692 of the IC chip 690 correspond to the opening 671U side-solder bumps 676U of the printed circuit board 612, and a reflow process is performed, thereby attaching the IC chip 690 (FIG. 53).

Second Modification of Fourth Embodiment

A printed circuit board according to the second modification of the fourth embodiment of the present invention will be described with reference to FIG. 53. A printed circuit board 614 in the second modification of the fourth embodiment is almost the same as that in the fourth embodiment stated above. However, in the printed circuit board 614 in the second modification of the fourth embodiment, one chip capacitor 620 is contained in the concave portion 736 formed in the core substrate 630. Since the chip capacitor 620 is arranged within the core substrate 630, the distance between the IC chip 690 and the chip capacitor 620 becomes short and loop inductance can be reduced.

Third Modification of Fourth Embodiment

Next, the constitution of a printed circuit board according to the third modification of the fourth embodiment will be described with reference to FIG. 14.

The printed circuit board in the third modification is almost the same in constitution as the printed circuit board in the first embodiment stated above. They, however, differ in chip capacitors 20 contained in the core substrate 30. FIG. 14 is a plan view of chip capacitors. FIG. 14(A) shows a chip capacitor before being cut for providing a plurality of chip capacitors. In FIG. 14(A), a dashed line denotes a cut line. As shown in FIG. 14(B), in the printed circuit board in the first embodiment stated above, the first electrodes 21 and the second electrodes 22 are provided on the edges of the chip capacitor. FIG. 14(C) shows a chip capacitor before being cut for providing a plurality of chip capacitors in the third modification. In FIG. 14(C), a dashed line denotes a cut line. In the printed circuit board in the third modification, as shown in the plan view of FIG. 14(D), first electrodes 21 and second electrodes 22 are provided inside of the edges of the chip capacitor.

In the printed circuit board in the third modification, the chip capacitors 20 each having electrodes formed inside of the outer edges thereof are employed, so that mass storage chip capacitors can be employed.

Next, a printed circuit board according to the first other example of the third modification will be described with reference to FIG. 15.

FIG. 15 is a plan view of a chip capacitor 20 contained in the core substrate of the printed circuit board according to the first other example. In the first embodiment stated above, a plurality of small storage chip capacitors are contained in the core substrate. In the first other example, by contrast, a large, mass storage chip capacitor 20 is contained. The chip capacitor 20 consists of the first electrodes 21, the second electrodes 22, a dielectric 23, first conductive films 24 connected to the first electrodes 21, second conductive films 25 connected to the second electrodes 22, electrodes 27 which are not connected to the first and second conductive films 24 and 25, for the connection of the upper and lower surfaces of the chip capacitor. The IC chip and the daughter board are connected to each other through the electrodes 27.

Since the large chip capacitor is employed in the printed circuit board in the first modification, it is possible to employ a mass storage chip capacitor. Further, since the large chip capacitor 20 is employed, the printed circuit board does not warp even if a heat cycle is performed repeatedly.

A printed circuit board according to the second other example of the second modification will be described with reference to FIG. 16. FIG. 16(A) shows a chip capacitor before being cut for providing a plurality of chip capacitors. In FIG. 16(A), a dashed line denotes an ordinary cut line. FIG. 16(B) is a plan view of the chip capacitors. As shown in FIG. 16(B), a plurality of (or in FIG. 16(B), three) chip capacitors for providing multiple capacitors are coupled to one another and employed as a large capacitor as a whole.

In the second other example, since the large chip capacitor 20 is employed, it is possible to employ a mass storage chip capacitor. Further, since the large chip capacitor is employed, the printed circuit board does not warp even if a heat cycle is performed repeatedly.

In the embodiment stated above, the chip capacitors are built in the printed circuit board. Alternatively, plate-like capacitors each constituted by providing a conductive film on a ceramic plate may be employed instead of the chip capacitors.

Further, in the fourth embodiment stated above, only the chip capacitors contained in the core substrate are provided. Alternatively, mass storage chip capacitors can be mounted on the front and reverse sides of the substrate as in the case of the first other example of the first embodiment.

As described above with reference to FIG. 12, voltage variation can be minimized by providing the chip capacitors 20 in the vicinity of the IC chip and the mass storage chip capacitors (having relatively high inductance) on the front and reverse sides.

Now, as for the printed circuit board in the fourth embodiment, the measurement values of the inductance of the chip capacitor 620 embedded in the core substrate and that of the chip capacitor mounted on the reverse side (daughter board side-surface) of the printed circuit board are shown below.

In a case where a single capacitor is used:

| Embedded type | 137 pH |
|---|---|
| Reverse side mounted type | 287 pH |

In a case where eight capacitors are connected in parallel:

| Embedded type | 60 pH |
|---|---|
| Reverse side mounted type | 72 pH |

As can be understood from the above, it is possible to reduce inductance by including the chip capacitor(s) regardless of whether a single capacitor is used or capacitors are connected in parallel so as to increase storage capacity.

Next, the result of a reliability test will be described. Here, the rate of change of the capacitance of one chip capacitor on the printed circuit board in the fourth embodiment was measured.

|  |  | Rate of Change of Capacitance | |
|---|---|---|---|
|  |  | (measurement frequency 100 Hz) | (measurement frequency 1 kHz) |
| Steam | 168 hours | 0.3% | 0.4% |
| HAST | 100 hours | −0.9% | −0.9% |
| TS | 1000 cycles | 1.1% | 1.3% |

In the Steam test, a humidity of 100% was maintained by applying steam. In the HAST test, the chip capacitor was left at a relative humidity of 100%, an applied voltage of 1.3 V and a temperature of 121° C. for 100 hours. In the TS test, tests for leaving the capacitor at −125° C. for 30 minutes and 55° C. for 30 minutes were repeated 1000 times.

As a result of the above-stated reliability test, it was discovered that the printed circuit board including the chip capacitor(s) therein can attain equivalent reliability to that of the existing capacitor surface mount type. Further, as a result of the TS test, it was discovered that even if an internal stress occurs due to the difference in the coefficient of thermal expansion among the capacitors made of ceramic, the core substrate made of a resin and the interlayer resin insulating layers, disconnection does not occur between the electrodes of the chip capacitors and the via holes, separation does not occur between the chip capacitors and the interlayer resin insulating layers and cracks do not occur to the interlayer resin insulating layer, whereby high reliability can be attained for a long time.

With the constitution of the fourth embodiment, the via holes in the fourth embodiment are formed between the conductor circuits and the capacitors. Due to this, it is possible to maintain desired performance without delaying operation due to lack of power supply and no problems arose even if a reliability test was conducted.

Moreover, because of the via holes, even if the via holes are formed in the interlayer resin insulating layers and positional errors occur to the via holes, the allowance is wide. Thus, electrical connection characteristics can be ensured.

What is claimed is:

1. A printed circuit board comprising:
    a core substrate comprising a first resin substrate, a second resin substrate and a third resin substrate, the second resin substrate having an opening and positioned between the first resin substrate and the third resin substrate, the core substrate having an upper surface and a lower surface on an opposite side of the upper surface;
    a first capacitor formed in the opening of the second resin substrate and having a first electrode having a portion facing to the upper surface of the core substrate and a second electrode having a portion facing to the lower surface of the core substrate;
    an upper insulating layer formed over the upper surface of the core substrate and having a conductive circuit layer formed over the upper insulating layer, the upper insulating layer having a via hole electrically connecting the portion of the first electrode of the first capacitor and the conductive circuit layer of the upper insulating layer; and
    a lower insulating layer formed over the lower surface of the core substrate and having a conductive circuit layer formed over the lower insulating layer, the lower insulating layer having a via hole electrically connecting the portion of the second electrode of the first capacitor and the conductive circuit layer of the lower insulating layer.

2. A printed circuit board according to claim 1, wherein the core substrate further comprises a plurality of bonding plates, each of the bonding plates has a core impregnated with a thermosetting resin.

3. A printed circuit board according to claim 1, wherein each of the first, second and third resin substrates has a core impregnated with a resin.

4. A printed circuit board according to claim 1, wherein the second resin substrate has a plurality of openings, and a plurality of capacitors are provided in the openings, respectively.

5. A printed circuit board according to claim 1, further comprising conductor circuits formed on the second resin substrate.

6. A printed circuit board according to claim 1, further comprising a second capacitor mounted on an outer surface of the printed circuit board.

7. A printed circuit board according to claim 1, further comprising a plated metal film formed on at least one of the first and second electrodes of the first capacitor.

8. A printed circuit board according to claim 1, further comprising a coating layer formed on a surface of at least one of the first and second electrodes of the first capacitor, wherein the at least one of the first and second electrodes of the first capacitor has a portion which is exposed from the coating layer, and the potion is electrically connected to a respective one of the via holes.

9. A printed circuit board according to claim 1, wherein the first capacitor is a chip capacitor, the first electrode is formed inside of an outer edge of the opening.

10. A printed circuit board according to claim 1, wherein at least one of the first and second electrodes of the first capacitor is formed in a matrix.

11. A printed circuit board according to claim 1, further comprising an insulating bonding agent coupling the first resin substrate and the first capacitor, the insulating bonding agent being lower in a coefficient of thermal expansion than the first resin substrate.

12. A printed circuit board according to claim 6, wherein the second capacitor has a capacitance which is equal to or higher than a capacitance of a first capacitor.

13. A printed circuit board according to claim 6, wherein the second capacitor has an inductance which is equal to or higher than an inductance of the first capacitor.

14. A printed circuit board according to claim 7, wherein the plated metal film comprises copper.

* * * * *